(12) United States Patent
Park et al.

(10) Patent No.: US 12,120,877 B2
(45) Date of Patent: Oct. 15, 2024

(54) SEMICONDUCTOR DEVICE INCLUDING CHANNEL STRUCTURE AND THROUGH ELECTRODE, ELECTRONIC SYSTEM, AND METHOD OF FORMING THE SAME

(71) Applicant: Samsung Electronics Co., Ltd., Suwon-si (KR)

(72) Inventors: Jinyoung Park, Anyang-si (KR); Hyuk Kim, Seongnam-si (KR); Yeongeun Yook, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 17/693,328

(22) Filed: Mar. 12, 2022

(65) Prior Publication Data

US 2023/0066367 A1 Mar. 2, 2023

(30) Foreign Application Priority Data

Sep. 2, 2021 (KR) .................. 10-2021-0116688

(51) Int. Cl.
| | |
|---|---|
| *H10B 43/27* | (2023.01) |
| *G11C 5/06* | (2006.01) |
| *H01L 23/522* | (2006.01) |
| *H01L 23/528* | (2006.01) |
| *H10B 41/27* | (2023.01) |

(Continued)

(52) U.S. Cl.
CPC .............. *H10B 43/27* (2023.02); *G11C 5/06* (2013.01); *H01L 23/5226* (2013.01); *H01L 23/5283* (2013.01); *H10B 41/27* (2023.02); *H10B 41/35* (2023.02); *H10B 43/35* (2023.02)

(58) Field of Classification Search
CPC ............ H01L 23/5226; H01L 23/5283; H01L 21/76816
See application file for complete search history.

(56) References Cited

U.S. PATENT DOCUMENTS

| | | |
|---|---|---|
| 5,772,906 A | 6/1998 | Abraham |
| 7,585,776 B2 | 9/2009 | Negishi et al. |
| (Continued) | | |

FOREIGN PATENT DOCUMENTS

KR   20000016160 A   3/2000

*Primary Examiner* — Anthony Ho
(74) *Attorney, Agent, or Firm* — Muir Patent Law, PLLC

(57) ABSTRACT

A semiconductor device includes a lower structure including lower wirings. A horizontal wiring layer is disposed on the lower structure while including a horizontal conductive layer, and a horizontal insulating layer extending through the horizontal conductive layer. A stack structure is disposed on the horizontal wiring layer. A channel structure extending into the horizontal wiring layer while extending through the stack structure is provided. A through electrode connected to the lower wirings while extending through the stack structure and the horizontal insulating layer is provided. The stack structure includes insulating layers and electrode layers repeatedly alternately stacked, and an interlayer insulating layer disposed at side surfaces of the insulating layers and the electrode layers. The through electrode includes a first portion extending into the interlayer insulating layer, and a second portion disposed between the first portion and the lower wirings while having a smaller horizontal width than the first portion.

20 Claims, 35 Drawing Sheets

(51) Int. Cl.
*H10B 41/35* (2023.01)
*H10B 43/35* (2023.01)

(56) References Cited

U.S. PATENT DOCUMENTS

| | | |
|---|---|---|
| 9,224,803 B2 | 12/2015 | Yang et al. |
| 9,384,992 B2 | 7/2016 | Narishige et al. |
| 9,627,469 B2 | 4/2017 | Yi et al. |
| 10,707,090 B2 | 7/2020 | Takayama et al. |
| 2021/0183885 A1* | 6/2021 | Woo .................. G11C 8/14 |

* cited by examiner

SEMICONDUCTOR DEVICE INCLUDING CHANNEL STRUCTURE AND THROUGH ELECTRODE, ELECTRONIC SYSTEM, AND METHOD OF FORMING THE SAME

CROSS-REFERENCE TO THE RELATED APPLICATION

This non-provisional patent application claims priority under 35 U.S.C. § 119 from Korean Patent Application No. 10-2021-0116688, filed on Sep. 2, 2021, in the Korean Intellectual Property Office, the disclosure of which is incorporated herein by reference in its entirety.

BACKGROUND

1. Field

The exemplary embodiments of the disclosure relate to a semiconductor device including a channel structure and a through electrode, an electronic system including the same, and a method of forming the same.

2. Description of the Related Art

In accordance with high integration and multifunctionality of a semiconductor device, a manufacturing process of the semiconductor device becomes more and more complicated. Aspect ratios of various constituent elements constituting a circuit of the semiconductor device are further increased. In addition, operations of the manufacturing process are further increased. An increase in operations of the manufacturing process causes an increase in manufacturing period and degradation of mass production efficiency.

SUMMARY

The exemplary embodiments of the disclosure provide semiconductor devices having an increase in mass production efficiency while achieving process simplification, an electronic system including the same, and a method of forming the same.

A semiconductor device according to exemplary embodiments of the disclosure includes a lower structure including a plurality of lower wirings. A horizontal wiring layer is disposed on the lower structure. The horizontal wiring layer includes a horizontal conductive layer and a horizontal insulating layer extending through the horizontal conductive layer. A stack structure is disposed on the horizontal wiring layer. A channel structure extending into the horizontal wiring layer while extending through the stack structure is provided. A through electrode connected to the plurality of lower wirings while extending through the stack structure and the horizontal insulating layer is provided. The stack structure includes a plurality of insulating layers and a plurality of electrode layers repeatedly alternately stacked, and an interlayer insulating layer disposed at side surfaces of the plurality of insulating layers and the plurality of electrode layers. The through electrode includes a first portion and a second portion. The first portion extends into the interlayer insulating layer. The second portion is disposed between the first portion and the plurality of lower wirings. The second portion has a smaller horizontal width than the first portion.

A semiconductor device according to exemplary embodiments of the disclosure includes a lower structure including a plurality of lower wirings. A horizontal wiring layer, which is disposed on the lower structure, and includes a horizontal conductive layer and a horizontal insulating layer extending through the horizontal conductive layer, is provided. A stack structure is disposed on the horizontal wiring layer. A channel structure extending into the horizontal wiring layer while extending through the stack structure is provided. A plurality of cell contact plugs connected to the plurality of lower wirings while extending through the stack structure and the horizontal insulating layer is provided. The stack structure includes a plurality of insulating layers and a plurality of electrode layers repeatedly alternately stacked, and an interlayer insulating layer disposed at side surfaces of the plurality of insulating layers and the plurality of electrode layers. Each of the plurality of cell contact plugs includes a first portion and a second portion. The first portion extends into the horizontal insulating layer while extending through the plurality of insulating layers and the plurality of electrode layers. The second portion is disposed between the first portion and the plurality of lower wirings. The second portion has a smaller horizontal width than the first portion. Each of the plurality of cell contact plugs is connected to a corresponding one of the plurality of electrode layers.

An electronic system according to exemplary embodiments of the disclosure includes a semiconductor device on a main substrate. A controller electrically connected to the semiconductor device on the main substrate is provided. The semiconductor device includes a lower structure including a plurality of lower wirings, a horizontal wiring layer disposed on the lower structure, the horizontal wiring layer including a horizontal conductive layer and a horizontal insulating layer extending through the horizontal conductive layer, a stack structure on the horizontal wiring layer, a channel structure extending into the horizontal wiring layer while extending through the stack structure, and a through electrode connected to the plurality of lower wirings while extending through the stack structure and the horizontal insulating layer. The stack structure includes a plurality of insulating layers and a plurality of electrode layers repeatedly alternately stacked, and an interlayer insulating layer disposed at side surfaces of the plurality of insulating layers and the plurality of electrode layers. The through electrode includes a first portion and a second portion. The first portion extends into the interlayer insulating layer. The second portion is disposed between the first portion and the plurality of lower wirings. The second portion has a smaller horizontal width than the first portion.

BRIEF DESCRIPTION OF THE DRAWINGS

Embodiments of the inventive concept will be more clearly understood from the following detailed description taken in conjunction with the accompanying drawings in which like numerals refer to like elements throughout. In the drawings.

DETAILED DESCRIPTION OF EXEMPLARY EMBODIMENTS

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
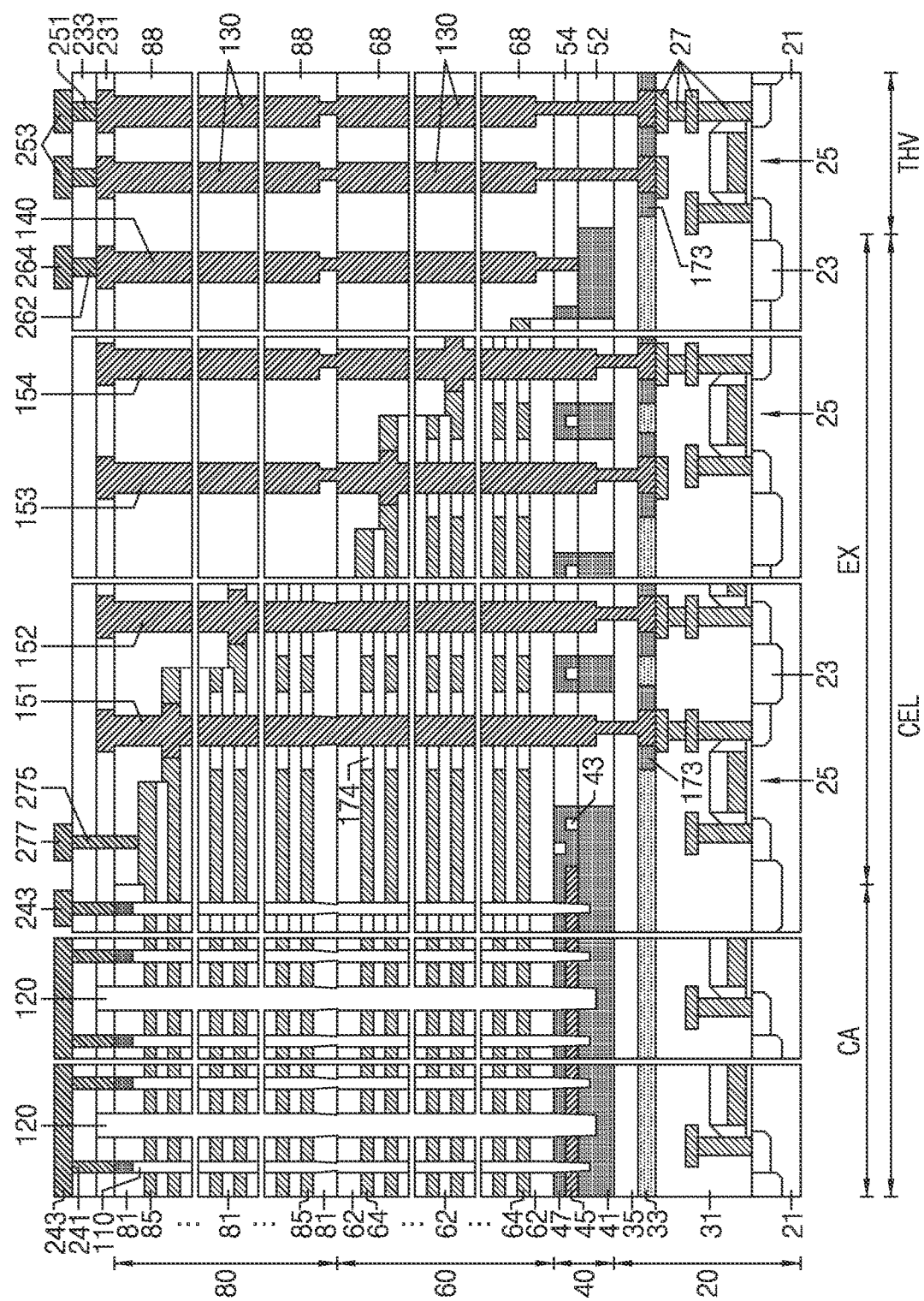
FIG. 1 is a sectional view explaining semiconductor devices, according to exemplary embodiments of the disclosure

FIG. 1 is a sectional view explaining semiconductor devices according to exemplary embodiments of the disclosure. FIGS. 2 to 10 are sectional views showing portions of FIG. 1, respectively. In an embodiment, the semiconductor devices according to the exemplary embodiments of the disclosure may include a non-volatile memory such as VNAND or 3D flash memory. The semiconductor devices according to the exemplary embodiments of the disclosure may be interpreted as including a cell-on-peripheral (COP) structure.

Referring to FIG. 1, the semiconductor devices according to the exemplary embodiments of the disclosure may include a cell area CEL and an interconnection area THV. The cell area CEL may include a cell array area CA and a connection area EX. The semiconductor devices according to the exemplary embodiments of the disclosure may include a lower structure 20, a horizontal wiring layer 40, a first stack structure 60, a second stack structure 80, a plurality of channel structures 110, a plurality of separation insulating patterns 120, a plurality of through electrodes 130, a source contact plug 140, a plurality of cell contact plugs 151, 152, 153, and 154, a first capping layer 173, a second capping layer 174, a first upper insulating layer 231, a second upper insulating layer 233, a plurality of bit plugs 241, a plurality of bit lines 243, a plurality of first upper plugs 251, a plurality of first upper wirings 253, a second upper plug 262, a second upper wiring 264, a third upper plug 275, and a third upper wiring 277.

The plurality of channel structures 110 may be disposed in the cell array area CA. The source contact plug 140 and the plurality of cell contact plugs 151, 152, 153, and 154 may be disposed in the connection area EX. The plurality of cell contact plugs 151, 152, 153, and 154 may include a first cell contact plug 151, a second cell contact plug 152, a third cell contact plug 153, and a fourth cell contact plug 154. The plurality of through electrodes 130 may be disposed in the interconnection area THV.

The lower structure 20 may include a substrate 21, an element isolation layer 23, a plurality of transistors 25, a plurality of lower wirings 27, a first lower insulating layer 31, a second lower insulating layer 33, and a third lower insulating layer 35. The horizontal wiring layer 40 may include a horizontal conductive layer 41, a horizontal mold layer 43, a sealing conductive layer 45, a support 47, a first horizontal insulating layer 52, and a second horizontal insulating layer 54.

The first stack structure 60 may include a plurality of first insulating layers 62, a plurality of first electrode layers 64, and a first interlayer insulating layer 68. The plurality of first insulating layers 62 and the plurality of first electrode layers 64 may be repeatedly alternately stacked on the horizontal wiring layer 40. The first interlayer insulating layer 68 may be disposed at side surfaces of the plurality of first insulating layers 62 and the plurality of first electrode layers 64. An uppermost one of the plurality of first insulating layers 62 may be thicker than one of the plurality of first insulating layers 62 that is adjacent to the center of the first stack structure 60. As used herein, thickness may refer to the thickness or height measured in a direction perpendicular to a top surface of the substrate 21. Thus, for example, a first element that is referred to as being "thicker" than a second element may have a thickness in the vertical direction that is greater than a thickness of the second element.

The second stack structure 80 may include a plurality of second insulating layers 81, a plurality of second electrode layers 85, and a second interlayer insulating layer 88. The plurality of second insulating layers 81 and the plurality of second electrode layers 85 may be repeatedly alternately stacked on the first stack structure 60. The second interlayer insulating layer 88 may be disposed at side surfaces of the plurality of second insulating layers 81 and the plurality of second electrode layers 85.

Figure 2:
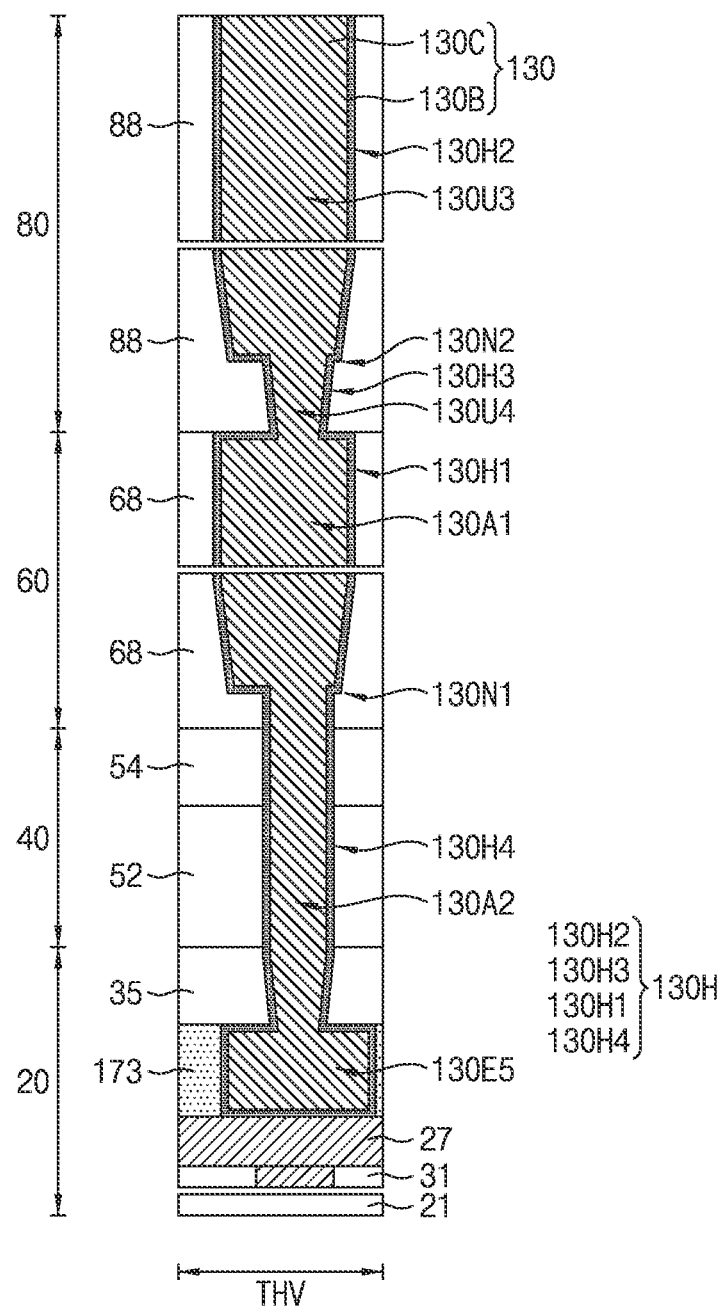
FIGS. 2 to 10 are sectional views showing portions of FIG. 1, respectively.

Referring to FIGS. 1 and 2, the through electrode 130 may include a through conductive layer 130C, and a barrier layer 130B surrounding an outside of the through conductive layer 130C. An inner surface of the barrier layer 130B may contact an outer side surface of the through conductive layer 130C. The through electrode 130 may be disposed in a through hole 130H. The through hole 130H may include a lower through hole 130H1, an upper through hole 130H2, an upper-lower through hole 130H3, and a lower-lower through hole 130H4. The through electrode 130 may include a lower through electrode 130A1, an upper through electrode 130U3, an upper-lower through electrode 130U4, a lower-lower through electrode 130A2, and an enlarged through electrode 130E5.

The lower through hole 130H1 may extend into the first interlayer insulating layer 68. The upper through hole 130H2 may extend into the second interlayer insulating layer 88. The upper-lower through hole 130H3 may extend through the second interlayer insulating layer 88 and, as such, may communicate with both the upper through hole 130H2 and the lower through hole 130H1. The horizontal width of the upper-lower through hole 130H3 may be smaller than the horizontal width of the upper through hole 130H2. As used herein, the term "horizontal width" may refer to a width in a direction parallel to a top surface of the substrate 21.

The lower-lower through hole 130H4 may extend through the first interlayer insulating layer 68, the second horizontal insulating layer 54, the first horizontal insulating layer 52, the third lower insulating layer 35, and the second lower insulating layer 33. The lower-lower through hole 130H4 may communicate with the lower through hole 130H1. The horizontal width of the lower-lower through hole 130H4 adjacent to the lower through hole 130H1 may be smaller than the horizontal width of the lower through hole 130H1. The horizontal width of the lower-lower through hole 130H4 adjacent to the lower through hole 130H1 may be substantially equal to the horizontal width of the upper-lower through hole 130H3.

A first boundary 130N1 may be defined between the lower through hole 130H1 and the lower-lower through hole 130H4. The first boundary 130N1 may include a step. A second boundary 130N2 may be defined between the upper through hole 130H2 and the upper-lower through hole 130H3. Each of the first boundary 130N1 and the second boundary 130N2 may include a step. For example, the first boundary 130N1 may include a discontinuity between side surfaces of the lower through hole 130H1 and the lower-lower through hole 130H4, and the second boundary 130N2 may include a discontinuity between side surfaces of the upper through hole 130H2 and the upper-lower through hole 130H3. Each of the first boundary 130N1 and the second boundary 130N2 may include a narrowing profile having a gradually narrowing shape. For example, the first boundary 130N1 may include a shape that gradually narrows from the side surface of the lower through hole 130H1 to the side surface of the lower-lower through hole 130H4, and the second boundary 130N2 may include a shape that gradually narrows from the side surface of the upper through hole 130H2 to the side surface of the upper-lower through hole 130H3.

The lower through electrode 130A1 may be formed in the lower through hole 130H1. The lower through electrode 130A1 may extend into the first interlayer insulating layer 68. The upper through electrode 130U3 may be formed in the upper through hole 130H2. The upper through electrode 130U3 may extend into the second interlayer insulating layer 88. The upper-lower through electrode 130U4 may be formed in the upper-lower through hole 130H3. The upper-lower through electrode 130U4 may extend through the second interlayer insulating layer 88 and, as such, may be in continuity with the upper through electrode 130U3 and the lower through electrode 130A1 between the upper through electrode 130U3 and the lower through electrode 130A1. The horizontal width of the upper-lower through electrode 130U4 may be smaller than the horizontal width of the upper through electrode 130U3. A second boundary 130N2 may be defined between the upper through electrode 130U3 and the upper-lower through electrode 130U4.

The lower-lower through electrode 130A2 and the enlarged through electrode 130E5 may be formed in the lower-lower through hole 130H4. The lower-lower through electrode 130A2 may be in continuity with the lower through electrode 130A1 and the enlarged through electrode 130E5 between the lower through electrode 130A1 and the enlarged through electrode 130E5. The lower-lower through electrode 130A2 may extend through the first interlayer insulating layer 68, the second horizontal insulating layer 54, the first horizontal insulating layer 52, and the third lower insulating layer 35. The horizontal width of the lower-lower through electrode 130A2 adjacent to the lower through electrode 130A1 may be smaller than the horizontal width of the lower through electrode 130A1. The horizontal width of the lower-lower through electrode 130A2 adjacent to the lower through electrode 130A1 may be substantially equal to the horizontal width of the upper-lower through electrode 130U4. A first boundary 130N1 may be defined between the lower through electrode 130A1 and the lower-lower through electrode 130A2.

The enlarged through electrode 130E5 may be disposed between the lower-lower through electrode 130A2 and the plurality of lower wirings 27. The enlarged through electrode 130E5 may be in continuity with the lower-lower through electrode 130A2. The enlarged through electrode 130E5 may contact the plurality of lower wirings 27 while extending through the second lower insulating layer 33. The horizontal width of the enlarged through electrode 130E5 may be greater than the horizontal width of the lower-lower through electrode 130A2. The first capping layer 173 may be formed between the enlarged through electrode 130E5 and the second lower insulating layer 33. For example, the first capping layer 173 may contact the enlarged through electrode 130E5 and the second lower insulating layer 33, and may separate the enlarged through electrode 130E5 and the second lower insulating layer 33 from one another. As used herein, the term "contact" refers to a direct connection (i.e., touching) unless the context indicates otherwise.

In an embodiment, the lower through electrode 130A1 may be referred to as a first portion, the lower-lower through electrode 130A2 may be referred to as a second portion, the upper through electrode 130U3 may be referred to a third portion, and the upper-lower through electrode 130U4 may be referred to as a fourth portion.

Figure 3:
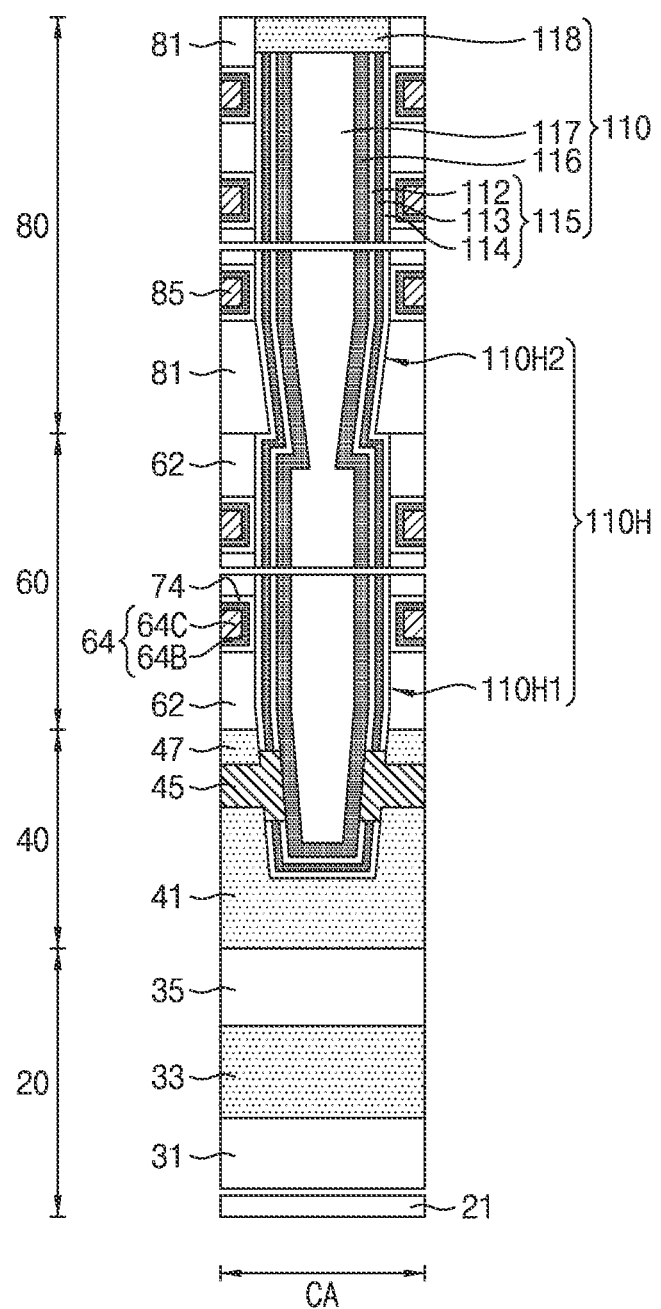

Referring to FIGS. 1 and 3, the channel structure 110 may include an information storage pattern 115, a channel layer 116, a core pattern 117, and a bit pad 118. The channel structure 110 may be formed in a channel hole 110H. The channel hole 110H may include a lower channel hole 110H1 and an upper channel hole 110H2. The lower channel hole 110H1 may extend into the horizontal conductive layer 41 while extending through the plurality of first insulating layer 62, the plurality of first electrode layers 64, the support 47, and the sealing conductive layer 45. For example, a lower surface of the channel structure 110 may be at a lower vertical level than an upper surface of the horizontal conductive layer 41 and at a higher vertical level than a lower surface of the horizontal conductive layer 41. The upper channel hole 110H2 may communicate with the lower channel hole 110H1 while extending through the plurality of second insulating layers 81 and the plurality of second electrode layers 85.

Each of the plurality of first electrode layers 64 and the plurality of second electrode layers 85 may include an electrode conductive layer 64C and a barrier layer 64B. The barrier layer 64B may cover a top surface, a bottom surface, and a side surface of the electrode conductive layer 64C. The electrode conductive layer 64C and the barrier layer 64B may include a conductive material such as metal, metal nitride, metal oxide, metal silicide, conductive carbon, polysilicon, amorphous silicon, monocrystalline silicon, or a combination thereof. The barrier layer 64B may include Ti, TiN, Ta, TaN, or a combination thereof. The electrode conductive layer 64C may include W, WN, Ti, TiN, Ta, TaN, Co, Ni, Ru, Pt, polysilicon, conductive carbon, or a combination thereof.

The channel layer 116 may surround a side surface and a bottom surface of the core pattern 117. The information storage pattern 115 may surround an outside of the channel layer 116. The bit pad 118 may be disposed on the channel layer 116 and the core pattern 117. The bit pad 118 may contact the channel layer 116. The information storage pattern 115 may include a tunnel insulating layer 112 surrounding the outside of the channel layer 116, a charge storage layer 113 surrounding an outside of the tunnel insulating layer 112, and a first blocking layer 114 surrounding an outside of the charge storage layer 113.

A plurality of second blocking layers 74 may be disposed between the plurality of first electrode layers 64 and the channel structure 110 and between the plurality of second electrode layers 85 and the channel structure 110. The plurality of second blocking layers 74 may extend between the plurality of first electrode layers 64 and the plurality of first insulating layers 62 and between the plurality of second electrode layers 85 and the plurality of second insulating layers 81. In some embodiments, the second blocking layer 74 may be omitted.

The sealing conductive layer 45 may contact the channel layer 116 while extending through a side surface of the information storage pattern 115. The sealing conductive layer 45 may include a conductive material such as metal, metal nitride, metal oxide, metal silicide, conductive carbon, polysilicon, amorphous silicon, monocrystalline silicon, or a combination thereof. In an embodiment, the sealing conductive layer 45 may include polysilicon.

The tunnel insulating layer 112 may include an insulating layer such as silicon oxide. The charge storage layer 113 may include a material different from that of the tunnel insulating layer 112. The charge storage layer 113 may include an insulating layer such as silicon nitride. The first blocking layer 114 may include an insulating layer such as silicon oxide, silicon nitride, silicon oxynitride, high-k dielectrics (for example, metal oxide such as HfO or AlO, or a combination thereof, or metal silicate such as HfSiO), or a combination thereof. The channel layer 116 may include a semiconductor layer such as polysilicon, amorphous silicon, monocrystalline silicon, or a combination thereof. The core pattern 117 may include silicon oxide, silicon nitride, silicon oxynitride, low-k dielectrics, high-k dielectrics, polysilicon, or a combination thereof. The bit pad 118 may include a conductive material such as polysilicon, amorphous silicon, monocrystalline silicon, metal, metal nitride, metal oxide, metal silicide, conductive carbon, or a combination thereof.

The second blocking layer 74 may include silicon oxide, silicon nitride, silicon oxynitride, silicon boron nitride (SiBN), silicon carbon nitride (SiCN), low-k dielectrics, high-k dielectrics (for example, metal oxide such as HfO or AlO, metal silicate such as HfSiO, etc.), or a combination thereof. In an embodiment, the second blocking layer 74 may include an aluminum oxide layer.

Figure 4:
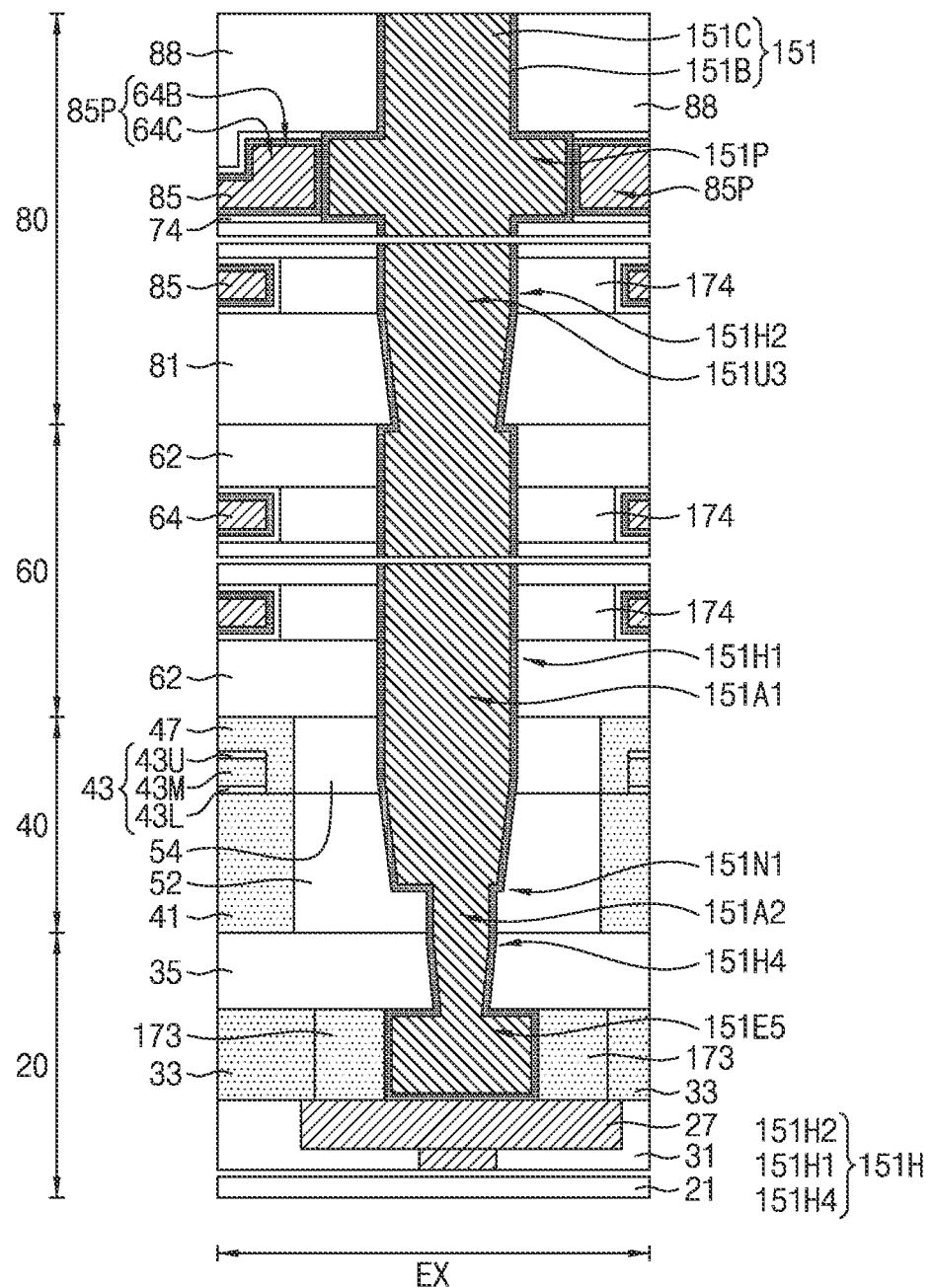

Referring to FIGS. 1 and 4, the first cell contact plug 151 may include a cell contact conductive layer 151C and a barrier layer 151B. The barrier layer 151B may surround the cell contact conductive layer 151C, and may contact the side surface of the cell contact conductive layer 151C. The first cell contact plug 151 may be formed in a first cell contact hole 151H. The first cell contact hole 151H may include a first lower cell contact hole 151H1, a first upper cell contact hole 151H2, and a first lower-lower cell contact hole 151H4.

The first lower cell contact hole 151H1 may extend into the first horizontal insulating layer 52 while extending through the plurality of first insulating layers 62, the plurality of first electrode layers 64, and the second horizontal insulating layer 54. The first upper cell contact hole 151H2 may communicate with the first lower cell contact hole 151H1 while extending through the second interlayer insulating layer 88, the plurality of second insulating layers 81, and the plurality of second electrode layers 85. The first upper cell contact hole 151H2 may extend through a connection pad 85P.

The first lower-lower cell contact hole 151H4 may extend through the first horizontal insulating layer 52, the third lower insulating layer 35, and the second lower insulating layer 33. The first lower-lower cell contact hole 151H4 may communicate with the first lower cell contact hole 151H1. The horizontal width of the first lower-lower cell contact hole 151H4 adjacent to the first lower cell contact hole 151H1 may be smaller than the horizontal width of the first lower cell contact hole 151H1. A first boundary 151N1 may be defined between the first lower cell contact hole 151H1 and the first lower-lower cell contact hole 151H4. The first boundary 151N1 may include a step. For example, the first boundary 151N1 may include a discontinuity between side surfaces of the first lower cell contact hole 151H1 and the first lower-lower cell contact hole 151H4. The first boundary 151N1 may include a narrowing profile having a gradually narrowing shape. For example, the first boundary 151N1 may include a shape that gradually narrows from the side surface of the first lower cell contact hole 151H1 and the side surface of the first lower-lower cell contact hole 151H4.

The first cell contact plug 151 may include a first lower cell contact plug 151A1, a first upper cell contact plug 151U3, a first lower-lower cell contact plug 151A2, and a first enlarged cell contact plug 151E5. The first lower cell contact plug 151A1 may be formed in the first lower cell contact hole 151H1. The first lower cell contact plug 151A1 may extend into the first horizontal insulating layer 52 while extending through the plurality of first insulating layers 62, the plurality of first electrode layers 64, and the second horizontal insulating layer 54.

The first upper cell contact plug 151U3 may be formed in the first upper cell contact hole 151H2. The first upper cell contact plug 151U3 may be in continuity with the first lower cell contact plug 151A1 while extending through the second interlayer insulating layer 88, the plurality of second insulating layers 81, and the plurality of second electrode layers 85. The first upper cell contact plug 151U3 may extend through the connection pad 85P. The first upper cell contact plug 151U3 may include a first protrusion 151P. The first protrusion 151P may contact the connection pad 85P.

The first lower-lower cell contact plug 151A2 and the first enlarged cell contact plug 151E5 may be formed in the first lower-lower cell contact hole 151H4. The first lower-lower cell contact plug 151A2 may be in continuity with the first lower cell contact plug 151A1 while extending through the first horizontal insulating layer 52 and the third lower insulating layer 35. The horizontal width of the first lower-lower cell contact plug 151A2 adjacent to the first lower cell contact plug 151A1 may be smaller than the horizontal width of the first lower cell contact plug 151A1. A first boundary 151N1 may be defined between the first lower cell contact plug 151A1 and the first lower-lower cell contact plug 151A2.

The first enlarged cell contact plug 151E5 may contact the plurality of lower wirings 27 while extending through the second lower insulating layer 33. The first enlarged cell contact plug 151E5 may be in continuity with the first lower-lower cell contact plug 151A2. The horizontal width of the first enlarged cell contact plug 151E5 may be greater than the horizontal width of the first lower-lower cell contact plug 151A2. A first capping layer 173 may be formed between the first enlarged cell contact plug 151E5 and the second lower insulating layer 33.

A second capping layer 174 may be formed between the first lower cell contact plug 151A1 and the plurality of first electrode layers 64 and between the first upper cell contact plug 151U3 and the plurality of second electrode layers 85. Each of the plurality of second electrode layers 85 may include the connection pad 85P.

The horizontal mold layer 43 may include a lower mold layer 43L, a middle mold layer 43M, and an upper mold layer 43U. The horizontal mold layer 43 may include a material having etch selectivity with respect to the horizontal conductive layer 41 and the support 47. The middle mold layer 43M may be disposed between the lower mold layer 43L and the upper mold layer 43U. A top surface of the middle mold layer 43M may contact a lower surface of the upper mold layer 43U, and a lower surface of the middle mold layer 43M may contact a top surface of the lower mold layer 43L. The middle mold layer 43M may include a material having etch selectivity with respect to the lower mold layer 43L and the upper mold layer 43U. In an embodiment, the middle mold layer 43M may include silicon nitride, and each of the lower mold layer 43L and the upper mold layer 43U may include silicon oxide.

Figure 5:
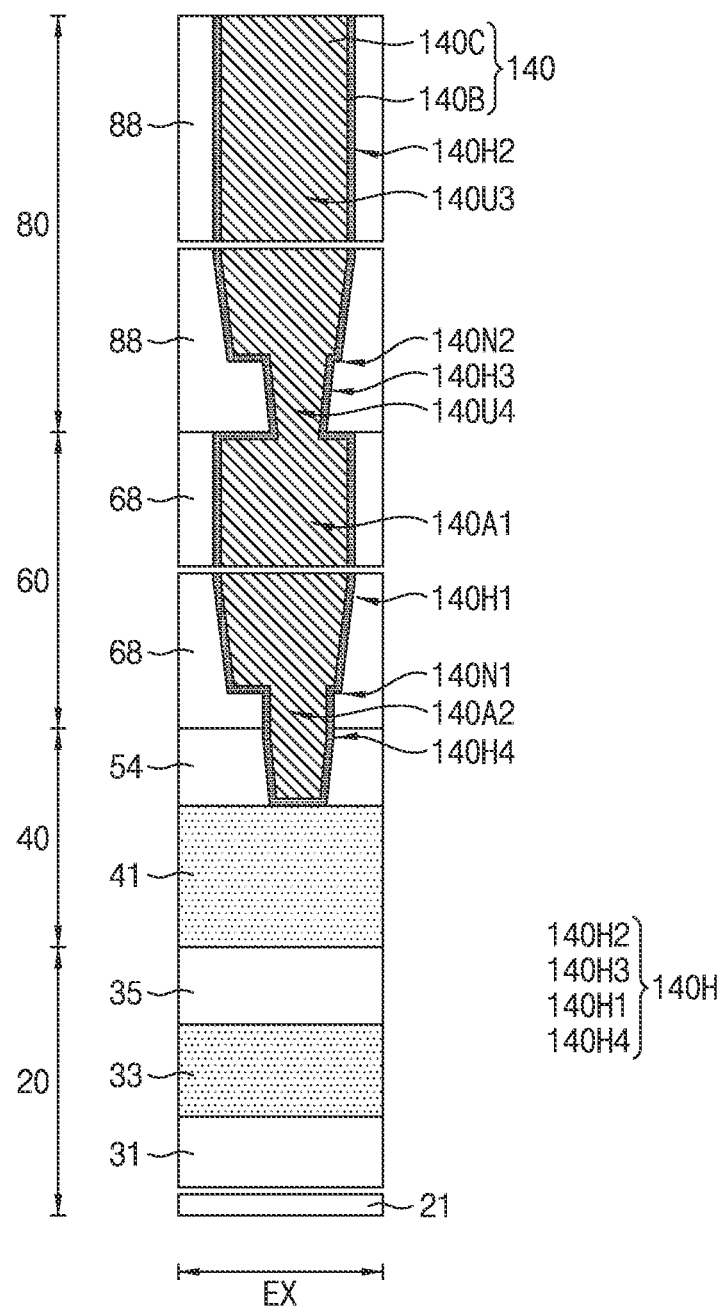

Referring to FIGS. 1 and 5, the source contact plug 140 may include a source contact conductive layer 140C and a barrier layer 140B. An inner surface of the barrier layer 140B may contact an outer side surface of the source contact conductive layer 150C. The source contact plug 140 may be formed in a source contact hole 140H. The source contact hole 140H may include a lower source contact hole 140H1, an upper source contact hole 140H2, an upper-lower source contact hole 140H3, and a lower-lower source contact hole 140H4.

The lower source contact hole 140H1 may extend into the first interlayer insulating layer 68. The upper source contact hole 140H2 may extend into the second interlayer insulating layer 88. The upper-lower source contact hole 140H3 may extend through the second interlayer insulating layer 88 and, as such, may communicate with the upper source contact hole 140H2 and the lower source contact hole 140H1 between the upper source contact hole 140H2 and the lower source contact hole 140H1. The horizontal width of the upper-lower source contact hole 140H3 may be smaller than the horizontal width of the upper source contact hole 140H2.

The lower-lower source contact hole 140H4 may communicate with the lower source contact hole 140H1. The lower-lower source contact hole 140H4 may extend through the first interlayer insulating layer 68 and the second horizontal insulating layer 54. The horizontal width of the lower-lower source contact hole 140H4 adjacent to the lower source contact hole 140H1 may be smaller than the horizontal width of the lower source contact hole 140H1. The horizontal width of the lower-lower source contact hole 140H4 adjacent to the lower source contact hole 140H1 may be substantially equal to the horizontal width of the upper-lower source contact hole 140H3.

A first boundary 140N1 may be defined between the lower source contact hole 140H1 and the lower-lower source contact hole 140H4. A second boundary 140N2 may be defined between the upper source contact hole 140H2 and the upper-lower source contact hole 140H3. Each of the first boundary 140N1 and the second boundary 140N2 may include a step. For example, the first boundary 140N1 may include a discontinuity between side surfaces of the lower source contact hole 140H1 and the lower-lower source contact hole 140H4, and the second boundary 140N2 may include a discontinuity between side surfaces of the upper source contact hole 140H2 and the upper-lower source contact hole 140H3. Each of the first boundary 140N1 and the second boundary 140N2 may include a narrowing profile having a gradually narrowing shape. For example, the first boundary 140N1 may include a shape that gradually narrows from the side surface of the lower source contact hole 140H1 to the side surface of the lower-lower source contact hole 140H4, and the second boundary 130N2 may include a shape that gradually narrows from the side surface of the upper source contact hole 140H2 to the side surface of the upper-lower source contact hole 140H3.

The source contact plug 140 may include a lower source contact plug 140A1, an upper source contact plug 140U3, an upper-lower source contact plug 140U4, and a lower-lower source contact plug 140A2. The lower source contact plug 140A1 may be formed in the lower source contact hole 140H1. The lower source contact plug 140A1 may extend into the first interlayer insulating layer 68. The upper source contact plug 140U3 may be formed in the upper source contact hole 140H2. The upper source contact plug 140U3 may extend into the second interlayer insulating layer 88.

The upper-lower source contact plug 140U4 may be formed in the upper-lower source contact hole 140H3. The upper-lower source contact plug 140U4 may be in continuity with the upper source contact plug 140U3 and the lower source contact plug 140A1 while extending through the second interlayer insulating layer 88. The horizontal width of the upper-lower source contact plug 140U4 may be smaller than the horizontal width of the upper source contact plug 140U3. A second boundary 140N2 may be defined between the upper source contact plug 140U3 and the upper-lower source contact plug 140U4.

The lower-lower source contact plug 140A2 may be formed in the lower-lower source contact hole 140H4. The lower-lower source contact plug 140A2 may be in continuity with the lower source contact plug 140A1. The lower-lower source contact plug 140A2 may contact the horizontal conductive layer 41 while extending through the first interlayer insulating layer 68 and the second horizontal insulating layer 54.

The horizontal width of the lower-lower source contact plug 140A2 adjacent to the lower source contact plug 140A1 may be smaller than the horizontal width of the lower source contact plug 140A1. The horizontal width of the lower-lower source contact plug 140A2 adjacent to the lower source contact plug 140A1 may be substantially equal to the horizontal width of the upper-lower source contact plug 140U4. A first boundary 140N1 may be defined between the lower source contact plug 140A1 and the lower-lower source contact plug 140A2.

Figure 6:
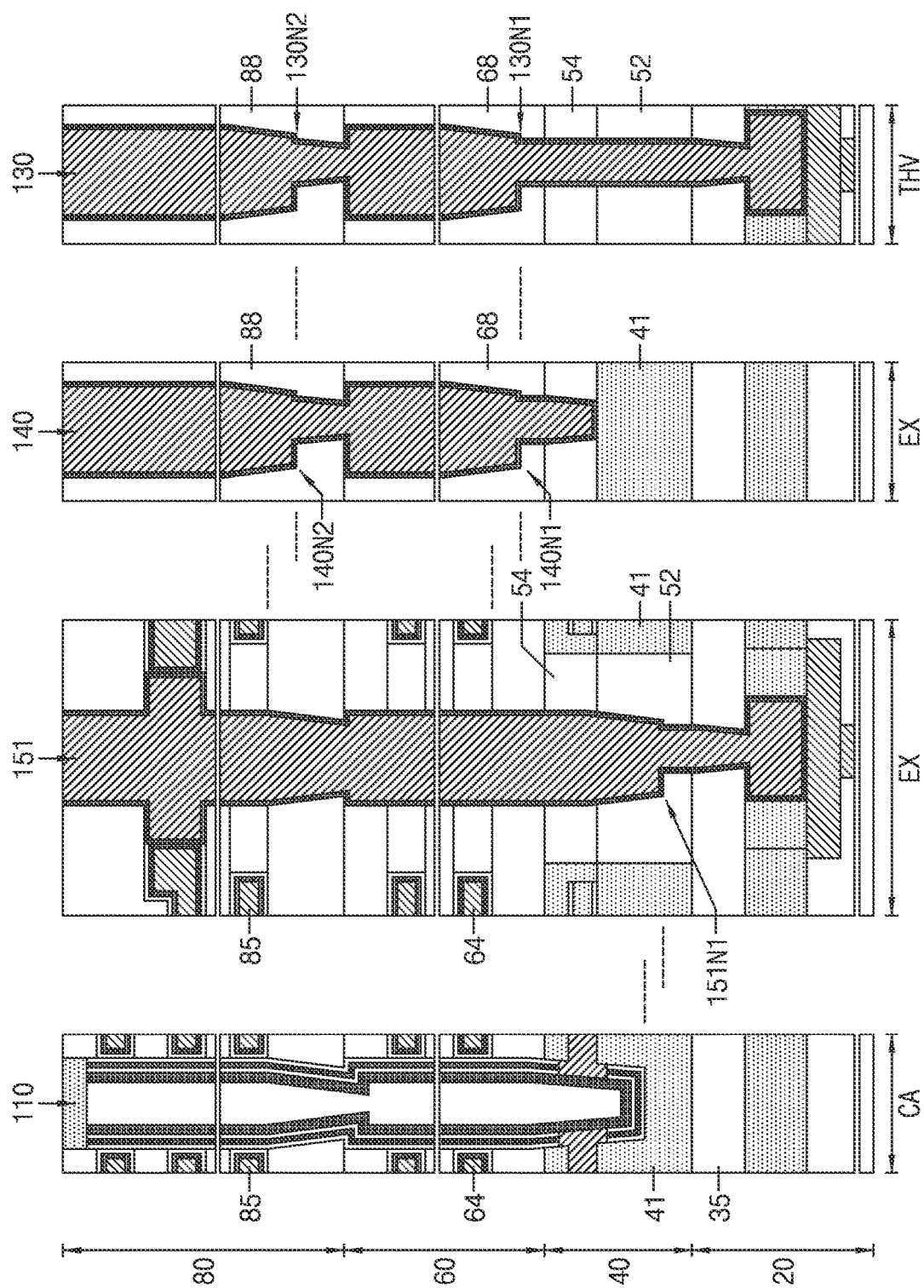
Figure 7:
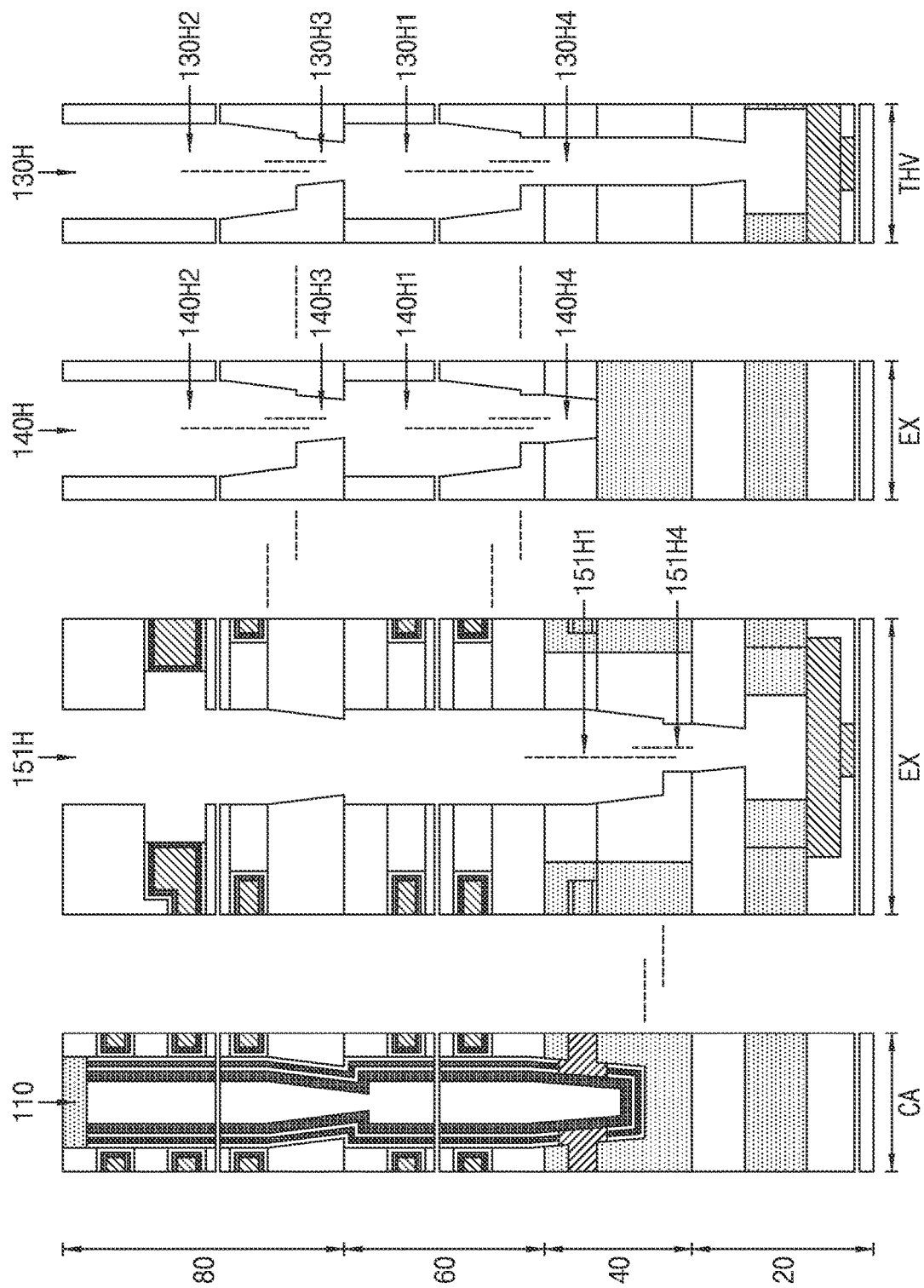

Referring to FIGS. 1 and 6, the first boundary 130N1 between the lower through electrode 130A1 and the lower-lower through electrode 130A2 may be formed at a higher level than a lowermost end of the channel structure 110. The first boundary 130N1 between the lower through electrode 130A1 and the lower-lower through electrode 130A2 may be formed at a lower level than a lowermost end of the plurality of first electrode layers 64. For example, the distance between a bottom surface of the lower structure 20 and the first boundary 130N1 may be greater than the distance between the bottom surface of the lower structure 20 and the lowermost end of the channel structure 110. The distance between the bottom surface of the lower structure 20 and the first boundary 130N1 may be smaller than the distance between the bottom surface of the lower structure 20 and the lowermost end of the plurality of first electrode layers 64.

The first boundary 140N1 between the lower source contact plug 140A1 and the lower-lower source contact plug 140A2 may be formed at a higher level than the lowermost end of the channel structure 110. The first boundary 140N1 between the lower source contact plug 140A1 and the lower-lower source contact plug 140A2 may be formed at a lower level than the lowermost end of the plurality of first electrode layers 64. The first boundary 140N1 between the lower source contact plug 140A1 and the lower-lower source contact plug 140A2 may be formed at substantially the same level as the first boundary 130N1 between the lower through electrode 130A1 and the lower-lower through electrode 130A2. For example, the distance between the bottom surface of the lower structure 20 and the first boundary 140N1 may be greater than the distance between the bottom surface of the lower structure 20 and the lowermost end of the channel structure 110. The distance between the bottom surface of the lower structure 20 and the first boundary 140N1 may be smaller than the distance between the bottom surface of the lower structure 20 and the lowermost end of the plurality of first electrode layers 64.

The second boundary 130N2 between the upper through electrode 130U3 and the upper-lower through electrode 130U4 may be formed at a lower level than a lower surface of a lowermost one of the plurality of second electrode layers 85. The second boundary 140N2 between the upper source contact plug 140U3 and the upper-lower source contact plug 140U4 may be formed at a lower level than a lower surface of the lowermost one of the plurality of second electrode layers 85. The second boundary 140N2 between the upper source contact plug 140U3 and the upper-lower source contact plug 140U4 may be formed at substantially the same level as the second boundary 130N2 between the upper through electrode 130U3 and the upper-lower through electrode 130U4.

The first boundary 151N1 between the first lower cell contact plug 151A1 and the first lower-lower cell contact plug 151A2 may be formed at a lower level than the lowermost end of the channel structure 110. For example, the distance between the bottom surface of the lower structure 20 and the first boundary 151N1 may be smaller than the distance between the bottom surface of the lower structure 20 and the lowermost end of the channel structure 110.

Referring to FIGS. 1 to 7, in some embodiments, the center of the lower-lower through hole 130H4 may be misaligned from the center of the lower through hole 130H1. A vertical line passing through the center of the lower-lower through hole 130H4 may be spaced apart from a vertical line passing through the center of the lower through hole 130H1. The vertical line passing through the center of the lower-lower through hole 130H4 may represent the central axis of the lower-lower through hole 130H4, and the vertical line passing through the center of the lower through hole 130H1 may represent the central axis of the lower-lower through hole 130H4. The center of the upper-lower through hole 130H3 may be misaligned from the center of the upper through hole 130H2. A vertical line passing through the center of the upper-lower through hole 130H3 may be spaced apart from a vertical line passing through the center of the upper through hole 130H2. The vertical line passing through the center of the upper-lower through hole 130H3 may represent the central axis of the upper-lower through hole 130H3, and the vertical line passing through the center of the upper through hole 130H2 may represent the central axis of the upper through hole 130H2. The center of the lower-lower through hole 130H4 may be vertically aligned with the center of the upper-lower through hole 130H3.

The center of the lower-lower through electrode 130A2 may be misaligned from the center of the lower through electrode 130A1. A vertical line passing through the center of the lower-lower through electrode 130A2 may be spaced apart from a vertical line passing through the center of the lower through electrode 130A1. The vertical line passing through the center of the lower-lower through electrode 130A2 may represent the central axis of the lower-lower through electrode 130A2, and the vertical line passing through the center of the lower through electrode 130A1 may represent the central axis of the lower through electrode 130A1. The center of the upper-lower through electrode 130U4 may be misaligned from the center of the upper through electrode 130U3. A vertical line passing through the center of the upper-lower through electrode 130U4 may be spaced apart from a vertical line passing through the center of the upper through electrode 130U3. The vertical line passing through the center of the upper-lower through electrode 130U4 may represent the central axis of the upper-lower through electrode 130U4, and the vertical line passing through the center of the upper through electrode 130U3 may represent the central axis of the upper through electrode 130U3. The center of the lower-lower through electrode 130A2 may be vertically aligned with the center of the upper-lower through electrode 130U4.

The center of the lower-lower source contact hole 140H4 may be misaligned from the center of the lower source contact hole 140H1. A vertical line passing through the center of the lower-lower source contact hole 140H4 may be spaced apart from a vertical line passing through the lower source contact hole 140H1. The center of the upper-lower source contact hole 140H3 may be misaligned from the center of the upper source contact hole 140H2. The vertical line passing through the center of the lower-lower source contact hole 140H4 may represent the central axis of the lower-lower source contact hole 140H4, and the vertical line passing through the lower source contact hole 140H1 may represent the central axis of the lower source contact hole 140H1. A vertical line passing through the center of the upper-lower source contact hole 140H3 may be spaced apart from a vertical line passing through the center of the upper source contact hole 140H2. The vertical line passing through the center of the upper-lower source contact hole 140H3 may represent the central axis of the upper-lower source contact hole 140H3, and the vertical line passing through the center of the upper source contact hole 140H2 may represent the central axis of the upper source contact hole 140H2. The center of the lower-lower source contact hole 140H4 may be vertically aligned with the center of the upper-lower source contact hole 140H3.

The center of the lower-lower source contact plug 140A2 may be misaligned from the center of the lower source contact plug 140A1. A vertical line passing through the center of the lower-lower source contact plug 140A2 may be spaced apart from a vertical line passing through the center of the lower source contact plug 140A1. A vertical line passing through the center of the lower-lower source contact plug 140A2 may represent the central axis of the lower-lower source contact plug 140A2, and the vertical line passing through the center of the lower source contact plug 140A1 may represent the central axis of the lower source contact plug 140A1. The center of the upper-lower source contact plug 140U4 may be misaligned from the center of the upper source contact plug 140U3. A vertical line passing through the center of the upper-lower source contact plug 140U4 may be spaced apart from a vertical line passing through the center of the upper source contact plug 140U3. A vertical line passing through the center of the upper-lower source contact plug 140U4 may represent the central axis of the upper-lower source contact plug 140U4, and the vertical line passing through the center of the upper source contact plug 140U3 may represent the central axis of the upper source contact plug 140U3. The center of the lower-lower source contact plug 140A2 may be vertically aligned with the center of the upper-lower source contact plug 140U4.

The center of the first lower-lower cell contact hole 151H4 may be misaligned from the center of the first lower cell contact hole 151H1. A vertical line passing through the center of the first lower-lower cell contact hole 151H4 may be spaced apart from a vertical line passing through the center of the first lower cell contact hole 151H1. The vertical line passing through the center of the first lower-lower cell contact hole 151H4 may represent the central axis of the first lower-lower cell contact hole 151H4, and the vertical line passing through the center of the first lower cell contact hole 151H1 may represent the central axis of the first lower cell contact hole 151H1. The center of the first lower-lower cell contact plug 151A2 may be misaligned from the center of the first lower cell contact plug 151A1. A vertical line passing through the center of the first lower-lower cell contact plug 151A2 may be spaced apart from a vertical line passing through the center of the first lower cell contact plug 151A1. The vertical line passing through the center of the first lower-lower cell contact plug 151A2 may represent the central axis of the first lower-lower cell contact plug 151A2, and the vertical line passing through the center of the first lower cell contact plug 151A1 may represent the central axis of the first lower cell contact plug 151A1.

Figure 8:
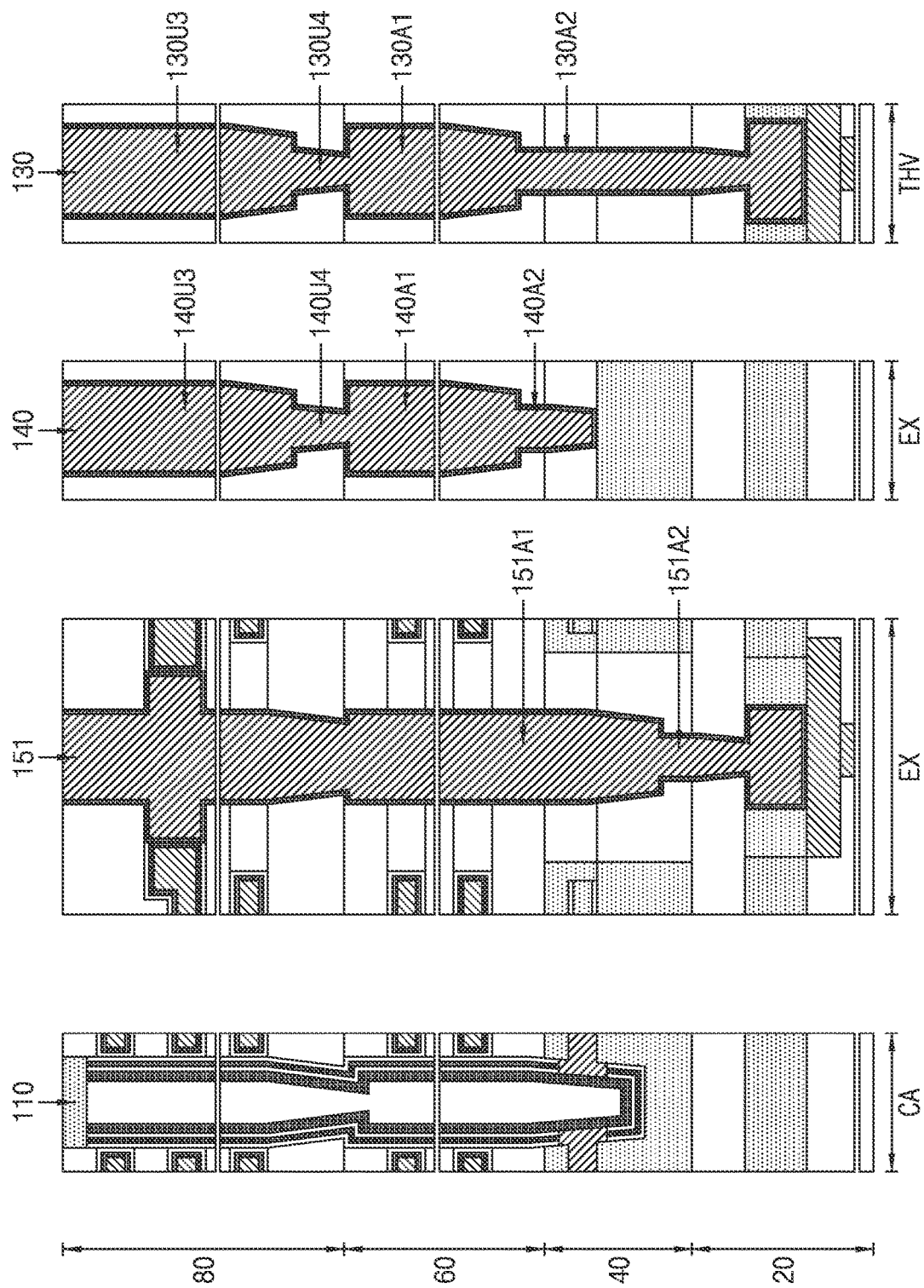

Referring to FIG. 8, in some embodiments, the center of the lower-lower through electrode 130A2 may be vertically aligned with the center of the lower through electrode 130A1. The center of the upper-lower through electrode 130U4 may be vertically aligned with the center of the upper through electrode 130U3. The center of the lower-lower through electrode 130A2 may be vertically aligned with the center of the upper-lower through electrode 130U4. For example, the central axes of each of the lower-lower through electrode 130A2, the lower through electrode 130A1, the upper-lower through electrode 130U4, and the upper through electrode 130U3 may be vertically aligned with one another.

The center of the lower-lower source contact plug 140A2 may be vertically aligned with the center of the lower source contact plug 140A1. The center of the upper-lower source contact plug 140U4 may be vertically aligned with the center of the upper source contact plug 140U3. The center of the lower-lower source contact plug 140A2 may be vertically aligned with the center of the upper-lower source contact plug 140U4. For example, central axes of each of the lower-lower source contact plug 140A2, the lower source contact plug 140A1, the upper-lower source contact plug 140U4, and the upper source contact plug 140U3 may be vertically aligned with one another.

The center of the first lower-lower cell contact plug 151A2 may be vertically aligned with the center of the first lower cell contact plug 151A1. For example, central axes of the first lower-lower cell contact plug 151A2 and the first lower cell contact plug 151A1 may be vertically aligned with one another.

Figure 9:
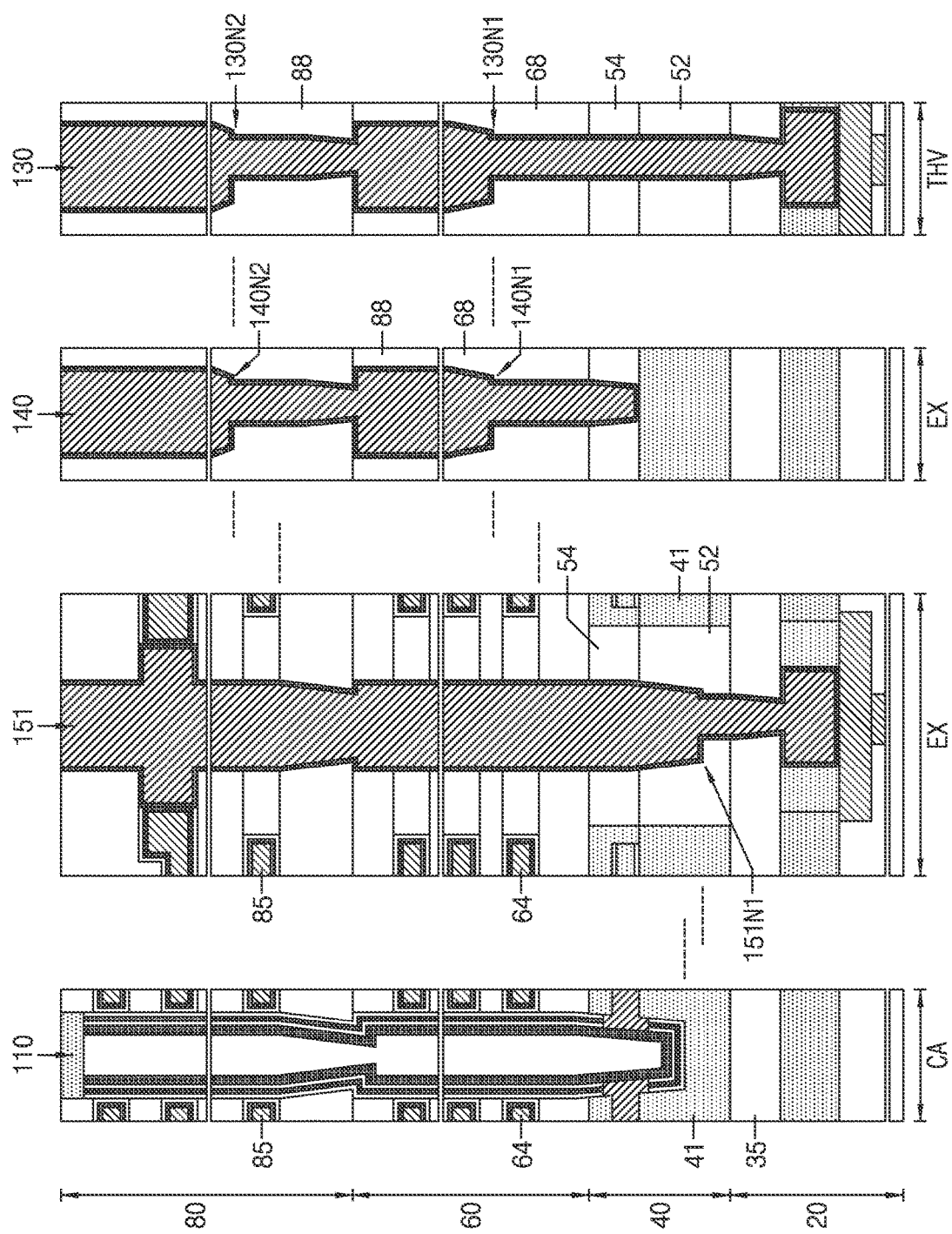
Figure 10:
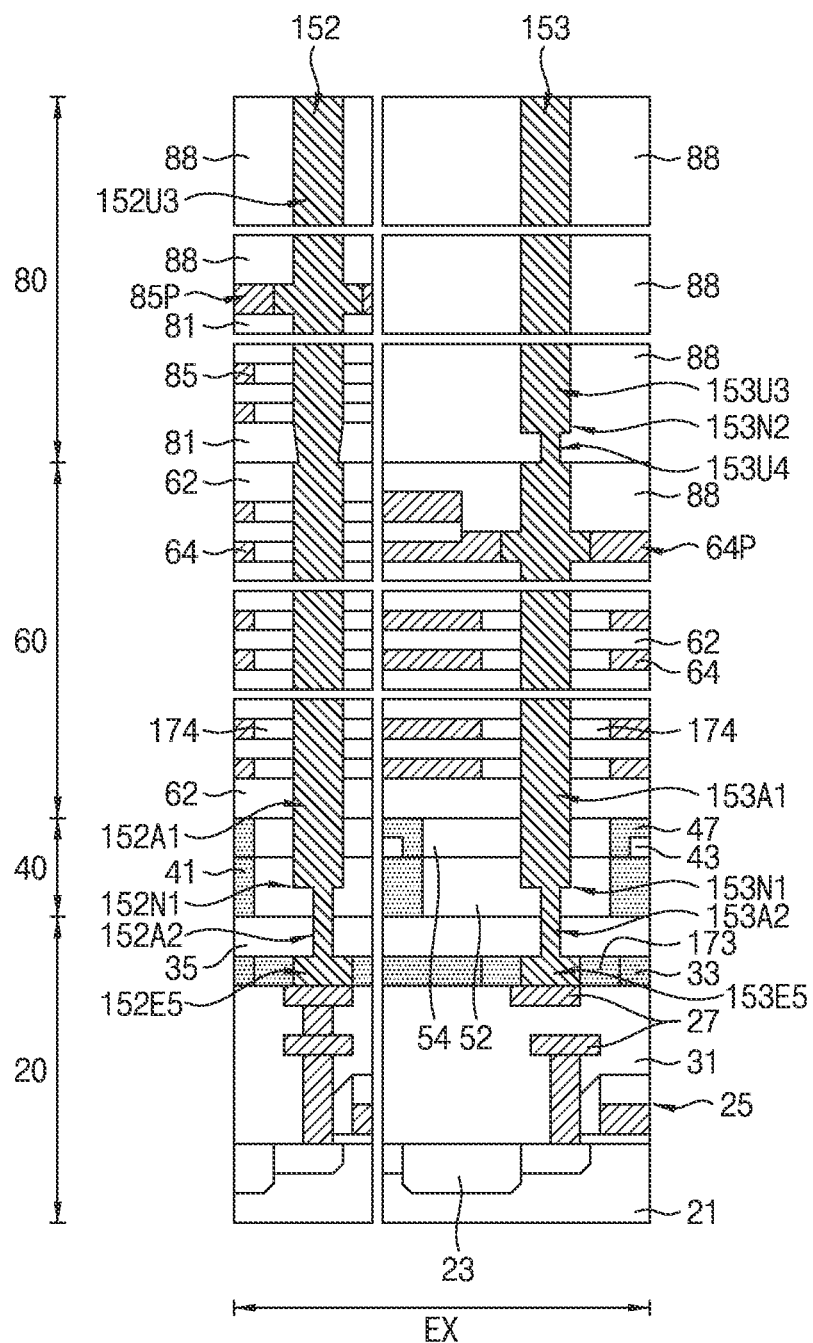

Referring to FIG. 9, the first boundary 130N1 between the lower through electrode 130A1 and the lower-lower through electrode 130A2 may be formed at a higher level than the lowermost end of the plurality of first electrode layers 64. For example, the distance between the bottom surface of the lower structure 20 and the first boundary 130N1 may be greater than the distance between the bottom surface of the lower structure 20 and the lowermost end of the plurality of first electrode layers 64.

The first boundary 140N1 between the lower source contact plug 140A1 and the lower-lower source contact plug 140A2 may be formed at a higher level than the lowermost end of the plurality of first electrode layers 64. For example, the distance between the bottom surface of the lower structure 20 and the first boundary 140N1 may be greater than the distance between the bottom surface of the lower structure 20 and the lowermost end of each of the plurality of first electrode layers 64.

The second boundary 130N2 between the upper through electrode 130U3 and the upper-lower through electrode 130U4 may be formed at a higher level than the lowermost end of the plurality of second electrode layers 85. The second boundary 140N2 between the upper source contact plug 140U3 and the upper-lower source contact plug 140U4 may be formed at a higher level than the lowermost end of the plurality of second electrode layer 85. The first boundary 151N1 between the first lower cell contact plug 151A1 and the first lower-lower cell contact plug 151A2 may be formed at a lower level than the lowermost end of the channel structure 110.

Referring to FIGS. 1 to 10, the second cell contact plug 152 may include a second lower cell contact plug 152A1, a second upper cell contact plug 152U3, a second lower-lower cell contact plug 152A2, and a second enlarged cell contact plug 152E5. A first boundary 152N1 may be defined between the second lower cell contact plug 152A1 and the second lower-lower cell contact plug 152A2. The second cell contact plug 152 may include a configuration the same as that of the first cell contact plug 151.

The third cell contact plug 153 may include a third lower cell contact plug 153A1, a third upper cell contact plug 153U3, a third upper-lower cell contact plug 153U4, a third lower-lower cell contact plug 153A2, and a third enlarged cell contact plug 153E5. A first boundary 153N1 may be defined between the third lower cell contact plug 153A1 and the third lower-lower cell contact plug 153A2. A second boundary 153N2 may be defined between the third upper cell contact plug 153U3 and the third upper-lower cell contact plug 153U4. Each of the plurality of first electrode layers 64 may include a connection pad 64P. The third lower cell contact plug 153A1 may extend through the connection pad 64P. The third lower cell contact plug 153A1 may contact the connection pad 64P. The third cell contact plug 153 may include a configuration the same as the configuration described with reference to FIGS. 1 to 9.

Figure 11:
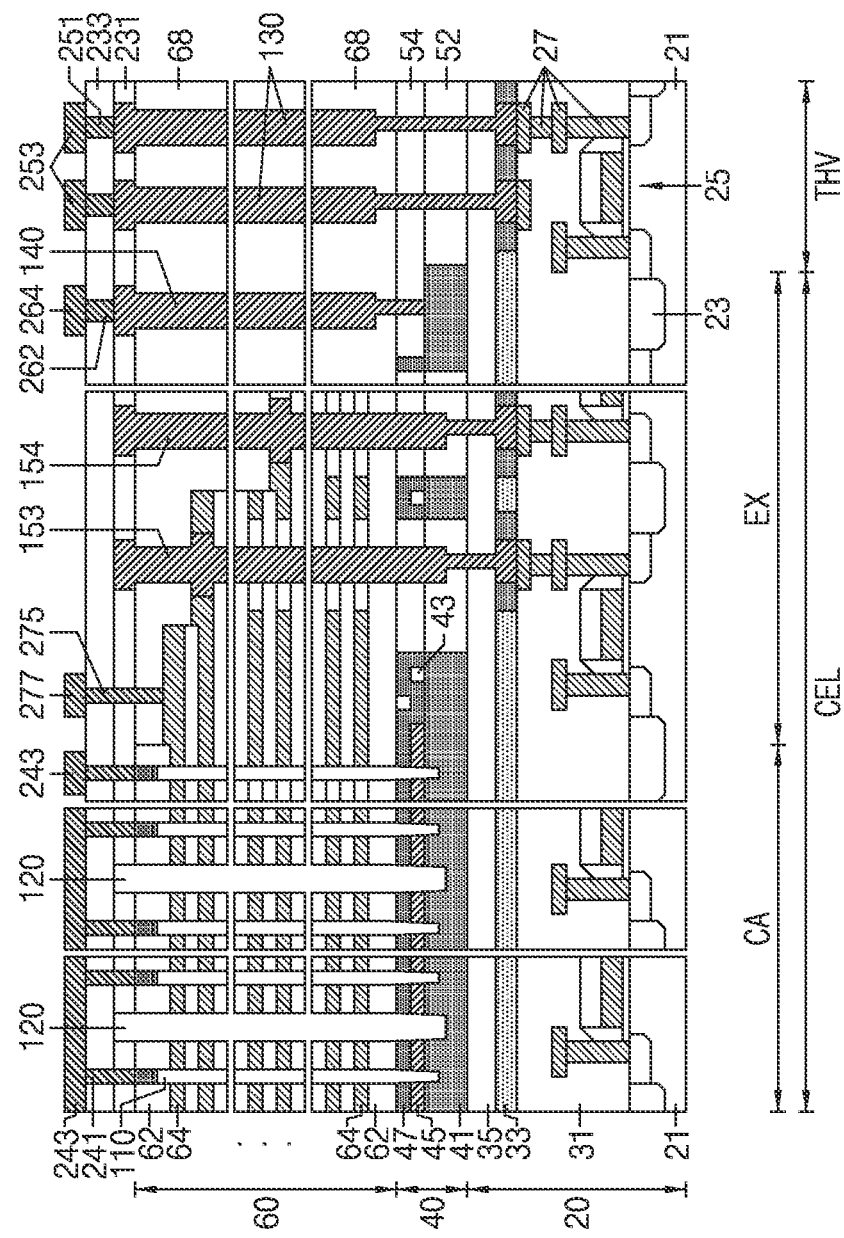
FIG. 11 is a sectional view explaining semiconductor devices, according to exemplary embodiments of the disclosure.

FIG. 11 is a sectional view explaining semiconductor devices according to exemplary embodiments of the disclosure.

Referring to FIG. 11, the semiconductor devices according to the exemplary embodiments of the disclosure may include a cell area CEL and an interconnection area THV. The cell area CEL may include a cell array area CA and a connection area EX. The semiconductor devices according to the exemplary embodiments of the disclosure may include a lower structure 20, a horizontal wiring layer 40, a first stack structure 60, a plurality of channel structures 110, a plurality of separation insulating patterns 120, a plurality of through electrodes 130, a source contact plug 140, a plurality of cell contact plugs 153 and 154, a first upper insulating layer 231, a second upper insulating layer 233, a plurality of bit plugs 241, a plurality of bit lines 243, a plurality of first upper plugs 251, a plurality of first upper wirings 253, a second upper plug 262, a second upper wiring 264, a third upper plug 275, and a third upper wiring 277. The plurality of channel structures 110 may be disposed in the cell array area CA. The source contact plug 140 and the plurality of cell contact plugs 153 and 154 may be disposed in the connection area EX. The plurality of through electrodes 130 may be disposed in the interconnection area THV.

The lower structure 20 may include a substrate 21, an element isolation layer 23, a plurality of transistors 25, a plurality of lower wirings 27, a first lower insulating layer 31, a second lower insulating layer 33, and a third lower insulating layer 35. The horizontal wiring layer 40 may include a horizontal conductive layer 41, a horizontal mold layer 43, a sealing conductive layer 45, a support 47, a first horizontal insulating layer 52, and a second horizontal insulating layer 54.

The first stack structure 60 may include a plurality of first insulating layers 62, a plurality of first electrode layers 64, and a first interlayer insulating layer 68. The plurality of cell contact plugs 153 and 154 may include a third cell contact plug 153 and a fourth cell contact plug 154.

FIGS. 12 to 35 are sectional views explaining semiconductor device formation methods according to exemplary embodiments of the disclosure.

Figure 12:
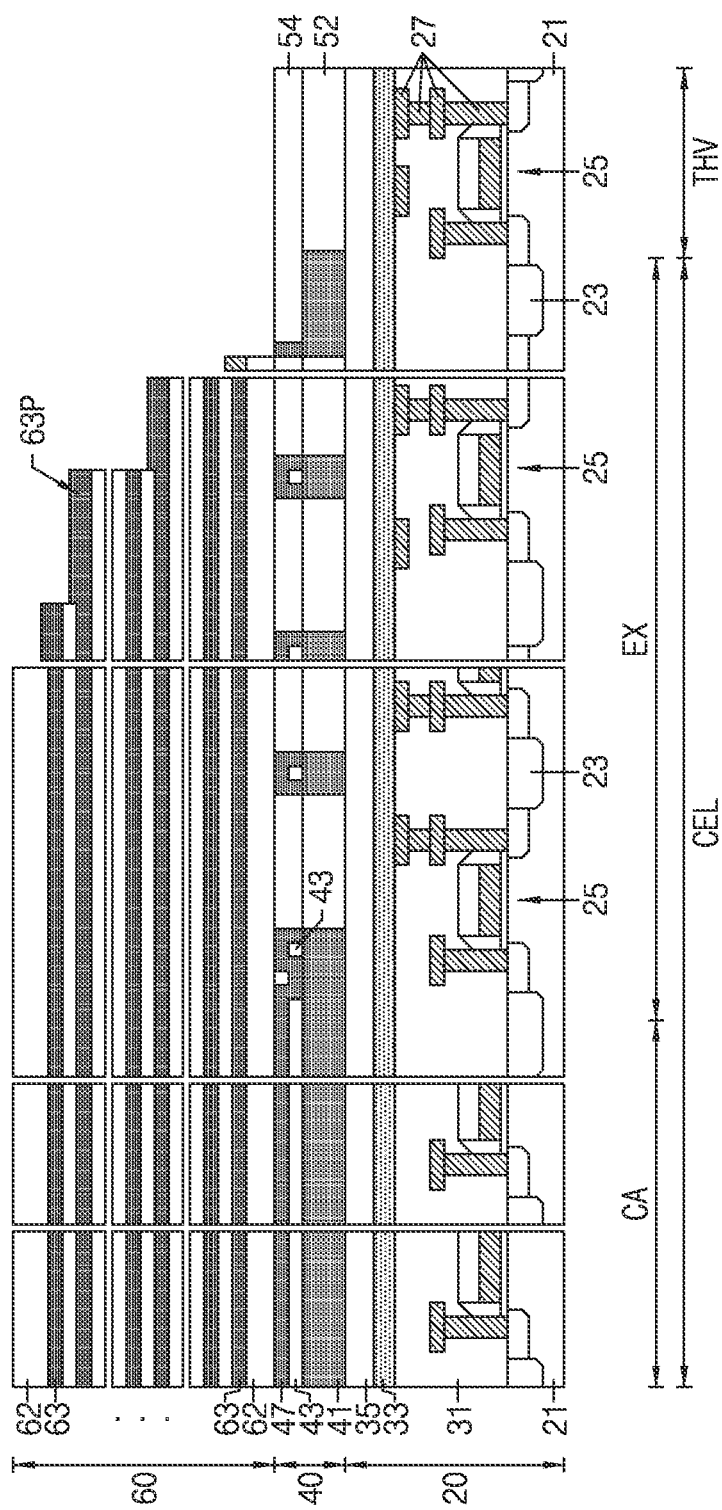
FIGS. 12 to 35 are sectional views explaining semiconductor device formation methods, according to exemplary embodiments of the disclosure.

Referring to FIG. 12, the semiconductor device formation methods according to the exemplary embodiments of the disclosure may include providing a lower structure 20. The lower structure 20 may include a substrate 21, an element isolation layer 23, a plurality of transistors 25, a plurality of lower wirings 27, a first lower insulating layer 31, a second lower insulating layer 33, and a third lower insulating layer 35.

The substrate 21 may include a cell area CEL, and an interconnection area THV adjacent to the cell area CEL. The cell area CEL may include a cell array area CA, and a connection area EX in continuity with the cell array area CA. The substrate 21 may include a semiconductor substrate such as a silicon wafer or a silicon-on-insulator (SOI) wafer. The element isolation layer 23 may be formed in the substrate 21 using a trench isolation method.

The plurality of transistors 25 may be formed in the substrate 21 and/or on the substrate 21 through various methods. The plurality of transistors 25 may include a planar transistor, a fin field effect transistor (FinFET), a multi-bridge channel transistor such as MBCFET®, a nanowire transistor, a vertical transistor, a recess channel transistor, a 3-D transistor, or a combination thereof.

The first lower insulating layer 31 may be formed on the substrate 21 to cover the element isolation layer 23 and the plurality of transistors 25. The plurality of lower wirings 27 may be formed in the first lower insulating layer 31. The plurality of lower wirings 27 may include conductive patterns such as a plurality of horizontal wirings, a plurality of vertical wirings, and a plurality of connection pads. Some of the plurality of lower wirings 27 may be connected to a corresponding one of the plurality of transistors 25. The plurality of transistors 25 and the plurality of lower wirings 27 may constitute a peripheral circuit.

The second lower insulating layer 33 may be formed to cover the first lower insulating layer 31 and the plurality of lower wirings 27 in plan view. The third lower insulating layer 35 may be formed on the second lower insulating layer 33. The second lower insulating layer 33 may include a material having etch selectivity with respect to the third lower insulating layer 35. The second lower insulating layer 33 may correspond to an etch stop layer.

Each of the element isolation layer 23, the first lower insulating layer 31, the second lower insulating layer 33, and the third lower insulating layer 35 may include a single layer or multiple layers. Each of the element isolation layer 23, the first lower insulating layer 31, the second lower insulating layer 33, and the third lower insulating layer 35 may include silicon oxide, silicon nitride, silicon oxynitride, silicon boron nitride (SiBN), silicon carbon nitride (SiCN), low-k dielectrics, high-k dielectrics, or a combination thereof. In an embodiment, the second lower insulating layer 33 may include silicon nitride, silicon oxynitride, silicon boron nitride (SiBN), silicon carbon nitride (SiCN), or a combination thereof. The first lower insulating layer 31 and the third lower insulating layer 35 may include silicon oxide. The plurality of lower wirings 27 may include a single layer or multiple layers. The plurality of lower wirings 27 may include a conductive material such as metal, metal nitride, metal oxide, metal silicide, conductive carbon, polysilicon, amorphous silicon, monocrystalline silicon, or a combination thereof.

A horizontal wiring layer 40 may be formed on the lower structure 20. The horizontal wiring layer 40 may include a horizontal conductive layer 41, a horizontal mold layer 43, a support 47, a first horizontal insulating layer 52, and a second horizontal insulating layer 54.

The horizontal conductive layer 41 may include a single layer or multiple layers. The horizontal conductive layer 41 may include a conductive material such as metal, metal nitride, metal oxide, metal silicide, conductive carbon, polysilicon, amorphous silicon, monocrystalline silicon, or a combination thereof. In an embodiment, the horizontal conductive layer 41 may include a conductive layer such as a polysilicon layer including N-type impurities or a monocrystalline semiconductor layer including N-type impurities. The horizontal conductive layer 41 may correspond to a common source line.

The first horizontal insulating layer 52 may be formed in the interconnection area THV and the connection area EX such that the first horizontal insulating layer 52 contacts the third lower insulating layer 35 while extending through the horizontal conductive layer 41. Top surfaces of the horizontal conductive layer 41 and the first horizontal insulating layer 52 may be substantially coplanar.

The horizontal mold layer 43 may be formed on the horizontal conductive layer 41. The horizontal mold layer 43 may include a configuration the same as the configuration described with reference to FIG. 4. The support 47 may be formed on the horizontal mold layer 43. A portion of the support 47 may directly contact the horizontal conductive layer 41 in plan view while extending through the horizontal mold layer 43. A portion of the support 47 may directly contact a side surface of the horizontal mold layer 43. In an embodiment, the support 47 may include polysilicon.

The second horizontal insulating layer 54 may be formed in the interconnection area THV and the connection area EX such that the second horizontal insulating layer 54 contacts the first horizontal insulating layer 52 while extending through the support 47 and the horizontal mold layer 43. Top surfaces of the support 47 and the second horizontal insulating layer 54 may be substantially coplanar. A portion of the second horizontal insulating layer 54 may directly contact the horizontal conductive layer 41 in plan view while extending through the support 47.

Each of the first horizontal insulating layer 52 and the second horizontal insulating layer 54 may include a single layer or multiple layers. Each of the first horizontal insulating layer 52 and the second horizontal insulating layer 54 may include silicon oxide, silicon nitride, silicon oxynitride, silicon boron nitride (SiBN), silicon carbon nitride (SiCN), low-k dielectrics, high-k dielectrics, or a combination thereof. In an embodiment, each of the first horizontal insulating layer 52 and the second horizontal insulating layer 54 may include silicon oxide.

A first stack structure 60 may be formed on the horizontal wiring layer 40. The first stack structure 60 may include a plurality of first insulating layers 62 and a plurality of first mold layers 63 which are repeatedly alternately stacked. The plurality of first insulating layers 62 and the plurality of first mold layers 63 may be formed in the cell area CEL on the substrate 21. Each of the plurality of first mold layers 63 may include a first preliminary pad 63P. The first preliminary pad 63P may be relatively thicker than a portion of each of the plurality of first mold layers 63 other than the first preliminary pads 63P. The first preliminary pads 63P may be formed in the connection area EX on the substrate 21.

The plurality of first insulating layers 62 and the plurality of first mold layers 63 may form a staircase shape in the connection area EX. A top surface of the first preliminary pad 63P may be exposed. For example, the top surface of the first preliminary pad 63P may not be overlapped by the plurality of first mold layers 63. A top surface of the second horizontal insulating layer 54 may be exposed in the interconnection area THV.

The plurality of first mold layers 63 may include a material having etch selectivity with respect to the plurality of first insulating layers 62. In an embodiment, the plurality of first insulating layers 62 may include silicon oxide, and the plurality of first mold layers 63 may include silicon nitride. An uppermost one of the plurality of first insulating layers 62 may be thicker than one of the plurality of first insulating layers 62 that is adjacent to the center of the first stack structure 60.

Figure 13:
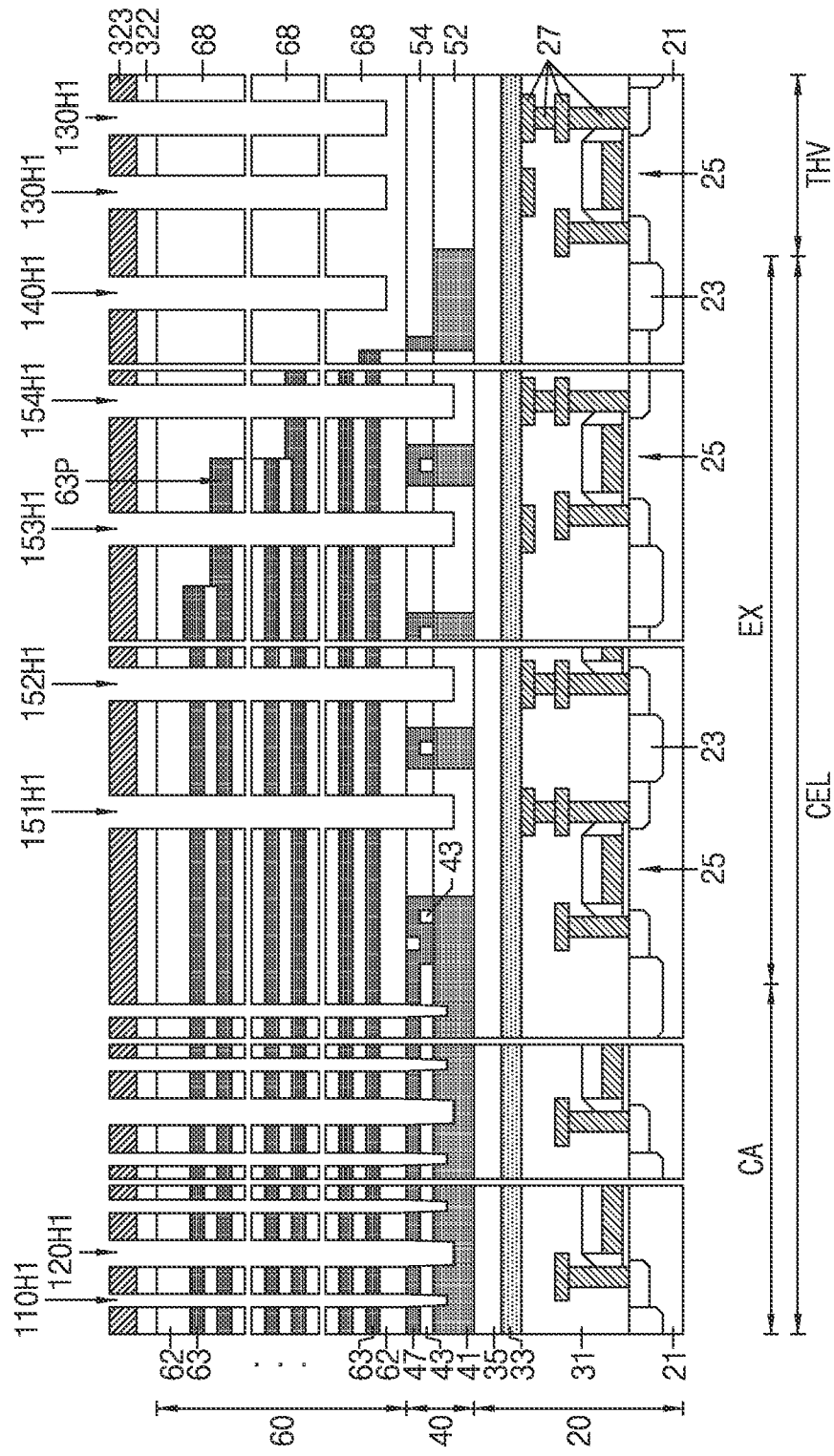

Referring to FIG. 13, a first interlayer insulating layer 68 may be formed on the second horizontal insulating layer 54 in the interconnection area THV. The first interlayer insulating layer 68 may extend into the connection area EX. The first interlayer insulating layer 68 may cover the horizontal conductive layer 41 and the second horizontal insulating layer 54 in plan view. The first interlayer insulating layer 68 may extend on the plurality of first mold layers 63 and the plurality of first insulating layers 62 in the connection area EX. The first interlayer insulating layer 68 may cover the first preliminary pad 63P in plan view. Top surfaces of the uppermost one of the plurality of first insulating layers 62 and the first interlayer insulating layer 68 may be substantially coplanar. The first stack structure 60 may include the plurality of first insulating layers 62, the plurality of first mold layers 63, and the first interlayer insulating layer 68.

The first interlayer insulating layer 68 may include a single layer or multiple layers. The first interlayer insulating layer 68 may include silicon oxide, silicon nitride, silicon oxynitride, silicon boron nitride (SiBN), silicon carbon nitride (SiCN), low-k dielectrics, high-k dielectrics, or a combination thereof. In an embodiment, the first interlayer insulating layer 68 may include silicon oxide.

First mask patterns 322 and 323 may be formed on the first stack structure 60. The first mask patterns 322 and 323 may include a first lower mask pattern 322, and a first upper mask pattern 323 on the first lower mask pattern 322. Using the first mask patterns 322 and 323 as an etch mask, a plurality of lower channel holes 110H1, a plurality of lower separation trenches 120H1, a plurality of lower through holes 130H1, a lower source contact hole 140H1, and a plurality of lower cell contact holes 151H1, 152H1, 153H1, and 154H1 may be formed in the first stack structure 60.

Formation of the plurality of lower channel holes 110H1, the plurality of lower separation trenches 120H1, the plurality of lower through holes 130H1, the lower source contact hole 140H1, and the plurality of lower cell contact holes 151H1, 152H1, 153H1, and 154H1 may include a simultaneous etching process. The etching process may include an anisotropic etching process, an isotropic etching process, or a combination thereof.

In an embodiment, the etching process may include a first etching process for etching the plurality of first insulating layers 62, and a second etching process for etching the plurality of first mold layers 63. The second etching process may include etching conditions different from those of the first etching process. The first etching process and the second etching process may be repeatedly alternately performed. The plurality of first mold layers 63 may include a material different from that of the plurality of first insulating layers 62. The first interlayer insulating layer 68 may include a material similar or substantially identical to that of the plurality of first insulating layers 62. During execution of the first etching process, the first interlayer insulating layer 68 may exhibit an etching rate similar to that of the plurality of first insulating layers 62. During execution of the second etching process, the first interlayer insulating layer 68 may exhibit a lower etching rate than the plurality of first mold layers 63.

Each of the plurality of lower channel holes 110H1 may extend into the horizontal conductive layer 41 while extending through the plurality of first insulating layers 62, the plurality of first mold layers 63, the support 47, and the horizontal mold layer 43. The plurality of lower channel holes 110H1 may be formed in the cell array area CA. Each of the plurality of lower separation trenches 120H1 may extend into the horizontal conductive layer 41 while extending through the plurality of first insulating layers 62, the plurality of first mold layers 63, the support 47, and the horizontal mold layer 43.

Each of the plurality of lower through holes 130H1 may extend into the first interlayer insulating layer 68. The first interlayer insulating layer 68 may be preserved between the plurality of lower through holes 130H1 and the second horizontal insulating layer 54. The horizontal width of each of the plurality of lower through holes 130H1 may be greater than the horizontal width of each of the plurality of lower channel holes 110H1. The plurality of lower through holes 130H1 may be formed in the interconnection area THV.

The lower source contact hole 140H1 may extend into the first interlayer insulating layer 68. The first interlayer insulating layer 68 may be preserved between the lower source contact hole 140H1 and the second horizontal insulating layer 54. The horizontal width of the lower source contact hole 140H1 may be greater than the horizontal width of each of the plurality of lower channel holes 110H1. A lower end of the lower source contact hole 140H1 may be formed at substantially the same level as lower ends of the plurality of lower through holes 130H1. The lower source contact hole 140H1 may be formed in the connection area EX.

The plurality of lower cell contact holes 151H1, 152H1, 153H1, and 154 H1 may include a first lower cell contact hole 151H1, a second lower cell contact hole 152H1, a third lower cell contact hole 153H1, and a fourth lower cell contact hole 154H1. The plurality of lower cell contact holes 151H1, 152H1, 153H1, and 154H1 may be formed in the connection area EX. The horizontal width of each of the plurality of lower cell contact holes 151H1, 152H1, 153H1, and 154H1 may be greater than the horizontal width of each of the plurality of lower channel holes 110H1.

Each of the plurality of lower cell contact holes 151H1, 152H1, 153H1, and 154H1 may extend into the first horizontal insulating layer 52 while extending through the first stack structure 60 and the second horizontal insulating layer 54. Lower ends of the plurality of lower cell contact holes 151H1, 152H1, 153H1, and 154H1 may be formed at a lower level than lower ends of the plurality of lower channel holes 110H1. The first horizontal insulating layer 52 may be preserved between the lower ends of the plurality of lower cell contact holes 151H1, 152H1, 153H1, and 154H1 and the third lower insulating layer 35.

Each of the first lower cell contact hole 151H1 and the second lower cell contact hole 152H1 may extend into the first horizontal insulating layer 52 while extending through the plurality of first insulating layers 62, the plurality of first mold layers 63, and the second horizontal insulating layer 534. Each of the third lower cell contact hole 153H1 and the fourth lower cell contact hole 154H1 may extend into the first horizontal insulating layer 52 while extending through the first interlayer insulating layer 68, the plurality of first insulating layers 62, the plurality of first mold layers 63, and the second horizontal insulating layer 54.

Each of the plurality of lower channel holes 110H1, the plurality of lower separation trenches 120H1, the plurality of lower through holes 130H1, the lower source contact hole 140H1, and the plurality of lower cell contact holes 151H1, 152H1, 153H1, and 154H1 may include a configuration substantially the same as the configuration described with reference to FIGS. 1 to 11.

Figure 14:
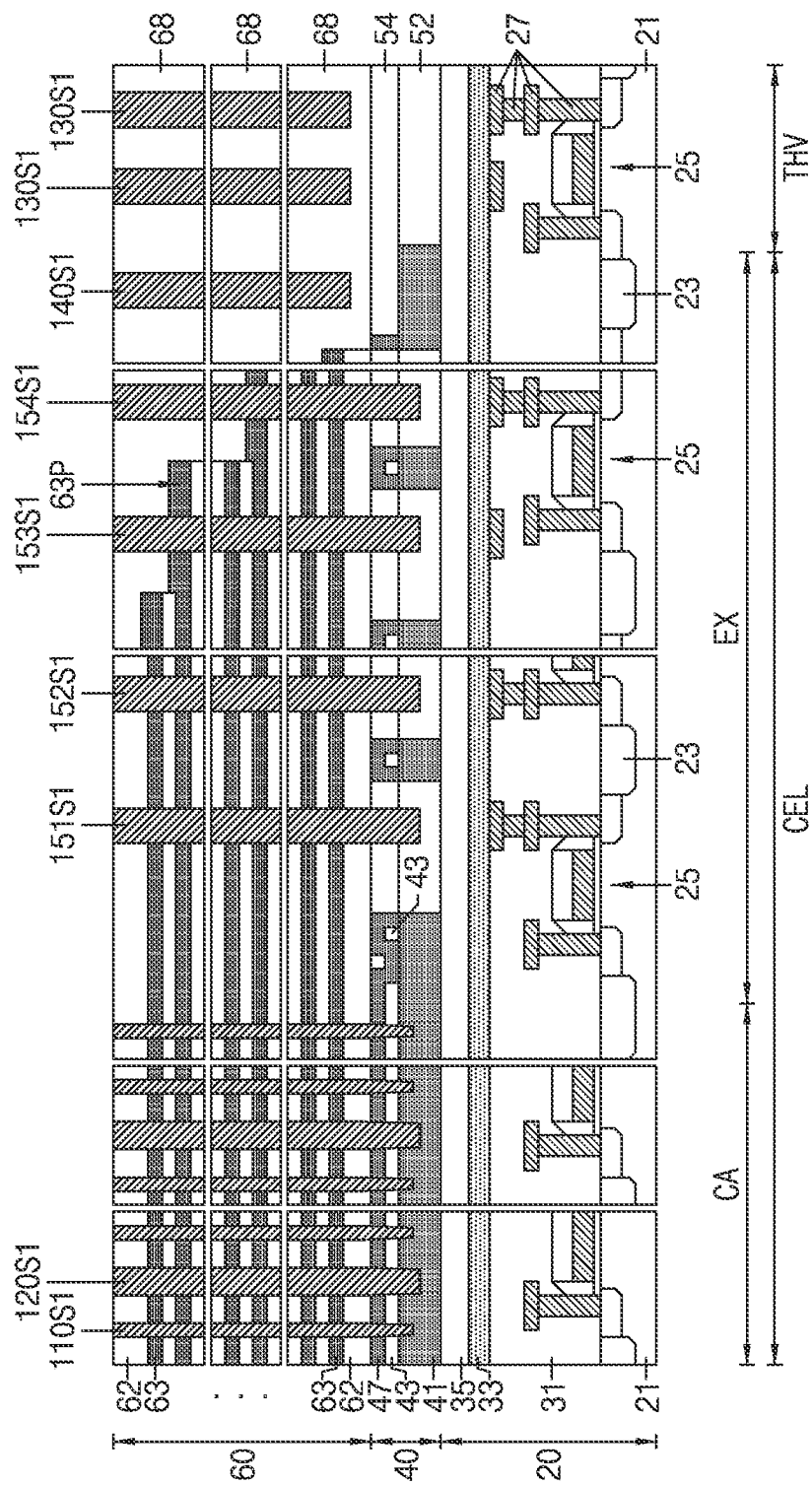

Referring to FIG. 14, a plurality of lower channel sacrificial layers 110S1 may be formed in the plurality of lower channel holes 110H1, a plurality of lower separation sacrificial layers 120S1 may be formed in the plurality of lower separation trenches 120H1, a plurality of lower through sacrificial layers 130S1 may be formed in the plurality of lower through holes 130H1, a lower source contact sacrificial layer 140S1 may be formed in the lower source contact hole 140H1, and a plurality of lower cell contact sacrificial layers 151S1, 152S1, 153S1, and 154S1 may be formed in the plurality of lower cell contact holes 151H1, 152H1, 153H1, and 154H1, respectively. The first mask patterns 322 and 323 may be removed. Each of the plurality of lower channel sacrificial layers 110S1, the plurality of lower separation sacrificial layers 120S1, the plurality of lower through sacrificial layers 130S1, the lower source contact sacrificial layer 140S1, and the plurality of lower cell contact sacrificial layers 151S1, 152S1, 153S1, and 154S1 may include polysilicon, tungsten, or a combination thereof.

Figure 15:
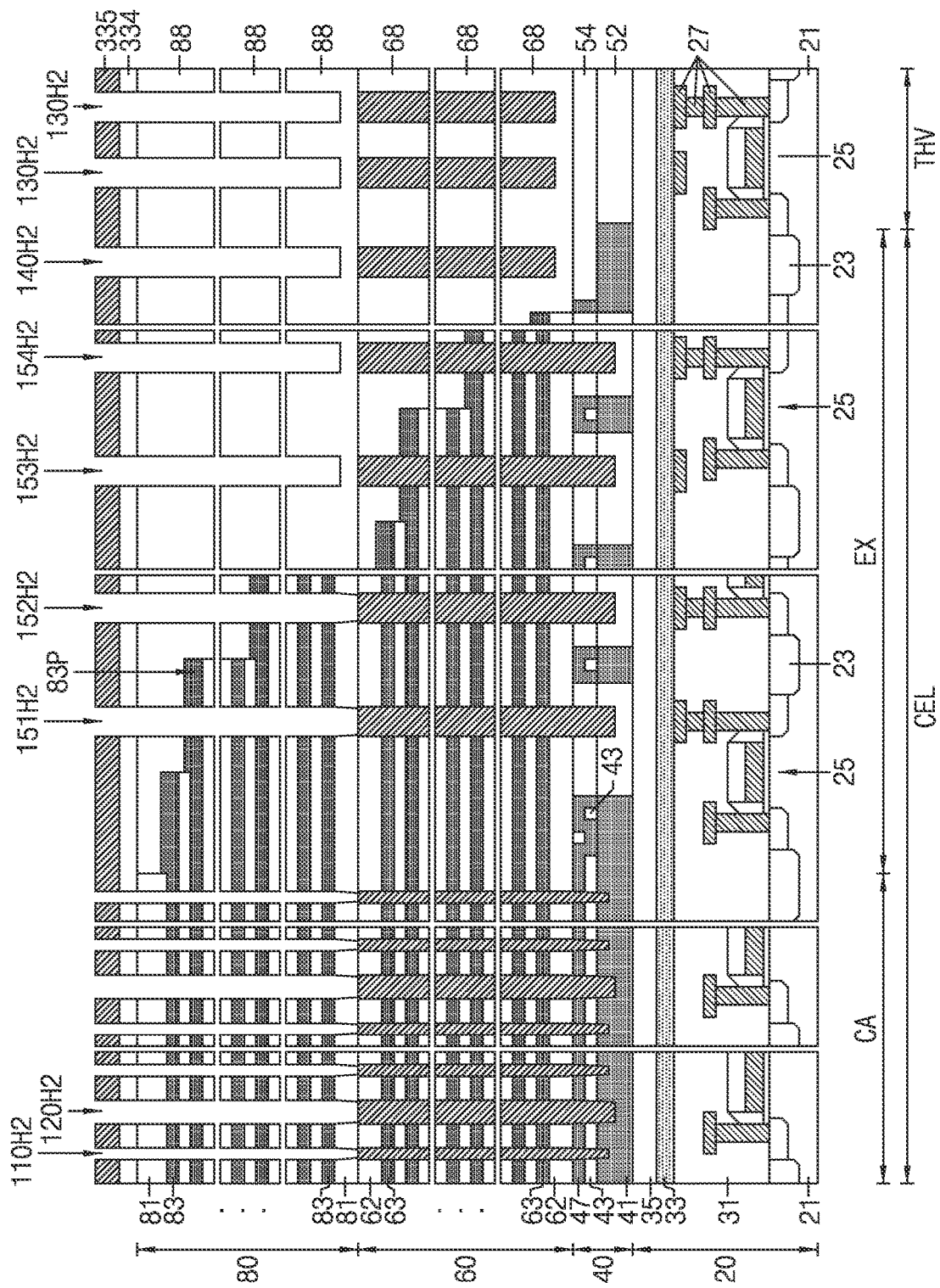

Referring to FIG. 15, a second stack structure 80 may be formed on the first stack structure 60, the plurality of lower channel sacrificial layers 110S1, the plurality of lower separation sacrificial layers 120S1, the plurality of lower through sacrificial layers 130S1, the lower source contact sacrificial layer 140S1, and the plurality of lower cell contact sacrificial layers 151S1, 152S1, 153S1, and 154S1.

The second stack structure 80 may include a plurality of second insulating layers 81 and the plurality of second mold layers 83 which are repeatedly alternately stacked. The plurality of second insulating layers 81 and the plurality of second mold layers 83 may be formed in the cell area CEL on the substrate 21. Each of the plurality of second mold layers 83 may include a second preliminary pad 83P. The second preliminary pad 83P may be relatively thicker than a portion of each of the plurality of second mold layers 83 other than the second preliminary pad 83P. The second preliminary pad 83P may be formed in the connection area EX on the substrate 21. The plurality of second insulating layers 81 and the plurality of second mold layers 83 may form a staircase shape in the connection area EX.

The plurality of second mold layers 83 may include a material having etch selectivity with respect to the plurality of second insulating layers 81. The plurality of second mold layers 83 may include substantially the same material as the plurality of first mold layers 63. The plurality of second insulating layers 81 may include substantially the same material as the plurality of first insulating layers 62. In an embodiment, the plurality of second insulating layers 81 may include silicon oxide, and the plurality of second mold layers 83 may include silicon nitride.

A second interlayer insulating layer 88 may be formed on the first interlayer insulating layer 68 and the plurality of lower through sacrificial layers 130S1 in the interconnection area THV. The second interlayer insulating layer 88 may extend into the connection area EX. The second interlayer insulating layer 88 may cover the lower source contact sacrificial layer 140S1 in plan view. The second interlayer insulating layer 88 may extend on the plurality of lower cell contact sacrificial layers 151S1, 152S1, 153S1, and 154S1.

The second interlayer insulating layer 88 may extend on the plurality of second mold layers 83 and the plurality of second insulating layers 81 in the connection area EX. The second interlayer insulating layer 88 may cover the second preliminary pad 83P in plan view. Top surfaces of an uppermost one of the plurality of second insulating layers 81 and the second interlayer insulating layer 88 may be substantially coplanar. The second stack structure 80 may include the plurality of second insulating layers 81, the plurality of second mold layers 83, and the second interlayer insulating layer 88.

The second interlayer insulating layer 88 may include a single layer or multiple layers. The second interlayer insulating layer 88 may include silicon oxide, silicon nitride, silicon oxynitride, silicon boron nitride (SiBN), silicon carbon nitride (SiCN), low-k dielectrics, high-k dielectrics, or a combination thereof. In an embodiment, the second interlayer insulating layer 88 may include silicon oxide.

A second mask patterns 334 and 335 may be formed on the second stack structure 80. The second mask patterns 334 and 335 may include a second lower mask pattern 334, and a second upper mask pattern 335 on the second lower mask pattern 334. Using the second mask patterns 334 and 335 as an etch mask, a plurality of upper channel holes 110H2, a plurality of upper separation trenches 120H2, a plurality of upper through holes 130H2, an upper source contact hole 140H2, and a plurality of upper cell contact holes 151H2, 152H2, 153H2, and 154H2 may be formed in the second stack structure 80.

Each of the plurality of upper channel holes 110H2 may communicate with a corresponding one of the plurality of lower channel holes 110H1 while extending through the plurality of second insulating layers 81 and the plurality of second mold layers 83. The plurality of upper channel holes 110H2 may be formed in the cell array area CA.

Each of the plurality of upper separation trenches 120H2 may communicate with a corresponding one of the plurality of lower separation trenches 120H1 while extending through the plurality of second insulating layers 81 and the plurality of second mold layers 83.

Each of the plurality of upper through holes 130H2 may extend into the second interlayer insulating layer 88. The second interlayer insulating layer 88 may be preserved between the plurality of upper through holes 130H2 and the plurality of lower through sacrificial layers 130S1. The horizontal width of each of the plurality of upper through holes 130H2 may be greater than the horizontal width of each of the plurality of upper channel holes 110H2. The plurality of upper through holes 130H2 may be formed in the interconnection area THV.

The upper source contact hole 140H2 may extend into the second interlayer insulating layer 88. The second interlayer insulating layer 88 may be preserved between the upper source contact hole 140H2 and the lower source contact sacrificial layer 140S1. The horizontal width of the upper source contact hole 140H2 may be greater than the horizontal width of each of the plurality of upper channel holes 110H2. A lower end of the upper source contact hole 140H2 may be formed at substantially the same level as lower ends of the plurality of upper through holes 130H2. The upper source contact hole 140H2 may be formed in the connection area EX.

The plurality of upper cell contact holes 151H2, 152H2, 153H2, and 154H2 may include a first upper cell contact hole 151H2, a second upper cell contact hole 152H2, a third upper cell contact hole 153H2, and a fourth upper cell contact hole 154H2. The plurality of upper cell contact holes 151H2, 152H2, 153H2, and 154H2 may be formed in the connection area EX. The horizontal width of each of the plurality of upper cell contact holes 151H2, 152H2, 153H2, and 154H2 may be greater than the horizontal width of each of the plurality of upper channel holes 110H2.

The first upper cell contact hole 151H2 may communicate with the first lower cell contact hole 151H1 while extending through the second interlayer insulating layer 88, the plurality of second insulating layers 81, and the plurality of second mold layers 83. The second upper cell contact hole 152H2 may communicate with the second lower cell contact hole 152H1 while extending through the second interlayer insulating layer 88, the plurality of second insulating layers 81, and the plurality of second mold layers 83.

The third upper cell contact hole 153H2 and the fourth upper cell contact hole 154H2 may extend into the second interlayer insulating layer 88. The second interlayer insulating layer 88 may be preserved between the third upper cell contact hole 153H2 and the third lower cell contact sacrificial layer 153S1 and between the fourth upper cell contact hole 154H2 and the fourth lower cell contact sacrificial layer 154S1.

Figure 16:
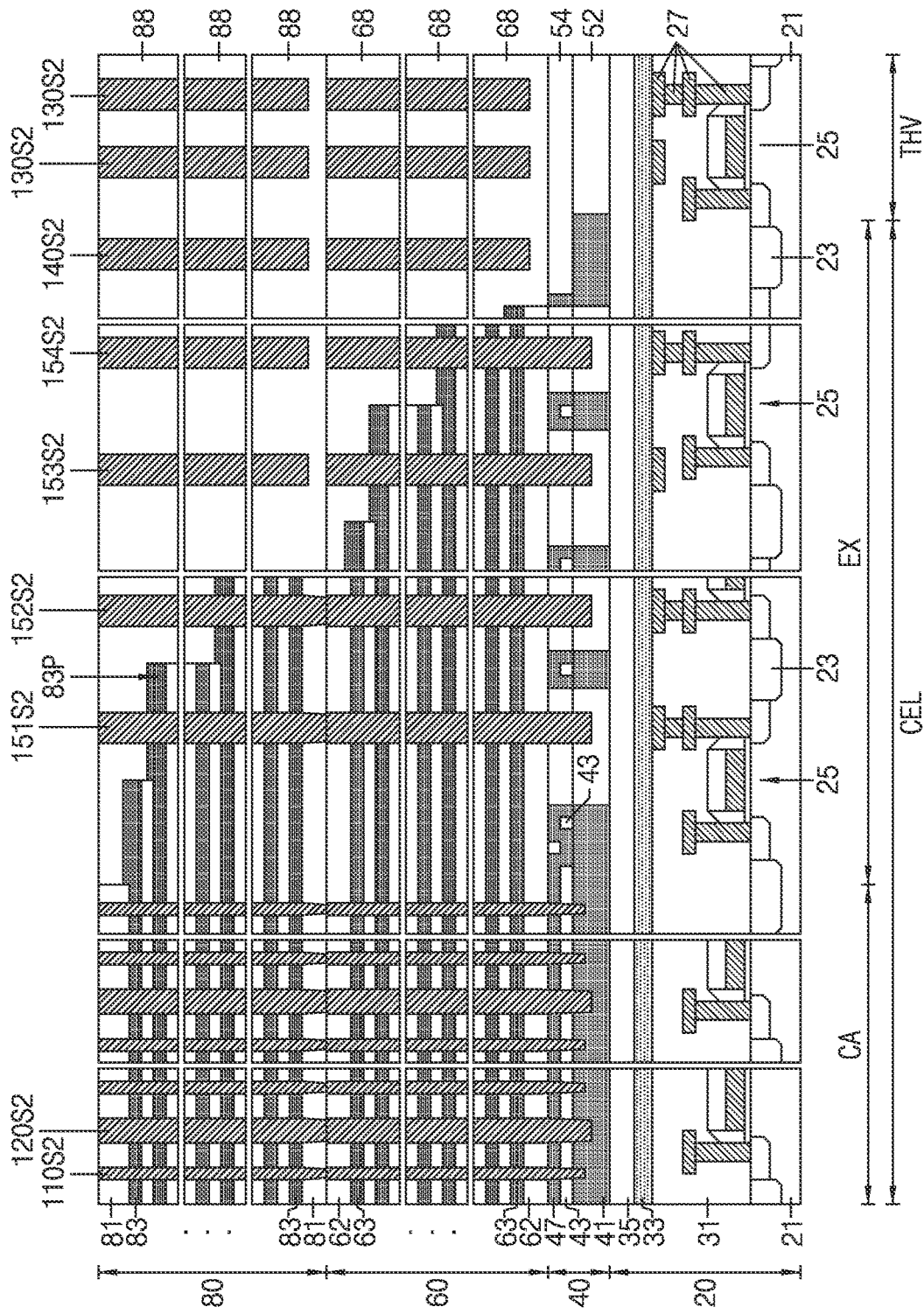

Referring to FIG. 16, a plurality of upper channel sacrificial layers 110S2 may be formed in the plurality of upper channel holes 110H2, a plurality of upper separation sacrificial layers 120S2 may be formed in the plurality of upper separation trenches 120H2, a plurality of upper through sacrificial layers 130S2 may be formed in the plurality of upper through holes 130H2, an upper source contact sacrificial layer 140S2 may be formed in the upper source contact hole 140H2, and a plurality of upper cell contact sacrificial layers 151S2, 152S2, 153S2, and 154S2 may be formed in the plurality of upper cell contact holes 151H2, 152H2, 153H2, and 154H2, respectively. The second mask patterns 334 and 335 may be removed.

The plurality of upper channel sacrificial layers 110S2, the plurality of upper separation sacrificial layers 120S2, the plurality of upper through sacrificial layers 130S2, the upper source contact sacrificial layer 140S2, and the plurality of upper cell contact sacrificial layers 151S2, 152S2, 153S2, and 154S2 may include substantially the same material as the plurality of lower channel sacrificial layers 110S1, the plurality of lower separation sacrificial layers 120S1, the plurality of lower through sacrificial layers 130S1, the lower source contact sacrificial layer 140S1, and the plurality of lower cell contact sacrificial layers 151S1, 152S1, 153S1, and 154S1. The plurality of upper channel sacrificial layers 110S2, the plurality of upper separation sacrificial layers 120S2, the plurality of upper through sacrificial layers 130S2, the upper source contact sacrificial layer 140S2, and the plurality of upper cell contact sacrificial layers 151S2, 152S2, 153S2, and 154S2 may include polysilicon, tungsten, or a combination thereof.

Figure 17:
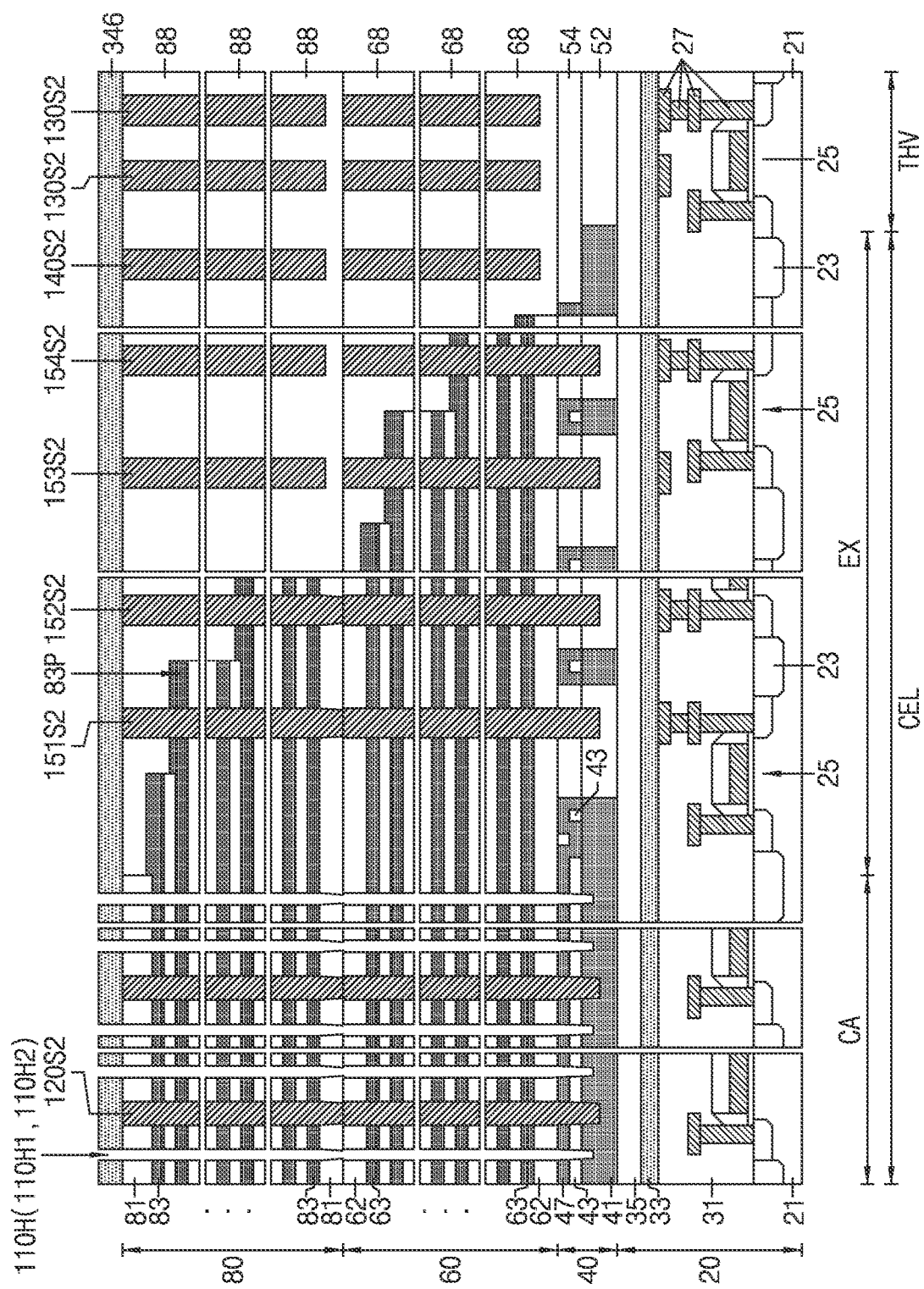

Referring to FIG. 17, a third mask pattern 346 may be formed to cover the second stack structure 80, the plurality of upper separation sacrificial layer 120S2, the plurality of upper through sacrificial layers 130S2, the upper source contact sacrificial layer 140S2, and the plurality of upper cell contact sacrificial layers 151S2, 152S2, 153S2, and 154S2 while exposing the plurality of upper channel sacrificial layers 110S2.

The plurality of upper channel sacrificial layers 110S2 and the plurality of lower channel sacrificial layers 110S1 may be removed, thereby forming a plurality of channel holes 110H. The plurality of channel holes 110H may include the plurality of lower channel holes 110H1 and the plurality of upper channel holes 110H2. Each of the plurality of lower channel holes 110H1 may communicate with a corresponding one of the plurality of upper channel holes 110H2.

Figure 18:
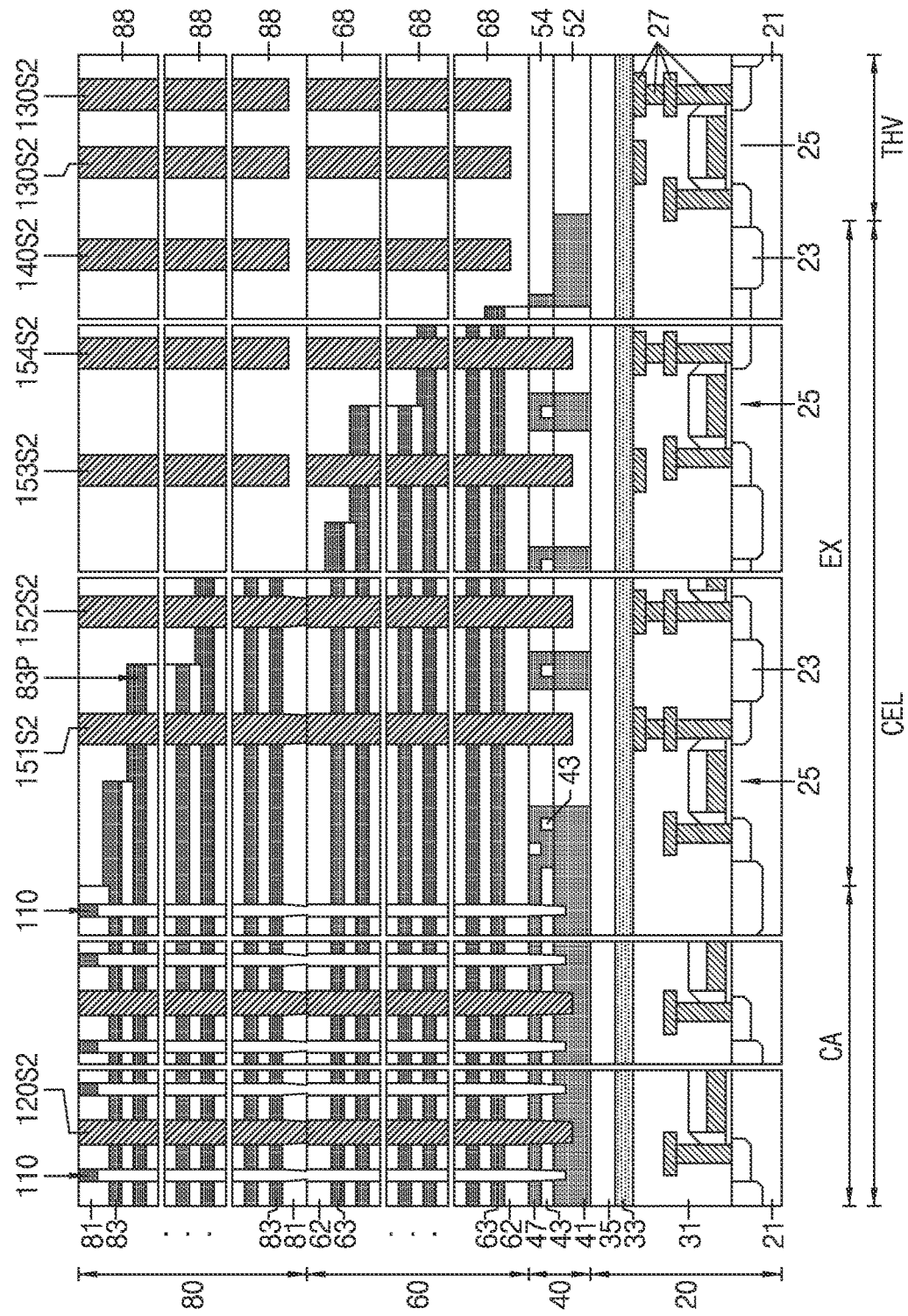

Referring to FIG. 18, a plurality of channel structures 110 may be formed in the plurality of channel holes 110H. Each of the plurality of channel structures 110 may include a configuration substantially the same as the configuration described with reference to FIGS. 1 to 3. The third mask pattern 346 may be removed.

Figure 19:
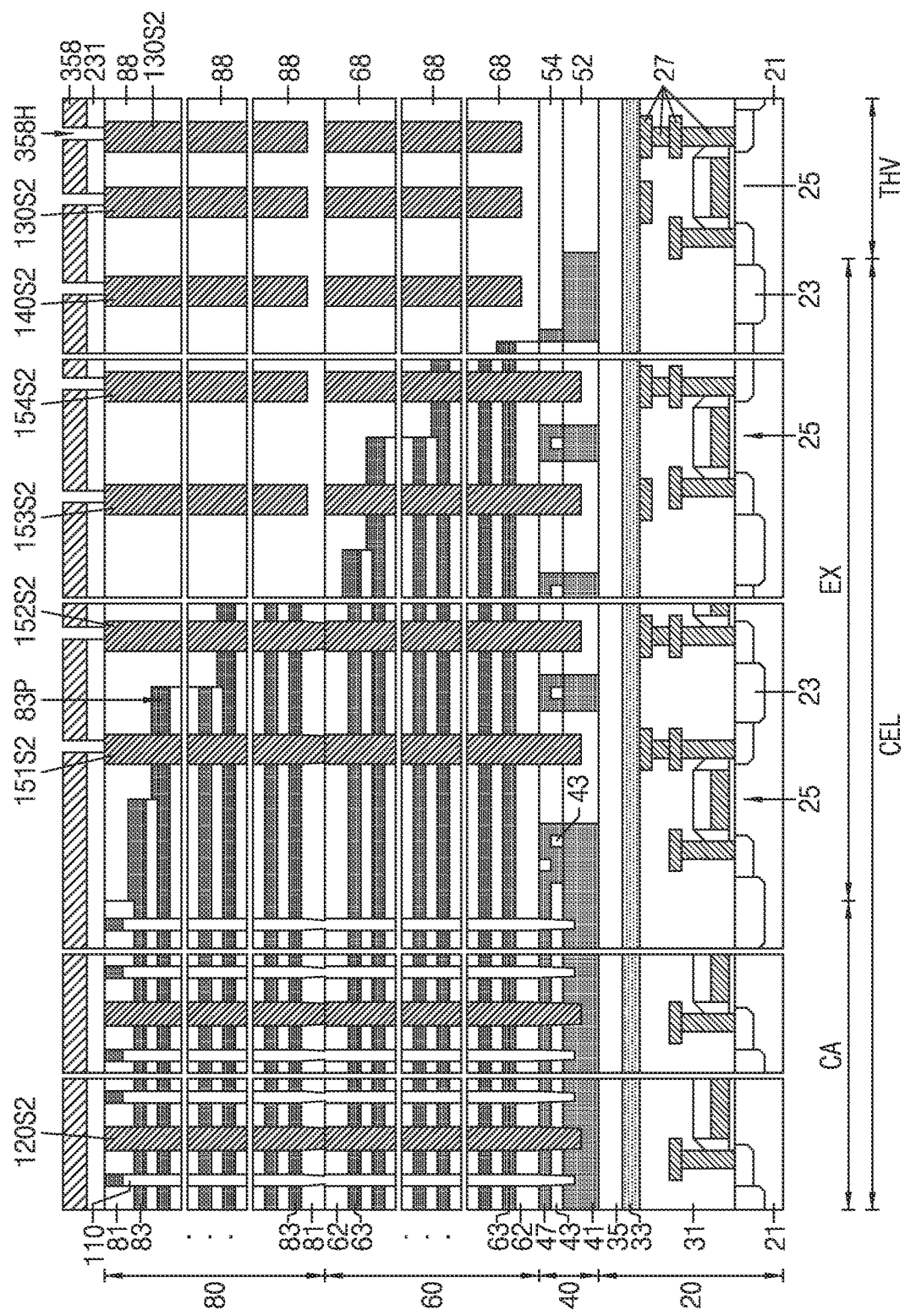

Referring to FIG. 19, a first upper insulating layer 231 may be formed on the second stack structure 80, the plurality of channel structures 110, the plurality of upper separation sacrificial layers 120S2, the plurality of upper through sacrificial layers 130S2, the upper source contact sacrificial layer 140S2, and the plurality of upper cell contact sacrificial layers 151S2, 152S2, 153S2, and 154S2. The first upper insulating layer 231 may include silicon oxide, silicon nitride, silicon oxynitride, silicon boron nitride (SiBN), silicon carbon nitride (SiCN), low-k dielectrics, high-k dielectrics, or a combination thereof. In an embodiment, the first upper insulating layer 231 may include silicon oxide.

A fourth mask pattern 358 may be formed on the first upper insulating layer 231. A plurality of first openings 358H may be formed to extend through the fourth mask pattern 358 and the first upper insulating layer 231, thereby exposing the plurality of upper through sacrificial layers 130S2, the upper source contact sacrificial layer 140S2, and the plurality of upper cell contact sacrificial layers 151S2, 152S2, 153S2, and 154S2. Formation of the plurality of first openings 358H may include a lithography process, a patterning process, or a combination thereof. Each of the plurality of first openings 358H may include an alignment error caused by an alignment limitation of a lithography process. The horizontal width of each of the plurality of first openings 358H may be smaller than the horizontal width of each of the plurality of upper through holes 130H2, the upper source contact hole 140H2, and the plurality of upper cell contact holes 151H2, 152H2, 153H2, and 154H2.

Figure 20:
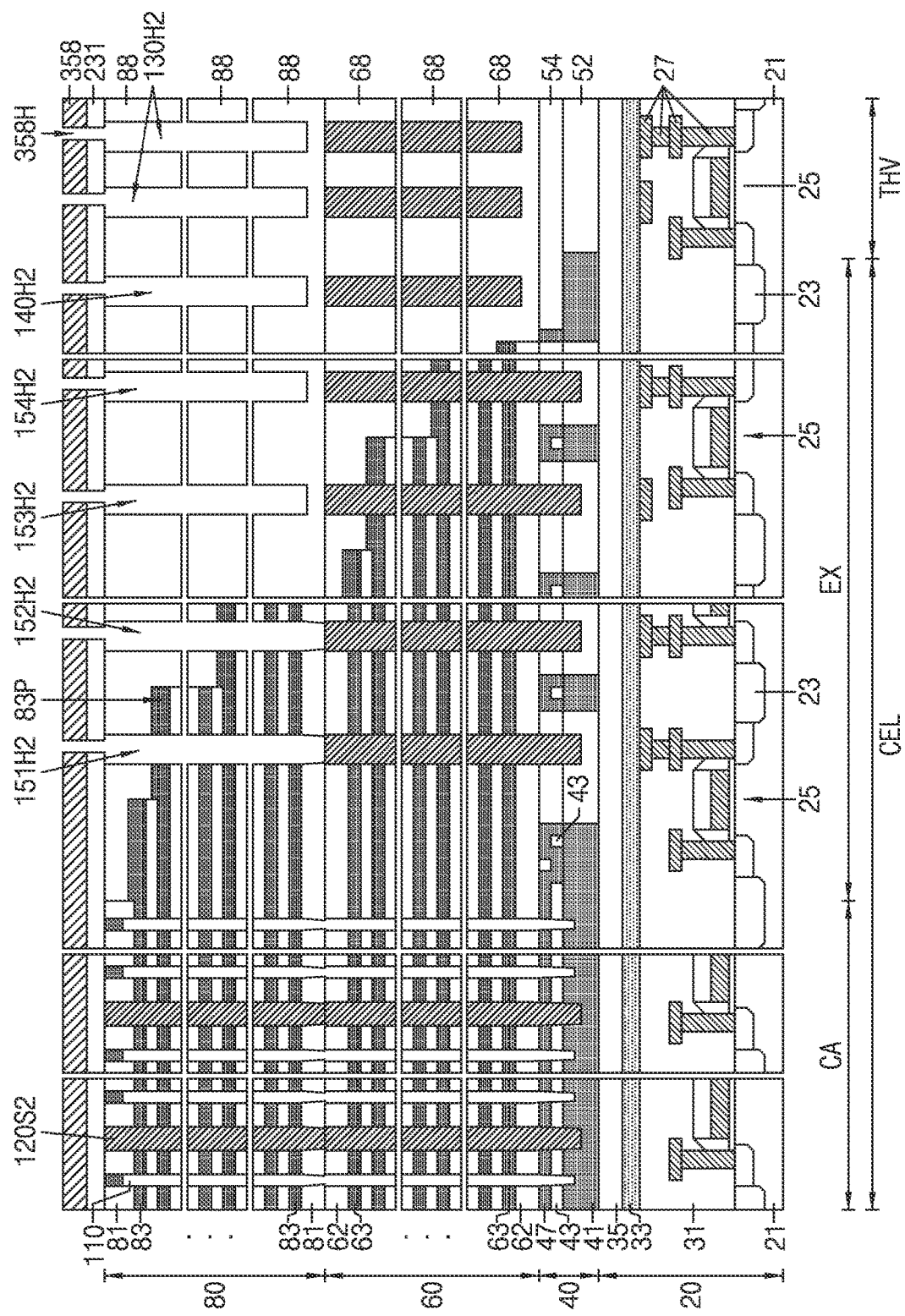

Referring to FIG. 20, the plurality of upper through sacrificial layers 130S2, the upper source contact sacrificial layer 140S2, and the plurality of upper cell contact sacrificial layers 151S2, 152S2, 153S2, and 154S2 may be removed, thereby exposing the plurality of upper through holes 130H2, the upper source contact hole 140H2, and the plurality of upper cell contact holes 151H2, 152H2, 153H2, and 154H2.

Figure 21:
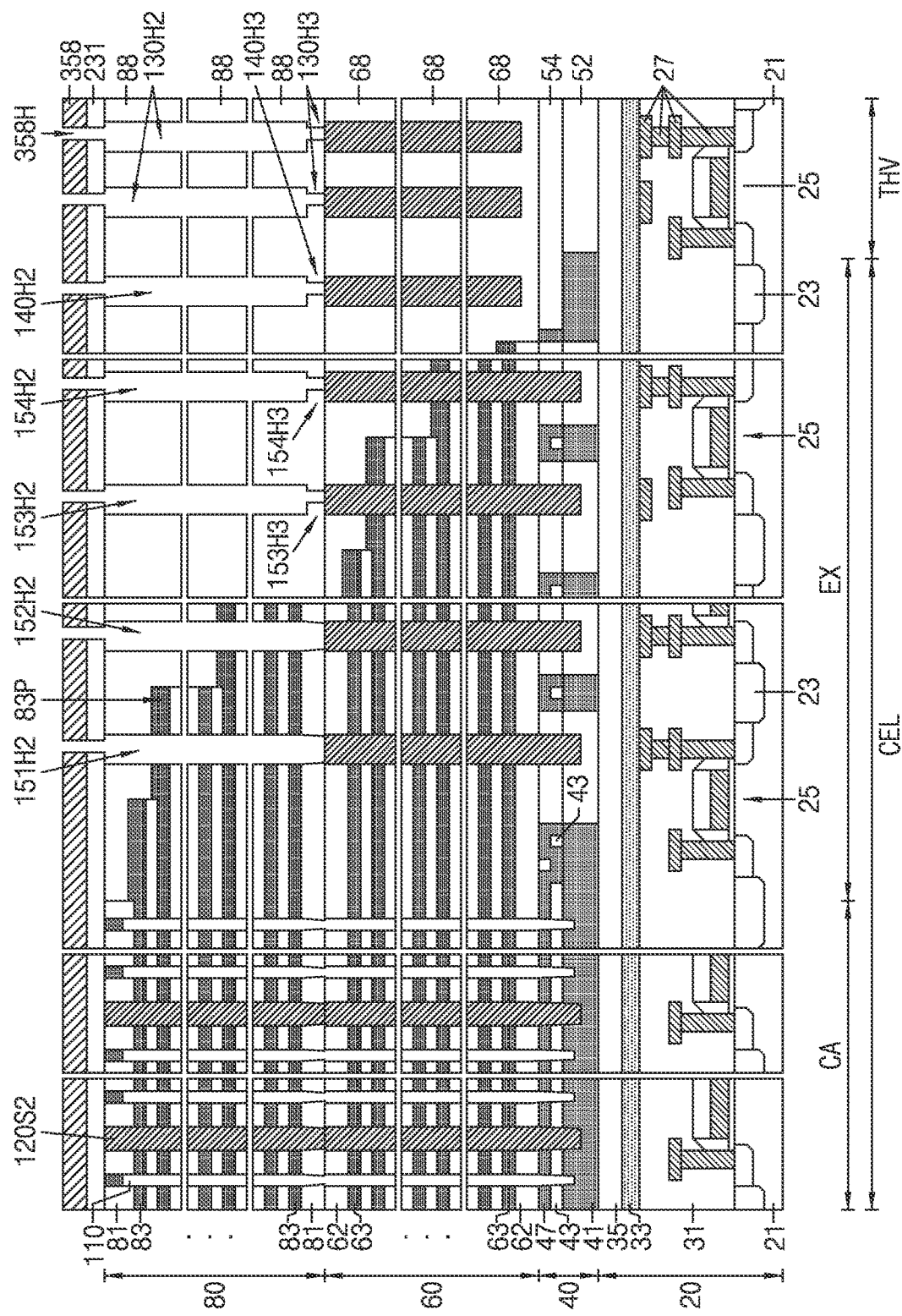

Referring to FIG. 21, the second interlayer insulating layer 88 may be etched using the fourth mask pattern 358 as an etch mask, thereby forming a plurality of upper-lower through holes 130H3, an upper-lower source contact hole 140H3, and a plurality of upper-lower cell contact holes 153H3 and 154H3. Each of the plurality of upper-lower through holes 130H3, the upper-lower source contact hole 140H3, and the plurality of upper-lower cell contact holes 153H3 and 154H3 may include an alignment error caused by an alignment limitation of a lithography process.

The plurality of upper-lower through holes 130H3 may communicate with the plurality of upper through holes 130H2 and the plurality of lower through holes 130H1 while extending through the second interlayer insulating layer 88. The horizontal width of each of the plurality of upper-lower through holes 130H3 may be smaller than the horizontal width of each of the plurality of upper through holes 130H2 and the plurality of lower through holes 130H1.

The upper-lower source contact hole 140H3 may communicate with the plurality of upper source contact holes 140H2 and the plurality of lower source contact holes 140H1 while extending through the second interlayer insulating layer 88. The horizontal width of the upper-lower source contact hole 140H3 may be smaller than the horizontal width of each of the plurality of upper source contact holes 140H2 and the plurality of lower source contact holes 140H1.

The plurality of upper-lower cell contact holes 153H3 and 154H3 may include a third upper-lower cell contact hole 153H3 and a fourth upper-lower cell contact hole 154H3. The third upper-lower cell contact hole 153H3 may communicate with the third upper cell contact hole 153H2 and the third lower cell contact hole 153H1 while extending through the second interlayer insulating layer 88. The horizontal width of the third upper-lower cell contact hole 153H3 may be smaller than the horizontal width of each of the third upper cell contact hole 153H2 and the third lower cell contact hole 153H1.

The fourth upper-lower cell contact hole 154H3 may communicate with the fourth upper cell contact hole 154H2 and the fourth lower cell contact hole 154H1 while extending through the second interlayer insulating layer 88. The horizontal with of the fourth upper-lower cell contact hole 154H3 may be smaller than the horizontal width of each of the fourth upper cell contact hole 154H2 and the fourth lower cell contact hole 154H1.

Figure 22:
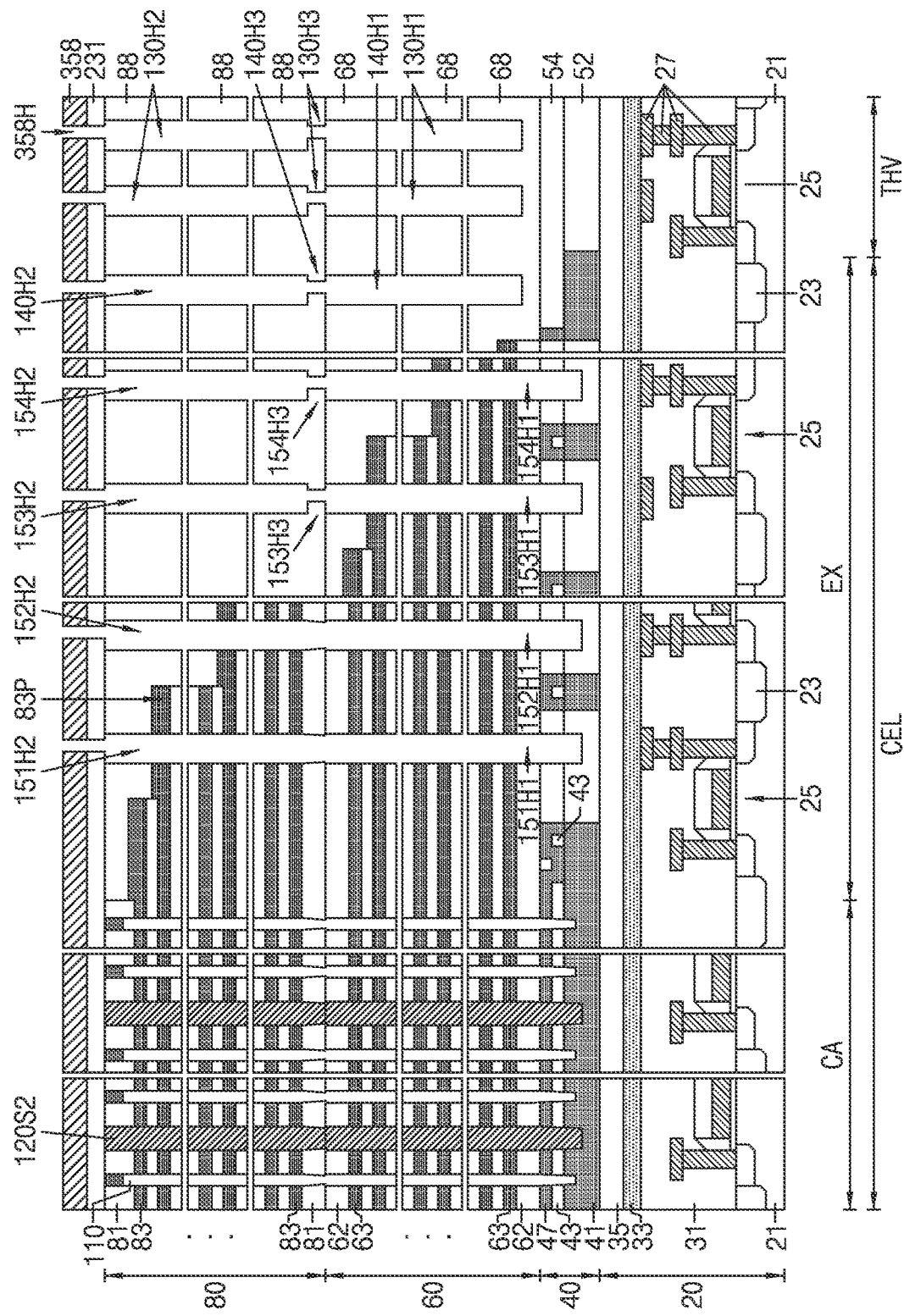

Referring to FIG. 22, the plurality of lower through sacrificial layers 130S1, the lower source contact sacrificial layer 140S1, and the plurality of lower cell contact sacrificial layers 151S1, 152S1, 153S1, and 154S1 may be removed, thereby exposing the plurality of lower through holes 130H1, the lower source contact hole 140H1, and the plurality of lower cell contact holes 151H1, 152H1, 153H1, and 154H1.

Figure 23:
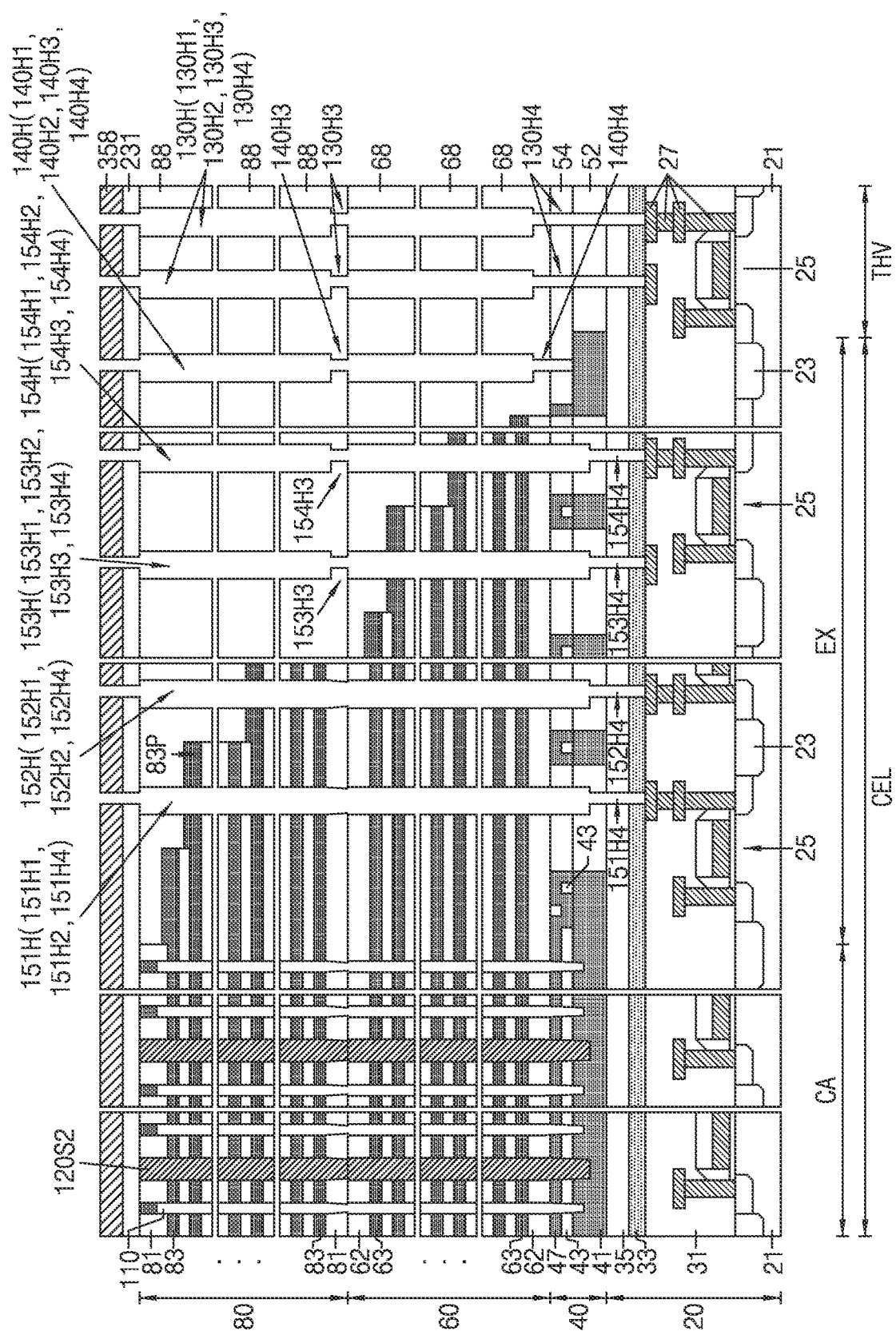

Referring to FIG. 23, the first interlayer insulating layer 68, the second horizontal insulating layer 54, the first horizontal insulating layer 52, the third lower insulating layer 35, and the second lower insulating layer 33 may be etched using the fourth mask pattern 358 as an etch mask, thereby forming a plurality of lower-lower through holes 130H4, a lower-lower source contact hole 140H4, and a plurality of lower-lower cell contact holes 151H4, 152H4, 153H4, and 154H4. Each of the plurality of lower-lower through holes 130H4, the lower-lower source contact hole 140H4, and the plurality of lower-lower cell contact holes 151H4, 152H4, 153H4, and 154H4 may include an alignment error caused by an alignment limitation of a lithography process. The plurality of lower wirings 27 may be exposed to bottoms of the plurality of lower-lower through holes 130H4 and the plurality of lower-lower cell contact holes 151H4, 152H4, 153H4, and 154H4. The horizontal conductive layer 41 may be exposed to a bottom of the lower-lower source contact hole 140H4.

Each of the plurality of lower-lower through holes 130H4 may communicate with a corresponding one of the plurality of lower through holes 130H1 while extending through the first interlayer insulating layer 68, the second horizontal insulating layer 54, the first horizontal insulating layer 52, the third lower insulating layer 35, and the second lower insulating layer 33. The lower-lower source contact hole 140H4 may communicate with the lower source contact hole 140H1 while extending through the first interlayer insulating layer 68 and the second horizontal insulating layer 54.

The plurality of lower-lower cell contact holes 151H4, 152H4, 153H4, and 154H4 may include a first lower-lower cell contact hole 151H4, a second lower-lower cell contact hole 152H4, a third lower-lower cell contact hole 153H4, and a fourth lower-lower cell contact hole 154H4. Each of the plurality of lower-lower cell contact holes 151H4, 152H4, 153H4, and 154H4 may communicate with a corresponding one of the plurality of lower cell contact holes 151H1, 152H1, 153H1, and 154H1 while extending through the first horizontal insulating layer 52, the third lower insulating layer 35, and the second lower insulating layer 33.

A plurality of through holes 130H, a source contact hole 140H, and a plurality of cell contact holes 151H, 152H, 153H, and 154H may be configured. Each of the plurality of through holes 130H, the source contact hole 140H and the plurality of cell contact holes 151H, 152H, 153H, and 154H may include a configuration substantially the same as the configuration described with reference to FIGS. 1 to 10. For example, the plurality of through holes 130H may include the plurality of lower through holes 130H1, the plurality of upper through holes 130H2, the plurality of upper-lower through holes 130H3, and the plurality of lower-lower through holes 130H4.

The source contact hole 140H may include the lower source contact hole 140H1, the upper source contact hole 140H2, the upper-lower source contact hole 140H3, and the lower-lower source contact hole 140H4. The plurality of cell contact holes 151H, 152H, 153H, and 154H may include a first cell contact hole 151H, a second cell contact hole 152H, a third cell contact hole 153H, and a fourth cell contact hole 154H.

The first cell contact hole 151H may include the first lower cell contact hole 151H1, the first upper cell contact hole 151H2, and the first lower-lower cell contact hole 151H4. The second cell contact hole 152H may include the second lower cell contact hole 152H1, the second upper cell contact hole 152H2, and the second lower-lower cell contact hole 152H4.

The third cell contact hole 153H may include the third lower cell contact hole 153H1, the third upper cell contact hole 153H2, the third upper-lower cell contact hole 153H3, and the third lower-lower cell contact hole 153H4. The fourth cell contact hole 154H may include the fourth lower cell contact hole 154H1, the fourth upper cell contact hole 154H2, the fourth upper-lower cell contact hole 154H3, and the fourth lower-lower cell contact hole 154H4.

Figure 24:
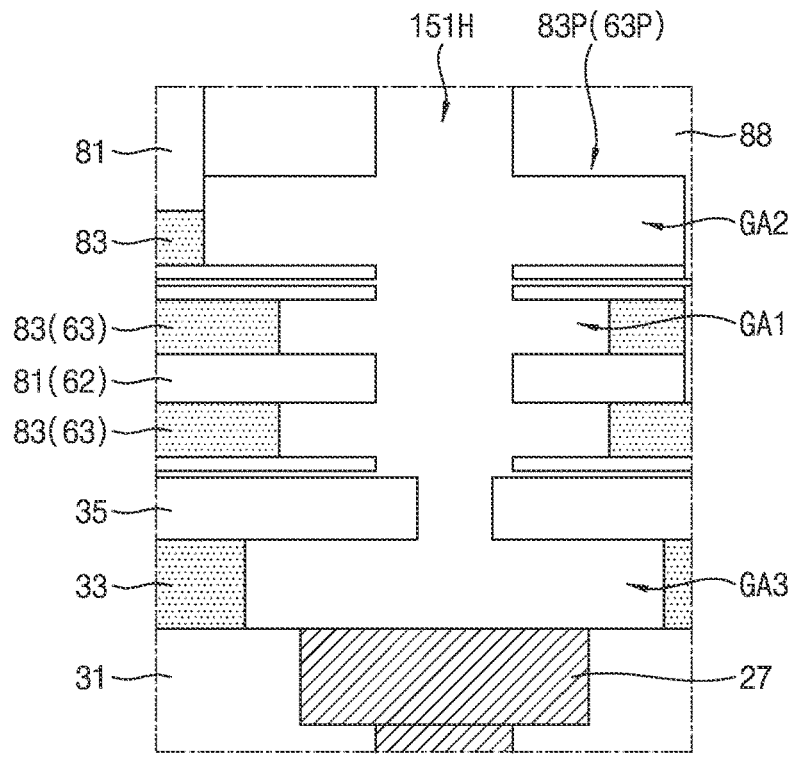

Referring to FIGS. 23 and 24, the plurality of first mold layers 63, the plurality of second mold layers 83 and the second lower insulating layer 33, which are exposed in the plurality of through holes 130H, and the plurality of cell contact holes 151H, 152H, 153H, and 154H, may be removed, thereby forming a plurality of gap regions GA1, GA2, and GA3. Each of the plurality of gap regions GA1, GA2, and GA3 may communicate with a corresponding one of the plurality of through holes 130H and the plurality of cell contact holes 151H, 152H, 153H, and 154H.

In an embodiment, a plurality of first gap regions GA1, a second gap region GA2 and a third gap region GA3, which communicate with the first cell contact hole 151H, may be formed. Each of the plurality of first gap regions GA1 may be formed by removing a corresponding one of the plurality of first mold layers 63 and the plurality of second mold layers 83. The second gap region GA2 may be formed by removing the first preliminary pad 63P or the second preliminary pad 83P. The third gap region GA3 may be formed by removing the second lower insulating layer 33.

Figure 25:
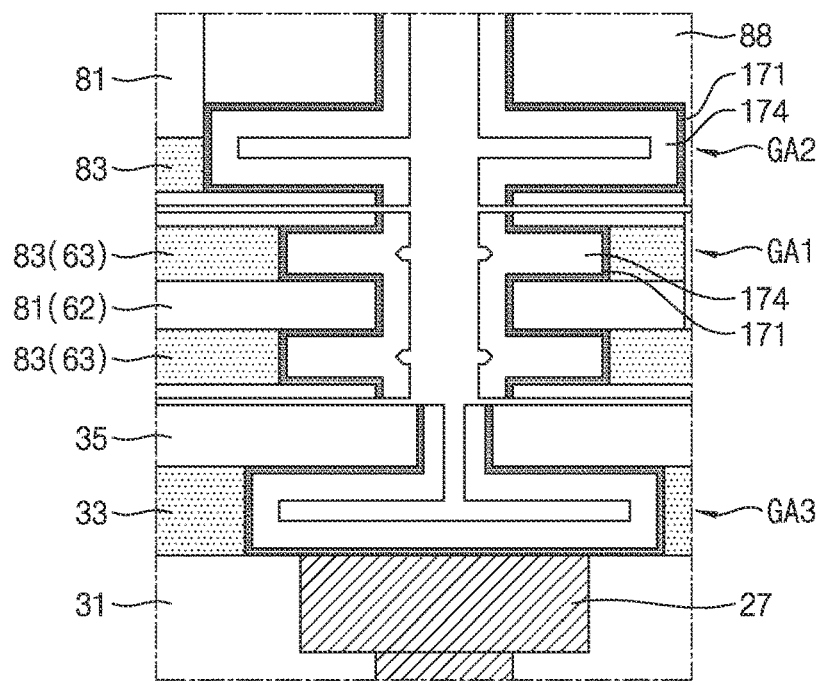

Referring to FIG. 25, a first liner 171 may be formed in the plurality of gap regions GA1, GA2, and GA3. A second capping layer 174 may be formed on the first liner 171 in the plurality of gap regions GA1, GA2, and GA3. In an embodiment, the first liner 171 may include a nitride such as silicon nitride. The second capping layer 174 may include an oxide such as silicon oxide. The second capping layer 174 may completely fill the plurality of first gap regions GA1.

Figure 26:
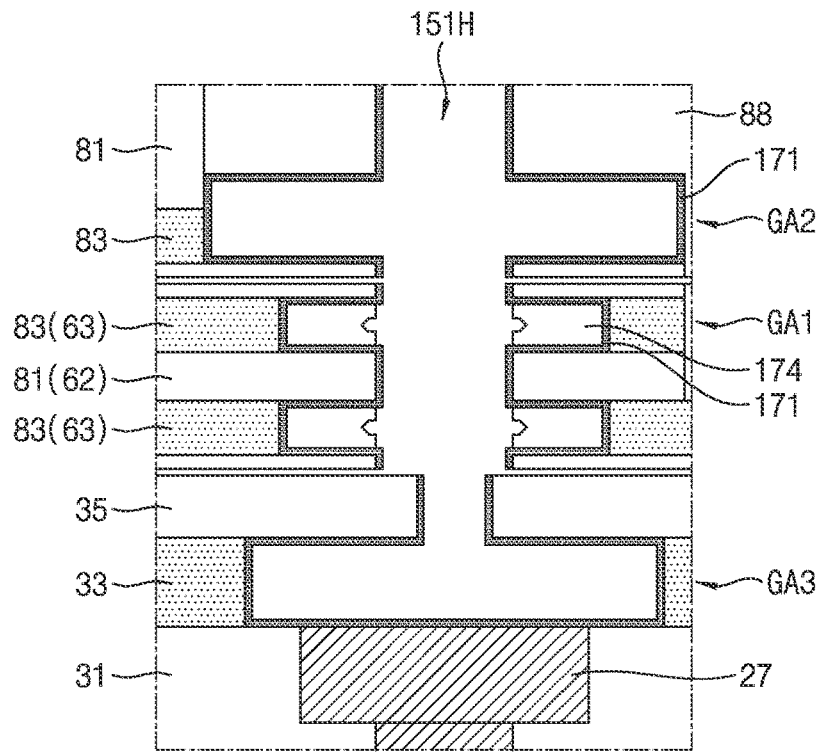

Referring to FIG. 26, the second capping layer 174 may be partially removed, thereby exposing the first liner 171. Partial removal of the second capping layer 174 may include an etch-back process. The second capping layer 174 may be preserved in the plurality of first gap regions GA1.

Figure 27:
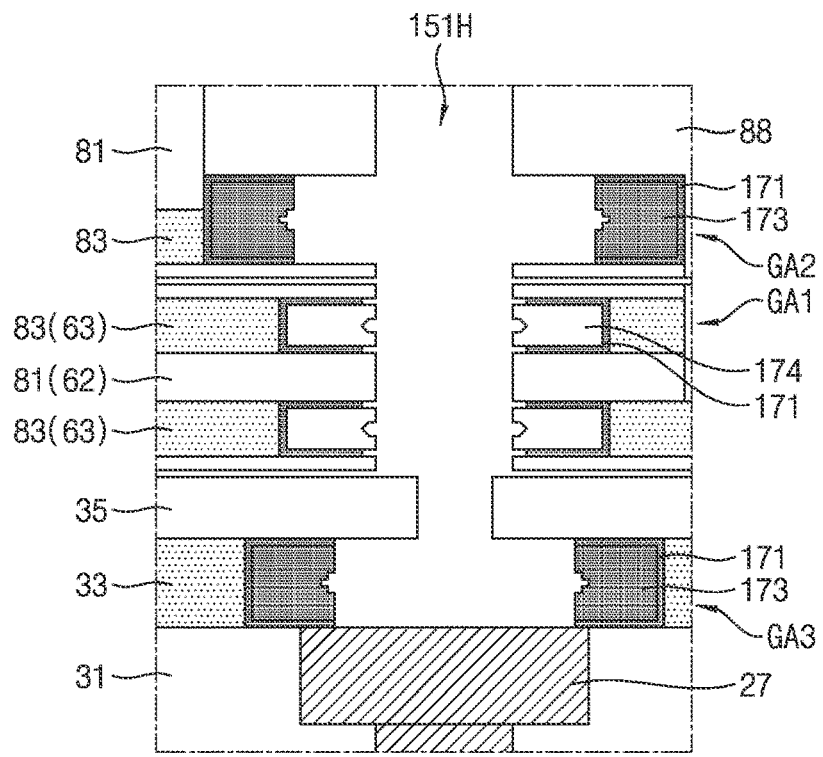

Referring to FIG. 27, a first capping layer 173 may be formed in the second gap region GA2 and the third gap region GA3. Formation of the first capping layer 173 may include a thin film formation process and an etch-back process. In an embodiment, the first capping layer 173 may include a nitride such as silicon nitride.

Figure 28:
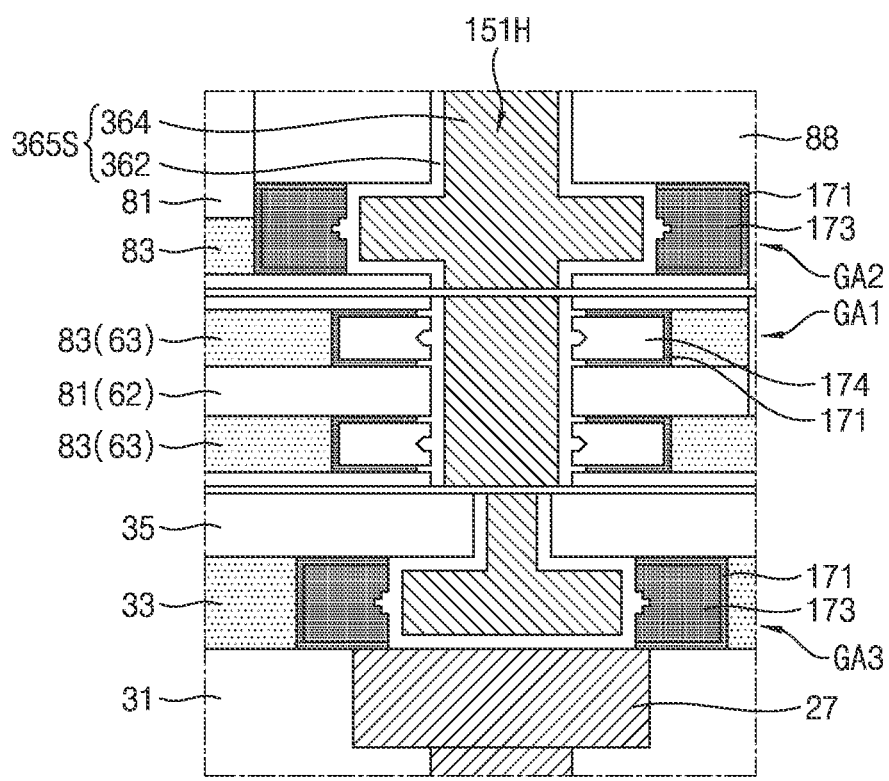

Referring to FIG. 28, a contact sacrificial layer 365S may be formed in the first cell contact hole 151H. In an embodiment, the contact sacrificial layer 365S may include a second liner 362, and a sacrificial layer 364 on the second liner 362. The second liner 362 may include an oxide such as silicon oxide. The sacrificial layer 364 may include polysilicon, tungsten, or a combination thereof.

Figure 29:
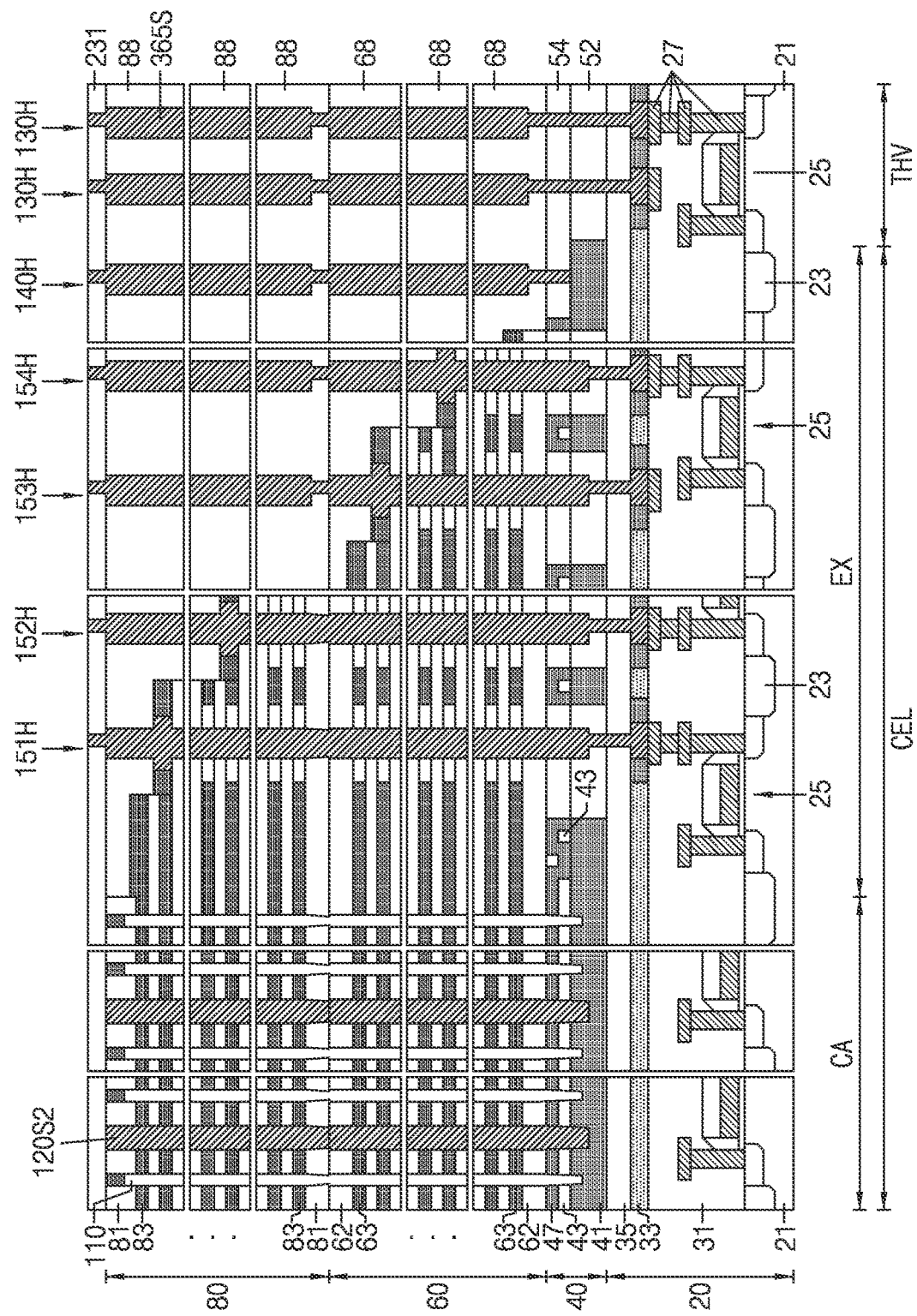

Referring to FIG. 29, the contact sacrificial layer 365S may be formed in the plurality of through holes 130H, the source contact hole 140H, and the plurality of cell contact holes 151H, 152H, 153H, and 154H. The contact sacrificial layer 365S may include a configuration substantially the same as the configuration described with reference to FIG. 28. The fourth mask pattern 358 may be removed.

Figure 30:
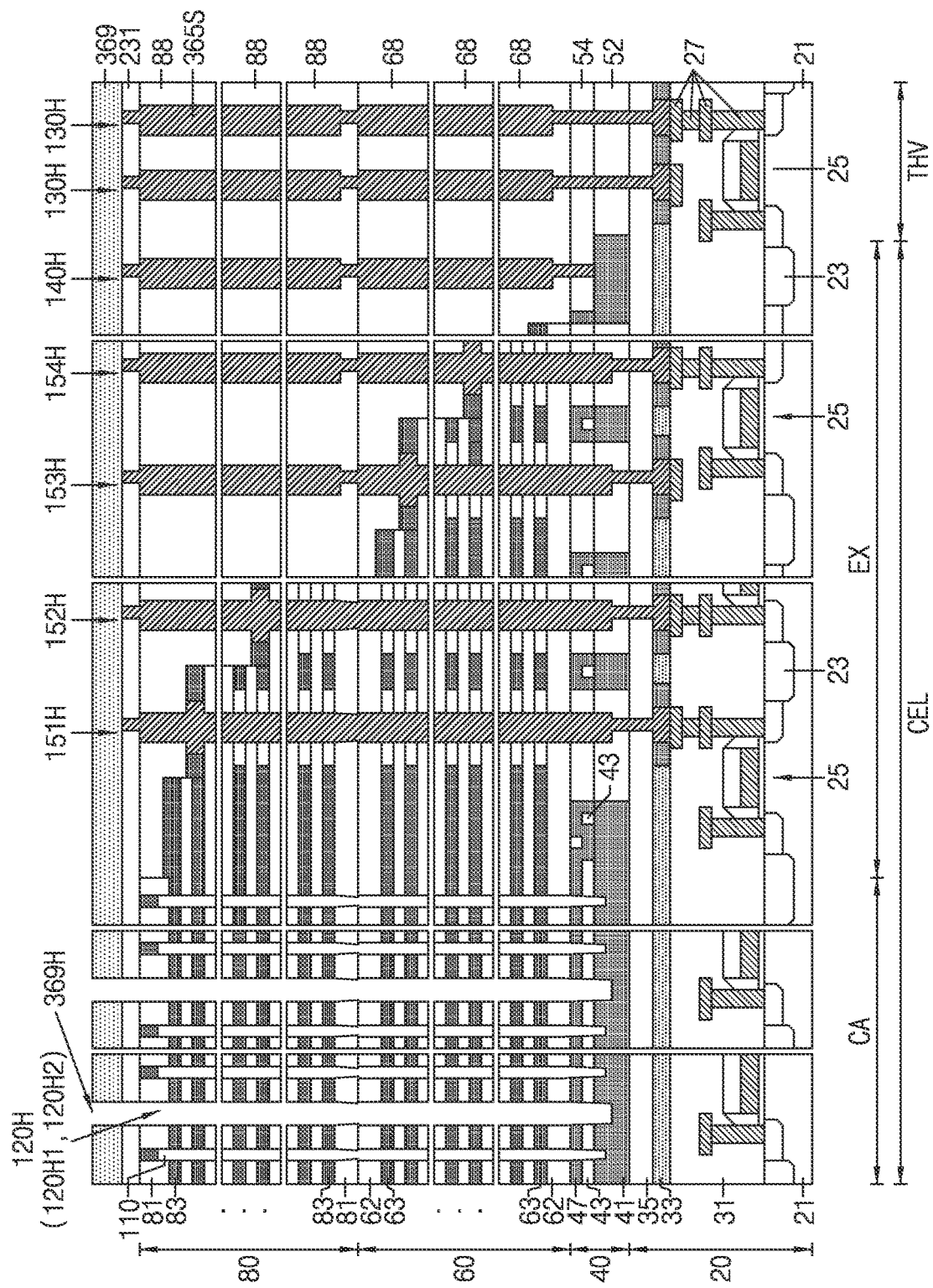

Referring to FIG. 30, a fifth mask pattern 369 may be formed on the first upper insulating layer 231. Using the fifth mask pattern 369 as an etch mask, a plurality of second openings 369H may be formed to extend through the first upper insulating layer 231, thereby exposing the plurality of upper separation sacrificial layers 120S2. The plurality of upper separation sacrificial layers 120S2 and the plurality of lower separation sacrificial layers 120S1 may be removed, thereby exposing the plurality of upper separation trenches 120H2 and the plurality of lower separation trenches 120H1. The plurality of upper separation trenches 120H2 and the plurality of lower separation trenches 120H1 may constitute a plurality of separation trenches 120H.

Figure 31:
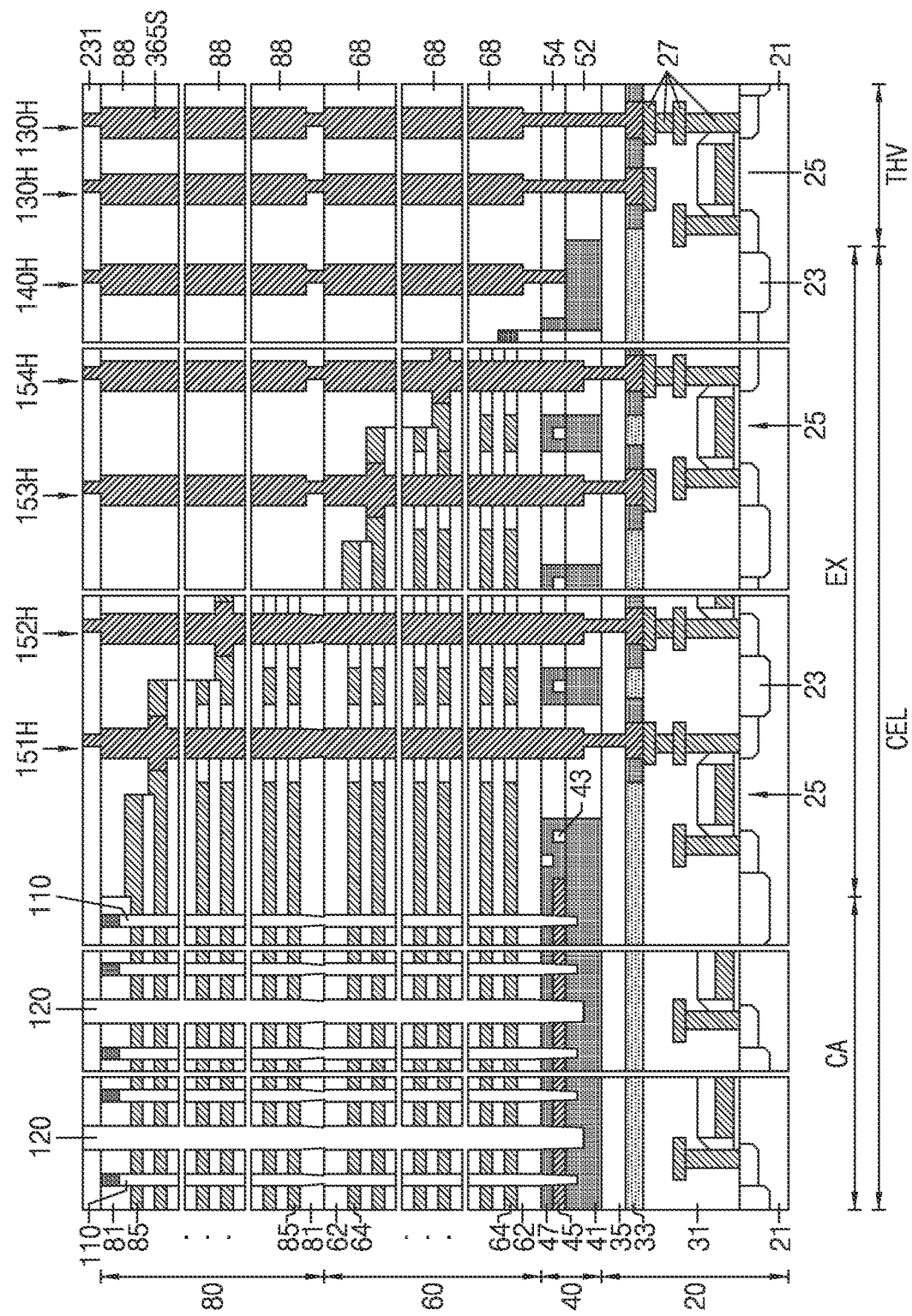

Referring to FIG. 31, the horizontal mold layer 43 may be partially removed, and a sealing conductive layer 45 may be formed between the horizontal conductive layer 41 and the support 47. The sealing conductive layer 45 may include a configuration substantially the same as the configuration described with reference to FIG. 3. The plurality of first mold layers 63 and the plurality of second mold layers 83 may be removed, thereby forming the plurality of first electrode layers 64 and the plurality of second electrode layers 85. Each of the plurality of first electrode layers 64 and the plurality of second electrode layers 85 may include a configuration substantially the same as the configuration described with reference to FIGS. 3 and 4. The plurality of separation insulating patterns 120 may be formed in the plurality of separation trenches 120H. The plurality of separation insulating patterns 120 may include silicon oxide, silicon nitride, silicon oxynitride, silicon boron nitride (SiBN), silicon carbon nitride (SiCN), low-k dielectrics, high-k dielectrics, or a combination thereof. In an embodiment, the plurality of separation insulating patterns 120 may include silicon oxide. The fifth mask pattern 369 may be removed.

Figure 32:
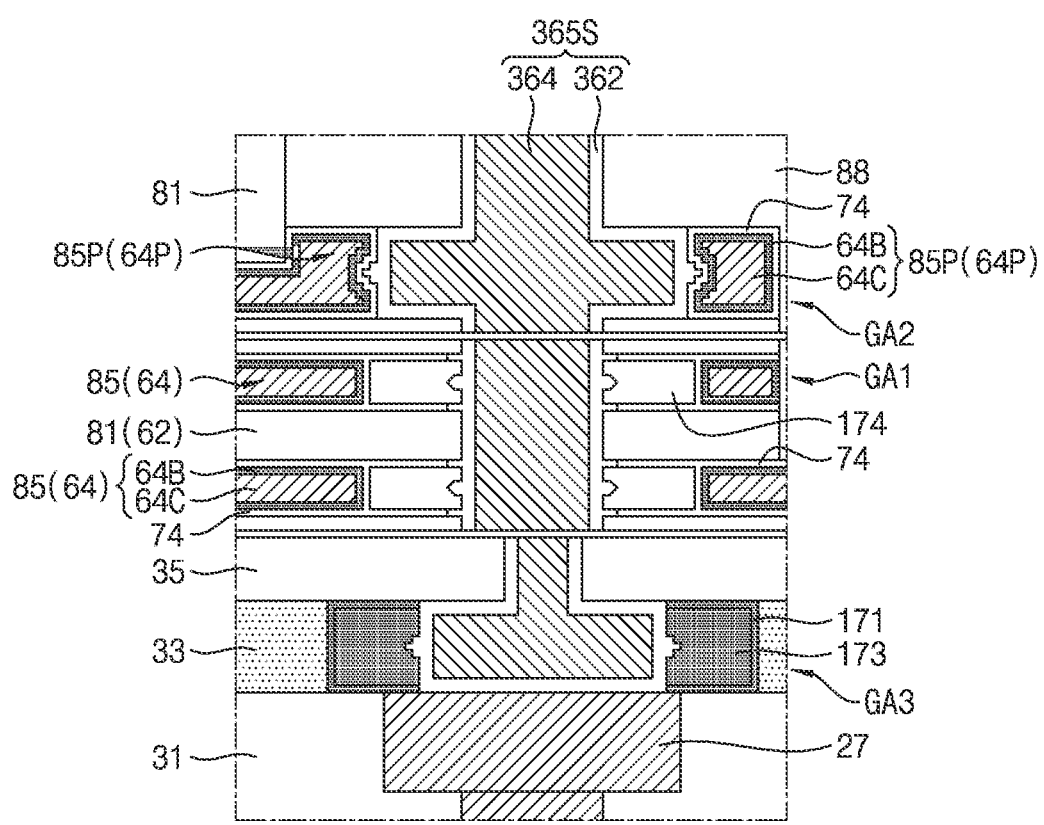

Referring to FIG. 32, during removal of the plurality of first mold layers 63 and the plurality of second mold layers 83, the first liner 171 may also be partially removed. The second blocking layer 74, the plurality of first electrode layers 64, and the plurality of second electrode layers 85 may be formed. Each of the second blocking layer 74, the plurality of first electrode layers 64, and the plurality of second electrode layers 85 may include a configuration substantially the same as the configuration described with reference to FIGS. 1, 3 and 4.

Figure 33:
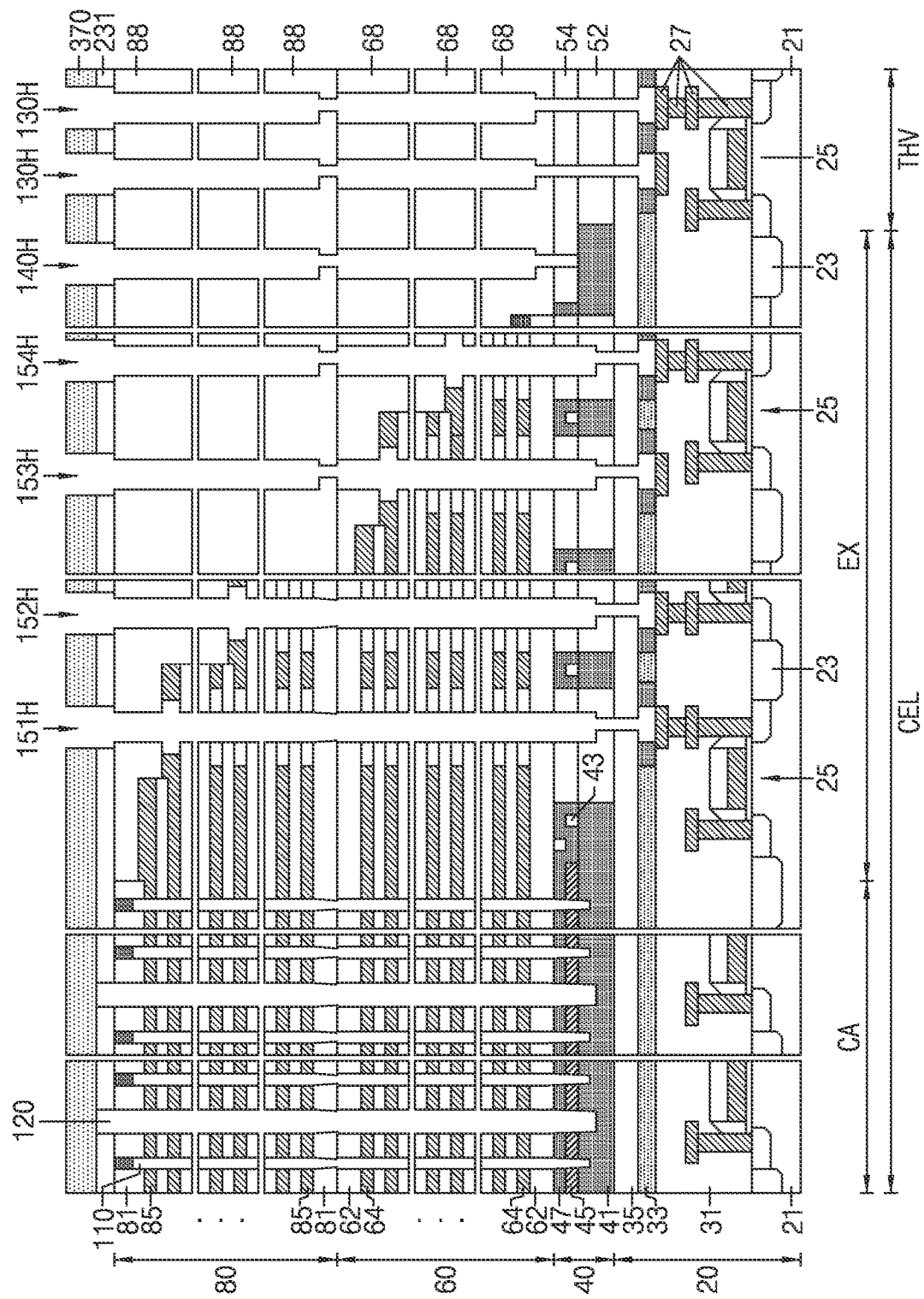

Referring to FIG. 33, a sixth mask pattern 370 may be formed on the first upper insulating layer 231. The contact sacrificial layer 365S may be removed, thereby exposing the plurality of through holes 130H, the source contact hole 140H, and the plurality of cell contact holes 151H, 152H, 153H, and 154H.

Figure 34:
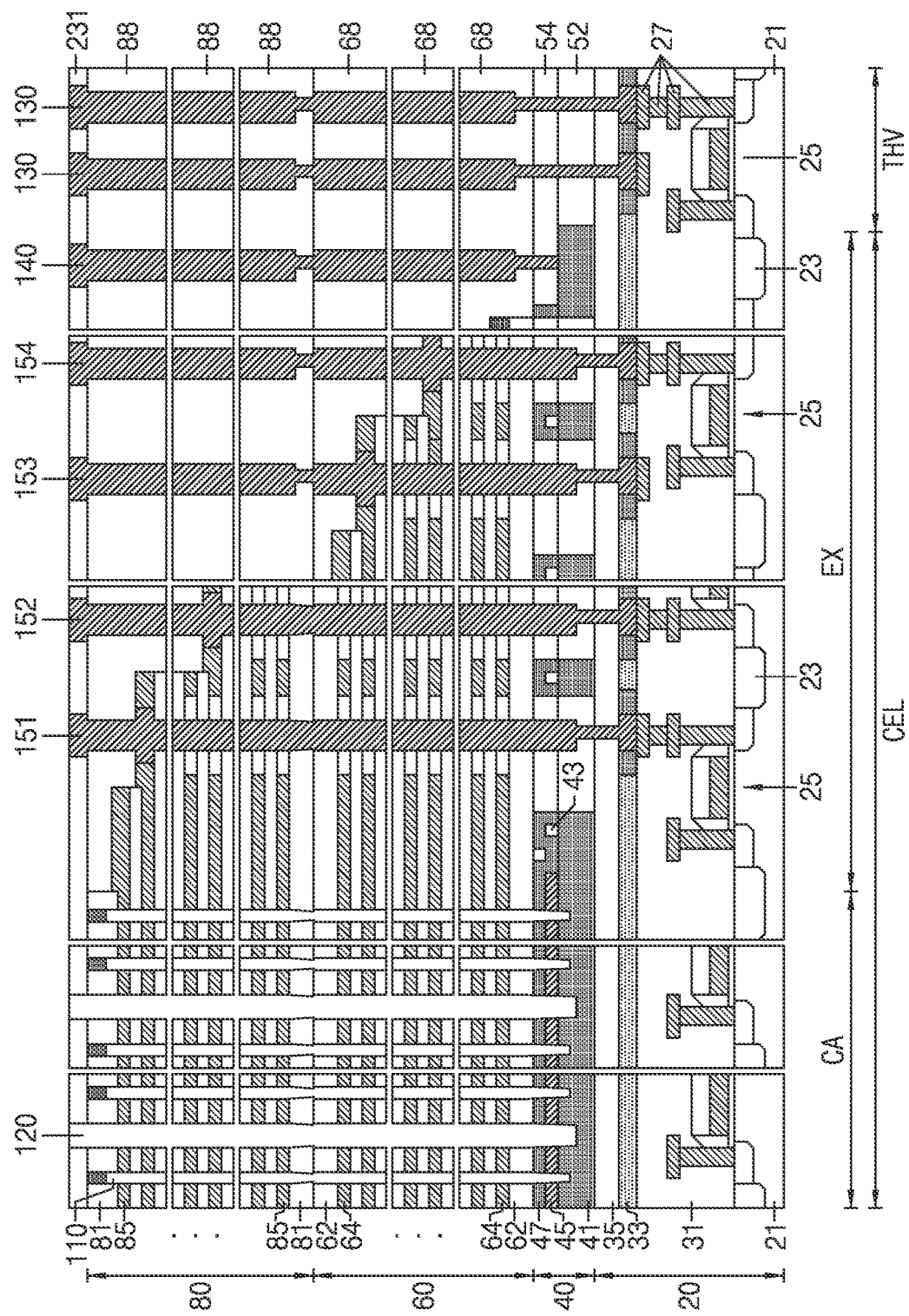

Referring to FIG. 34, a plurality of through electrodes 130, a source contact plug 140, and a plurality of cell contact plugs 151, 152, 153, and 154 may be formed in the plurality of through holes 130H, the source contact hole 140H, and the plurality of cell contact holes 151H, 152H, 153H, and 154H. Each of the plurality of through electrodes 130, the source contact plug 140 and the plurality of cell contact plugs 151, 152, 153, and 154 may include a conductive material such as metal, metal nitride, metal oxide, metal silicide, conductive carbon, polysilicon, amorphous silicon, monocrystalline silicon, or a combination thereof. Each of the plurality of through electrodes 130, the source contact plug 140 and the plurality of cell contact plugs 151, 152, 153, and 154 may include W, WN, Ti, TiN, Ta, TaN, Co, Ni, Ru, Pt, polysilicon, conductive carbon, or a combination thereof. Each of the plurality of through electrodes 130, the source contact plug 140 and the plurality of cell contact plugs 151, 152, 153, and 154 may include a configuration substantially the same as the configuration described with reference to FIGS. 1 to 10. For example, each of the plurality of cell contact plugs 151, 152, 153, and 154 may be electrically connected to a corresponding one of the plurality of second electrode layers 85. The sixth mask pattern 370 may be removed.

Figure 35:
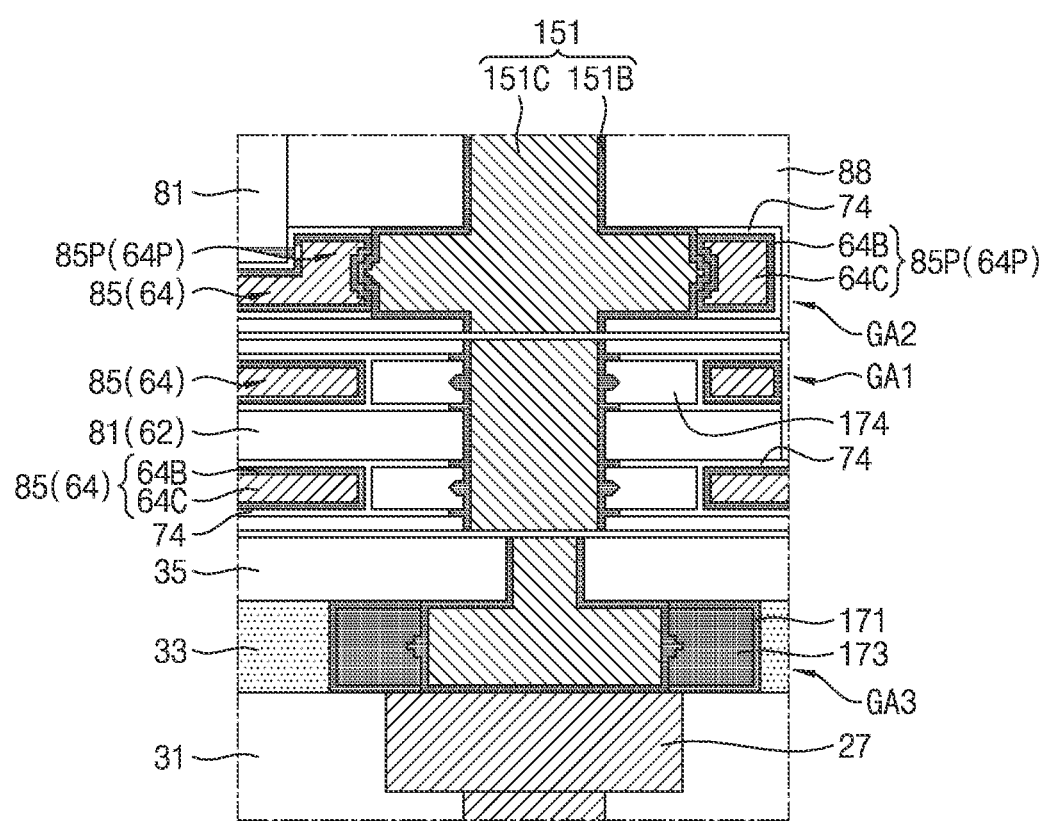

Referring to FIG. 35, the first cell contact plug 151 may include a configuration substantially the same as the configuration described with reference to FIG. 4. The first cell contact plug 151 may contact the connection pad 85P.

Again referring to FIG. 1, a second upper insulating layer 233 may be formed on the first upper insulating layer 231. The plurality of bit plugs 241, which contacts the bit pad 118 while extending through the second upper insulating layer 233 and the first upper insulating layer 231, may be formed. The plurality of bit lines 243, which is connected to the plurality of bit plugs 241, may be formed on the second upper insulating layer 233.

The plurality of first upper plugs 251 may be formed to be connected to the plurality of through electrodes 130 while extending through the second upper insulating layer 233. The plurality of first upper wirings 253 may be formed on the second upper insulating layer 233 to be connected to the plurality of first upper plugs 251. The second upper plug 262 may be formed to be connected to the source contact plug 140 while extending through the second upper insulating layer 233. The second upper wiring 264 may be formed on the second upper insulating layer 233 to be connected to the second upper plug 262. The third upper plug 275 may be formed to contact an uppermost one of the plurality of second electrode layers 85 while extending through the second upper insulating layer 233, the first upper insulating layer 231 and the second interlayer insulating layer 88. The third upper wiring 277 may be formed on the second upper insulating layer 233 to be connected to the third upper plug 275.

Each of the plurality of bit plugs 241, the plurality of bit lines 243, the plurality of first upper plugs 251, the plurality of first upper wirings 253, the second upper plug 262, the second upper wiring 264, the third upper plug 275, and the third upper wiring 277 may include a conductive material such as metal, metal nitride, metal oxide, metal silicide, conductive carbon, polysilicon, amorphous silicon, monocrystalline silicon, or a combination thereof.

Figure 36:
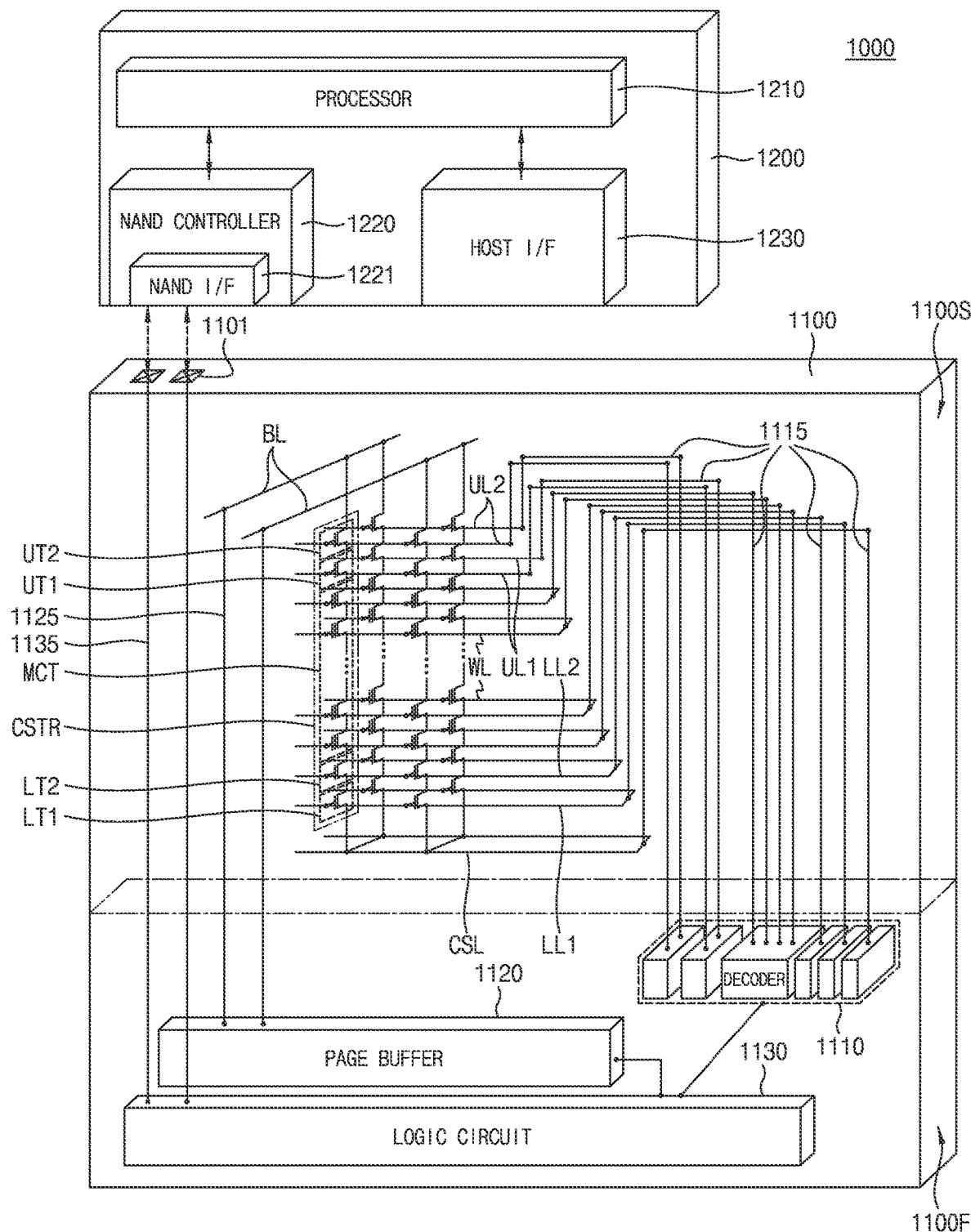
FIG. 36 is a view schematically showing an electronic system including semiconductor devices, according to exemplary embodiments of the disclosure.

FIG. 36 is a view schematically showing an electronic system including semiconductor devices according to exemplary embodiments of the disclosure.

Referring to FIG. 36, an electronic system 1000 according to exemplary embodiments of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB), a computing system, a medical device or a communication device which includes one semiconductor device 1100 or a plurality of semiconductor devices 1100.

The semiconductor device 1100 may be a non-volatile memory device. For example, the semiconductor device 1100 may include a semiconductor device described with reference to FIGS. 1 to 35. The semiconductor device 1100 may include a first structure 1100F, and a second structure 1100S on the first structure 1100F. In exemplary embodiments, the first structure 1100F may be disposed at one side of the second structure 1100S. The first structure 1100F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In exemplary embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

In exemplary embodiments, the lower transistors LT1 and LT2 may include a lower erase control transistor LT1 and a ground selection transistor LT2 which are connected in series. The upper transistors UT1 and UT2 may include a string selection transistor UT1 and an upper erase control transistor UT2 which are connected in series. At least one of the lower erase control transistor LT1 and the upper erase control transistor UT1 may be used in an erase operation for deleting data stored in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 via first connecting lines 1115 extending from an interior of the first structure 1100F to the second structure 1100S. The bit lines BL may be electrically connected to the page buffer 1120 via second connecting lines 1125 extending from the interior of the first structure 1100F to the second structure 1100S.

In the first structure 1100F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 via an input/output connecting line 1135 extending from the interior of the first structure 1100F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 37:
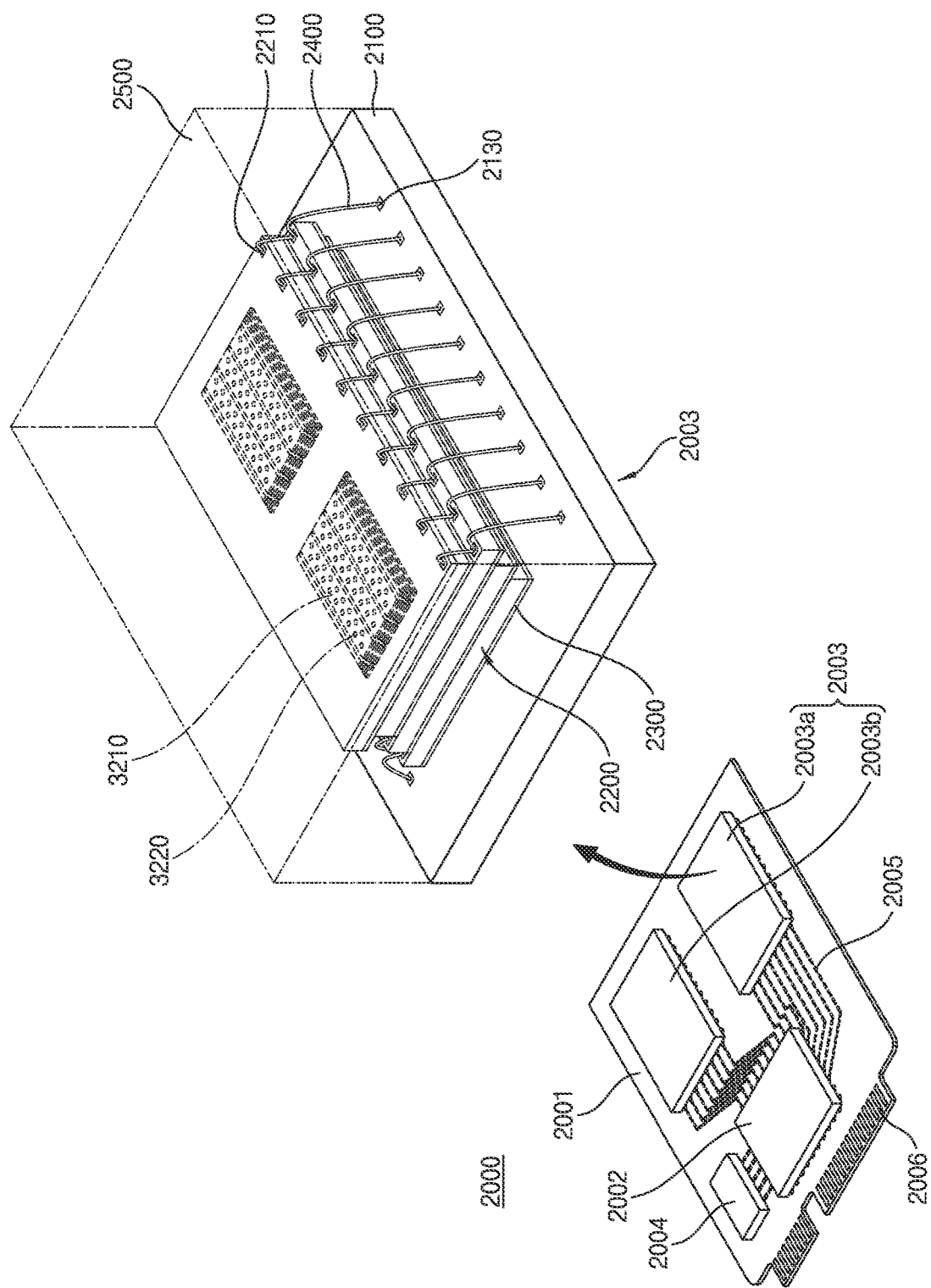
FIG. 37 is a perspective view schematically showing an electronic system including semiconductor devices, according to exemplary embodiments of the disclosure.

FIG. 37 is a perspective view schematically showing an electronic system including semiconductor devices according to exemplary embodiments of the disclosure.

Referring to FIG. 37, an electronic system 2000 according to exemplary embodiments of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In exemplary embodiments, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In exemplary embodiments, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 respectively disposed at lower surfaces of the semiconductor chips 2200, a connecting structure 2400 electrically interconnecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 36. Each of the semiconductor chips 2200 may include gate stack structures 3210 and memory channel structures 3220. Each of the semiconductor chips 2200 may include a semiconductor device described with reference to FIGS. 1 to 35. For example, the gate stack structures 3210 may include the first and second stack structures (e.g., the first stack structure 60 and the second stack structure 80 in FIG. 1). The memory channel structures 3220 may include the plurality of channel structures (e.g., the plurality of channel structures 110 in FIG. 1).

In exemplary embodiments, the connecting structure 2400 may be bonding wires electrically interconnecting the input/output pad 2210 and the package upper pads 2130, respectively. Accordingly, in each of the first and second semiconductor packages 2003*a* and 2003*b*, the semiconductor chips 2200 may be electrically interconnected through wire bonding, and may be electrically connected to the package upper pads 2130 of the package substrate 2100. In accordance with embodiments, in each of the first and second semiconductor packages 2003*a* and 2003*b*, the semiconductor chips 2200 may be electrically interconnected by a connecting structure including a through-silicon via (TSV) in place of the bonding wire type connecting structure 2400.

In exemplary embodiments, the controller 2002 and the semiconductor chips 2200 may be included in one package. In an exemplary embodiment, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

In accordance with the exemplary embodiments of the disclosure, a channel structure disposed in a channel hole extending through a stack structure is provided. A through electrode connected to a plurality of lower wirings while extending through the stack structure and a horizontal insulating layer is disposed. The through electrode includes a first portion and a second portion. The first portion extends into the stack structure. The second portion is disposed between the first portion and the plurality of lower wirings. The first portion is disposed in the first through hole formed in the stack structure. The first through hole may be formed simultaneously with the channel hole, using the same process. Semiconductor devices advantageous in terms of an increase in mass production efficiency while achieving process simplification, an electronic system including the same, and a method of forming the same may be provided.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. A semiconductor device comprising:
a lower structure comprising a plurality of lower wirings;
a horizontal wiring layer disposed on the lower structure, the horizontal wiring layer comprising a horizontal conductive layer, and a horizontal insulating layer extending through the horizontal conductive layer;
a stack structure on the horizontal wiring layer;

a channel structure extending into the horizontal wiring layer while extending through the stack structure; and
a through electrode connected to the plurality of lower wirings while extending through the stack structure and the horizontal insulating layer,
wherein the stack structure comprises:
a plurality of insulating layers and a plurality of electrode layers repeatedly alternately stacked, and
an interlayer insulating layer disposed at side surfaces of the plurality of insulating layers and the plurality of electrode layers, and
wherein the through electrode comprises:
a first portion extending into the interlayer insulating layer, and
a second portion disposed between the first portion and the plurality of lower wirings, the second portion having a smaller horizontal width than the first portion.

2. The semiconductor device according to claim 1, wherein a center of the second portion is misaligned from a center of the first portion.

3. The semiconductor device according to claim 1, wherein the second portion extends through the interlayer insulating layer and the horizontal insulating layer.

4. The semiconductor device according to claim 1, wherein a distance between a first boundary between the first portion and the second portion and a bottom surface of the lower structure is greater than a distance between a lowermost end of the channel structure and the bottom surface of the lower structure.

5. The semiconductor device according to claim 1, wherein a distance between a first boundary between the first portion and the second portion and a bottom surface of the lower structure is smaller than a distance between a lowermost end of the plurality of electrode layers and the bottom surface of the lower structure.

6. The semiconductor device according to claim 1, wherein a distance between a first boundary between the first portion and the second portion and a bottom surface of the lower structure is greater than a distance between a lowermost end of the plurality of electrode layers and the bottom surface of the lower structure.

7. The semiconductor device according to claim 1, wherein:
the plurality of insulating layers comprises a plurality of first insulating layers and a plurality of second insulating layers;
the plurality of electrode layers comprises a plurality of first electrode layers and a plurality of second electrode layers;
the interlayer insulating layer comprises a first interlayer insulating layer and a second interlayer insulating layer;
the stack structure comprises:
a first stack structure comprising the plurality of first insulating layers, the plurality of first electrode layers, and the first interlayer insulating layer, and
a second stack structure disposed on the first stack structure, the second stack structure comprising the plurality of second insulating layers, the plurality of second electrode layers, and the second interlayer insulating layer;
the through electrode further comprises:
a third portion extending into the second interlayer insulating layer, and
a fourth portion disposed between the third portion and the first portion, the fourth portion having a smaller horizontal width than the third portion; and
the first portion extends into the first interlayer insulating layer.

8. The semiconductor device according to claim 7, wherein a center of the second portion is aligned with a center of the fourth portion.

9. The semiconductor device according to claim 7, wherein a center of the fourth portion is misaligned from a center of the third portion.

10. The semiconductor device according to claim 7, wherein the horizontal width of the second portion is substantially equal to the horizontal width of the fourth portion.

11. The semiconductor device according to claim 1, further comprising:
a cell contact plug connected to the plurality of lower wirings while extending through the plurality of insulating layers, the plurality of electrode layers, and the horizontal insulating layer,
wherein the cell contact plug comprises:
a fifth portion extending into the horizontal insulating layer while extending through the plurality of insulating layers and the plurality of electrode layers, and
a sixth portion disposed between the fifth portion and the plurality of lower wirings, the sixth portion having a smaller horizontal width than the fifth portion, and
wherein the cell contact plug is connected to a selected one of the plurality of electrode layers.

12. The semiconductor device according to claim 11, wherein a center of the sixth portion is misaligned from a center of the fifth portion.

13. The semiconductor device according to claim 11, wherein a distance between a second boundary between the fifth portion and the sixth portion and a bottom surface of the lower structure is smaller than a lowermost end of the channel structure and the bottom surface of the lower structure.

14. The semiconductor device according to claim 1, further comprising:
a source contact plug connected to the horizontal conductive layer while extending through the interlayer insulating layer,
wherein the source contact plug comprises:
a seventh portion extending into the interlayer insulating layer, and
an eighth portion disposed between the seventh portion and the horizontal conductive layer, the eighth portion having a smaller horizontal width than the seventh portion.

15. The semiconductor device according to claim 14, wherein a center of the eighth portion is misaligned from a center of the seventh portion.

16. A semiconductor device comprising:
a lower structure comprising a plurality of lower wirings;
a horizontal wiring layer disposed on the lower structure, the horizontal wiring layer comprising a horizontal conductive layer and a horizontal insulating layer extending through the horizontal conductive layer;
a stack structure on the horizontal wiring layer;
a channel structure extending into the horizontal wiring layer while extending through the stack structure; and
a plurality of cell contact plugs connected to the plurality of lower wirings while extending through the stack structure and the horizontal insulating layer, wherein the stack structure comprises:
a plurality of insulating layers and a plurality of electrode layers repeatedly alternately stacked, and
an interlayer insulating layer disposed at side surfaces of the plurality of insulating layers and the plurality of electrode layers,
wherein each of the plurality of cell contact plugs comprises:
a first portion extending into the horizontal insulating layer while extending through the plurality of insulating layers and the plurality of electrode layers, and
a second portion disposed between the first portion and the plurality of lower wirings, the second portion having a smaller horizontal width than the first portion, and
wherein each of the plurality of cell contact plugs is connected to a corresponding one of the plurality of electrode layers.

17. The semiconductor device according to claim 16, wherein a center of the second portion is misaligned from a center of the first portion.

18. The semiconductor device according to claim 16, wherein a distance between a boundary between the first portion and the second portion and a bottom surface of the lower structure is smaller than a distance between a lowermost end of the channel structure and the bottom surface of the lower structure.

19. The semiconductor device according to claim 16, wherein:
the plurality of insulating layers comprises a plurality of first insulating layers and a plurality of second insulating layers;
the plurality of electrode layers comprises a plurality of first electrode layers and a plurality of second electrode layers;
the interlayer insulating layer comprises a first interlayer insulating layer and a second interlayer insulating layer;
the stack structure comprises:
a first stack structure comprising the plurality of first insulating layers, the plurality of first electrode layers, and the first interlayer insulating layer, and
a second stack structure disposed on the first stack structure, the second stack structure comprising the plurality of second insulating layers, the plurality of second electrode layers, and the second interlayer insulating layer;

at least one of the plurality of cell contact plugs further comprises:
a third portion extending into the second interlayer insulating layer, and
a fourth portion disposed between the third portion and the first portion, the fourth portion having a smaller horizontal width than the third portion; and
the first portion extends through the first interlayer insulating layer, the plurality of first insulating layers, and the plurality of first electrode layers.

20. An electronic system comprising:
a main substrate;
a semiconductor device on the main substrate; and
a controller electrically connected to the semiconductor device on the main substrate,
wherein the semiconductor device comprises:
a lower structure comprising a plurality of lower wirings,
a horizontal wiring layer disposed on the lower structure, the horizontal wiring layer comprising a horizontal conductive layer and a horizontal insulating layer extending through the horizontal conductive layer,
a stack structure on the horizontal wiring layer,
a channel structure extending into the horizontal wiring layer while extending through the stack structure, and
a through electrode connected to the plurality of lower wirings while extending through the stack structure and the horizontal insulating layer,
wherein the stack structure comprises:
a plurality of insulating layers and a plurality of electrode layers repeatedly alternately stacked, and
an interlayer insulating layer disposed at side surfaces of the plurality of insulating layers and the plurality of electrode layers, and
wherein the through electrode comprises:
a first portion extending into the interlayer insulating layer, and
a second portion disposed between the first portion and the plurality of lower wirings, the second portion having a smaller horizontal width than the first portion.

* * * * *